(12) United States Patent
Suwa et al.

(10) Patent No.: US 6,873,563 B2
(45) Date of Patent: Mar. 29, 2005

(54) SEMICONDUCTOR CIRCUIT DEVICE ADAPTABLE TO PLURALITY OF TYPES OF PACKAGES

(75) Inventors: Makoto Suwa, Hyogo (JP); Junko Matsumoto, Hyogo (JP); Tadaaki Yamauchi, Hyogo (JP); Takeo Okamoto, Hyogo (JP); Tetsuichiro Ichiguchi, Hyogo (JP); Hideki Yonetani, Hyogo (JP); Tsutomu Nagasawa, Hyogo (JP); Zengcheng Tian, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/390,886

(22) Filed: Mar. 19, 2003

(65) Prior Publication Data

US 2003/0214344 A1 Nov. 20, 2003

(30) Foreign Application Priority Data

May 20, 2002 (JP) ........................................ 2002-144972

(51) Int. Cl.$^7$ ................................................. G11C 8/00
(52) U.S. Cl. ..................................... 365/230.03; 365/63
(58) Field of Search ................................ 365/230.03, 63

(56) References Cited

U.S. PATENT DOCUMENTS 5,652,904 A * 7/1997 Trimberger .................. 712/38

* cited by examiner

Primary Examiner—M. Tran
(74) Attorney, Agent, or Firm—McDermott Will & Emery LLP

(57) ABSTRACT

Data pad regions are arranged in four divided regions of a semiconductor memory chip of a rectangular shape, respectively, and data pads are selectively utilized in each of the four divided regions in accordance with a word structure. Thus, it is possible to implement a semiconductor memory chip capable of being assembled in both a single chip package and a multi chip package.

7 Claims, 46 Drawing Sheets

| BANK C (1, 0) | BANK A (0, 0) |
|---|---|
| BANK D (1, 1) | BANK B (0, 1) |

REF8K : H
(8K REFRESH CYCLE)

REF8K : L
(8K REFRESH CYCLE)

FIG. 27

| x8 | x16 | x32 | | x32 | x16 | x8 |
|---|---|---|---|---|---|---|
| DQ<4> | DQ<8> | DQ<16> | | DQ<0> | DQ<0> | DQ<0> |
|  |  | DQ<17> | | DQ<1> |  |  |
|  | DQ<9> | DQ<18> | | DQ<2> | DQ<1> |  |
|  |  | DQ<19> | | DQ<3> |  |  |
| DQ<5> | DQ<10> | DQ<20> | 95a | DQ<4> | DQ<2> | DQ<1> |
|  |  | DQ<21> | | DQ<5> |  |  |
|  | DQ<11> | DQ<22> | | DQ<6> | DQ<3> |  |
|  |  | DQ<23> | | DQ<7> |  |  |
|  |  | 95c | 95b |  |  |  |
|  |  | 95d |  |  |  |  |
| DQ<6> | DQ<12> | DQ<24> | | DQ<8> | DQ<4> | DQ<2> |
|  |  | DQ<25> | | DQ<9> |  |  |
|  | DQ<13> | DQ<26> | | DQ<10> | DQ<5> |  |
|  |  | DQ<27> | | DQ<11> |  |  |
| DQ<7> | DQ<14> | DQ<28> | | DQ<12> | DQ<6> | DQ<3> |
|  |  | DQ<29> | | DQ<13> |  |  |
|  | DQ<15> | DQ<30> | | DQ<14> | DQ<7> |  |
|  |  | DQ<31> | | DQ<15> |  |  |
| x8 | x16 | x32 | | x32 | x16 | x8 |

F I G. 3 8
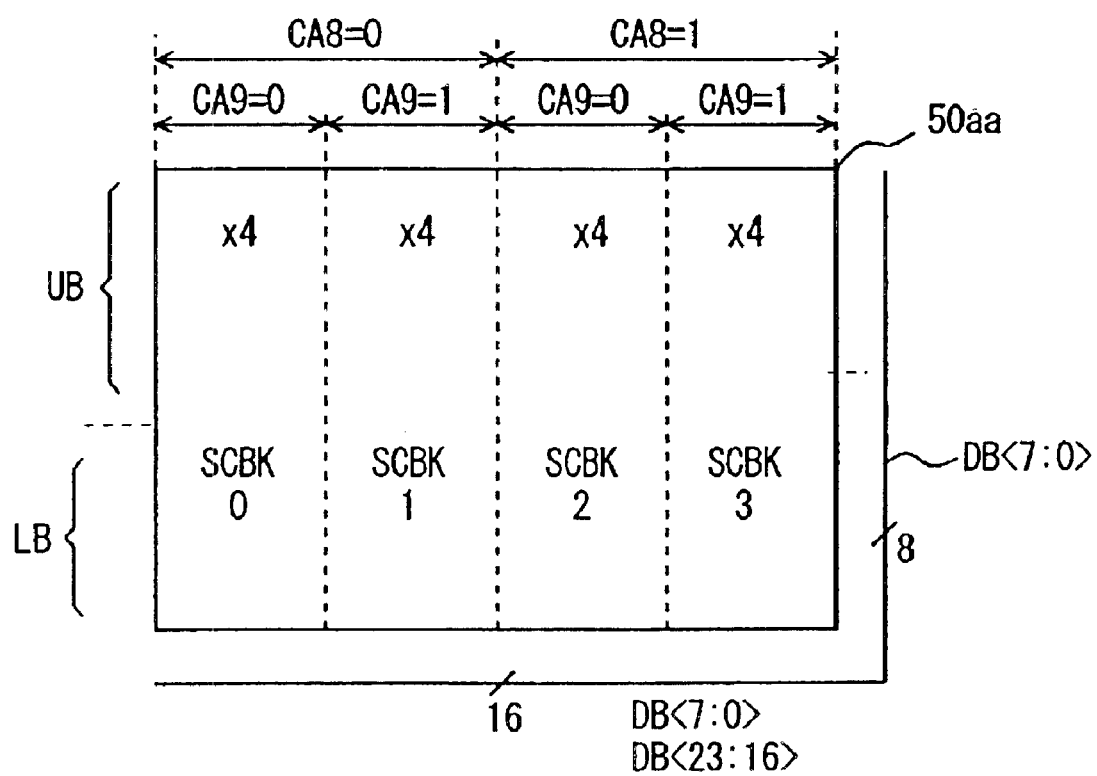

| x8 | x16 | x32 | DB | | x32 | x16 | x8 |
|---|---|---|---|---|---|---|---|
| DQ<0> | DQ<0> | DQ<16> | DB16 | DB0 | DQ<0> | | |
|  | DQ<1> | DQ<17> | DB17 | DB1 | DQ<1> | | |
| DQ<1> | DQ<2> | DQ<18> | DB18 | DB2 | DQ<2> | | |
|  | DQ<3> | DQ<19> | DB19 | DB3 | DQ<3> | | |
| DQ<2> | DQ<4> | DQ<20> | DB20 | DB4 | DQ<4> | | |
|  | DQ<5> | DQ<21> | DB21 | DB5 | DQ<5> | | |
| DQ<3> | DQ<6> | DQ<22> | DB22 | DB6 | DQ<6> | | |
|  | DQ<7> | DQ<23> | DB23 | DB7 | DQ<7> | | |
| DQ<4> | DQ<8> | DQ<24> | DB24 | DB8 | DQ<8> | | |
|  | DQ<9> | DQ<25> | DB25 | DB9 | DQ<9> | | |
| DQ<5> | DQ<10> | DQ<26> | DB26 | DB10 | DQ<10> | | |
|  | DQ<11> | DQ<27> | DB27 | DB11 | DQ<11> | | |
| DQ<6> | DQ<12> | DQ<28> | DB28 | DB12 | DQ<12> | | |
|  | DQ<13> | DQ<29> | DB29 | DB13 | DQ<13> | | |
| DQ<7> | DQ<14> | DQ<30> | DB30 | DB14 | DQ<14> | | |
|  | DQ<15> | DQ<31> | DB31 | DB15 | DQ<15> | | |

95c, 95d, 95a, 95b (SEE FIG. 32)

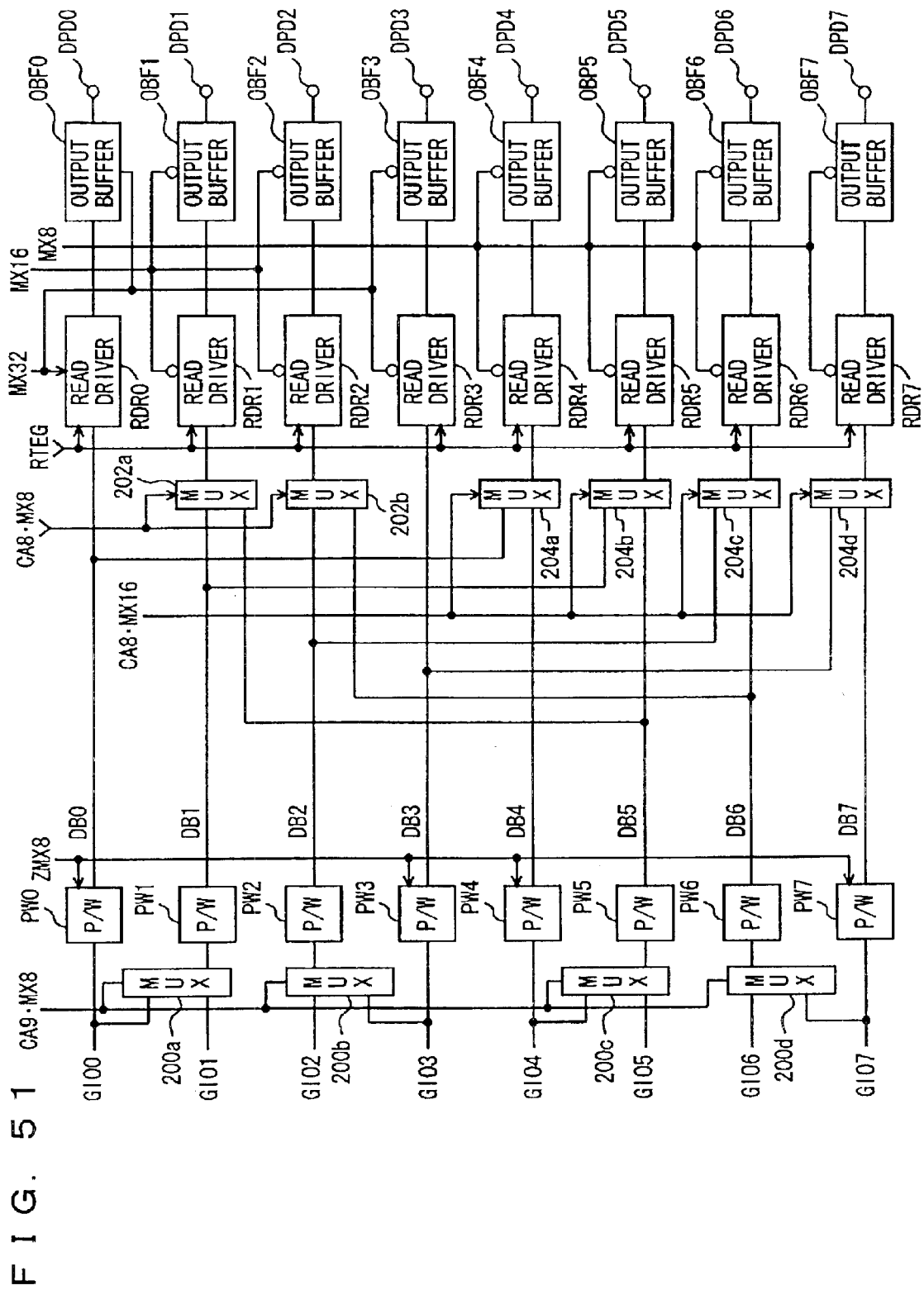
F I G. 5 1

| | DQ | NORMAL | TMBT-READ | TMBT-WRITE |
|---|---|---|---|---|
| | DQ<0> | DB<0> | | |
| | DQ<1> | DB<1> | | |
| TMBT | DQ<2> | DB<2> | DB<3>, DB<1> | DB<2>, DB<0> |
| | DQ<3> | DB<3> | | |
| | DQ<4> | DB<4> | | |
| | DQ<5> | DB<5> | | |
| TMBT | DQ<6> | DB<6> | DB<5>, DB<7> | DB<6>, DB<4> |
| | DQ<7> | DB<7> | | |
| | DQ<8> | DB<8> | | |
| TMBT | DQ<9> | DB<9> | DB<8>, DB<10> | DB<9>, DB<11> |
| | DQ<10> | DB<10> | | |
| | DQ<11> | DB<11> | | |
| | DQ<12> | DB<12> | | |
| TMBT | DQ<13> | DB<13> | DB<12>, DB<14> | DB<13>, DB<15> |
| | DQ<14> | DB<14> | | |
| | DQ<15> | DB<15> | | |

DPD

F I G. 6 7

| DB<0>  | TMBT-WRITE |
|--------|------------|
| DB<1>  | TMBT-READ  |
| DB<2>  | TMBT-WRITE |
| DB<3>  | TMBT-READ  |
| DB<4>  | TMBT-WRITE |
| DB<5>  | TMBT-READ  |
| DB<6>  | TMBT-WRITE |
| DB<7>  | TMBT-READ  |
| DB<8>  | TMBT-READ  |
| DB<9>  | TMBT-WRITE |
| DB<10> | TMBT-READ  |
| DB<11> | TMBT-WRITE |
| DB<12> | TMBT-READ  |
| DB<13> | TMBT-WRITE |
| DB<14> | TMBT-READ  |
| DB<15> | TMBT-WRITE |

DB<7:0> (rows 1–8)

DB<15:8> (rows 9–16)

SEMICONDUCTOR CIRCUIT DEVICE ADAPTABLE TO PLURALITY OF TYPES OF PACKAGES

BACKGROUND OF THE INVENTION

1. Field of the Invention

The present invention relates to a semiconductor circuit device, and particularly to a semiconductor circuit device assembled into a plurality of types of packages. More particularly, the present invention relates to the configuration of a semiconductor memory device with a common chip configuration allowing assembly into a plurality of types of packages.

2. Description of the Background Art

A semiconductor circuit formed on a semiconductor chip is assembled into a package before shipment as a final product. The semiconductor circuit is electrically connected to on-board wires through a pin terminal of the package, or the package protects the semiconductor chip against external contamination sources and external destructive factors such as external mechanical stress and external electromagnetism.

Various types of packages are prepared according to the configuration of applicable board systems. Recently, a package referred to as "surface mount device (SMD)" has been widely employed so as to mount semiconductor circuits on both sides of a board.

FIG. 72 is a schematic diagram showing the appearance of a TSOP (thin small outline package) which is one of conventional SMDs. In FIG. 72, TSOP has an internal semiconductor chip sealed with a mold resin MRJ. Mold resin MRJ is of a rectangular shape and has terminals PT arranged along both sides thereof. FIG. 72 representatively shows lead terminals arranged along one side of mold resin MRJ.

Each lead terminal PT is normally of a gull-wing lead (an L lead) shape and is soldered on a board. Since lead terminal PT is not inserted into a through hole formed in the board, TSOP can be arranged on each surface of the board.

TSOP is on the order of 1 mm in thickness and is extremely thin. In addition, lead terminal PT is of a gull-wing shape, and therefore, superior in workability as compared with an SOJ (small outline with J leads) package having pin terminals PT of J lead shape, and a lead pitch can be made smaller.

As such a thin rectangular package having lead terminals PT arranged only along the long side thereof, there are also known, beside TSOP, an SVP (surface vertical package) which is a vertical surface mount device and a USOP (ultra small outline package) which is as thin as 0.5 mm. These packages are widely employed for assembling semiconductor memory devices.

In applications such as portable equipment, high density mounting is required. In such applications, an MCP (multi chip package) having a plurality of chips arranged therein is employed, instead of an SCP (single chip package), such as TSOP, having one chip arranged therein. As MCP, there are known an MCM (multi chip module) type MCP having a plurality of chips assembled in an interposer (substrate) two-dimensionally and a stacked type MCP having a plurality of semiconductor chips stacked on an interposer.

FIG. 73 is a schematic diagram showing the configuration of conventional stacked type MCP. In FIG. 73, stacked type MCP, semiconductor chips CH3 to CH1 are stacked on an interposer IPS. A supporting insulator ISD1 is arranged between semiconductor chips CH1 and CH2. A supporting insulator ISD2 is arranged between semiconductor chips CH2 and CH3. A supporting insulator ISD3 is arranged between interposer IPS and semiconductor chip CH3.

Through holes are formed in supporting insulator ISD3 and pads formed on semiconductor chip CH3 are connected through solder balls SLS to pads PD formed on interposer IPS.

As for semiconductor chip CH1, solder balls (micro bumps) SLS formed on the pads are electrically connected to pads PD formed on interposer IPS through bonding wires BW1$a$ and BW1$b$.

Similarly, as to semiconductor chip CH2, solder balls SLS formed on the pads are electrically connected to pads, not shown, formed on interposer IPS through bonding wires BW2$a$ and BW2$b$. Wiring is made in interposer IPS and pads PD formed on interposer IPS are connected to bump balls BPS formed on the rear surface of IPS. Internal interconnecting wires may be formed in a supporting insulator ISD.

Semiconductor chips CH1 to CH3 and pads PD are sealed by mold resin MRJ.

As shown in FIG. 73, since stack type MCP has a plurality of semiconductor chips CH1 to CH3 stacked and assembled therein, it is possible to mount a plurality of chips with a small occupation area.

FIG. 74 is a schematic diagram showing the rear surface of MCP. On the rear surface of MCP, bump balls BPS are arranged in an array. These bump balls BPS are connected to solder balls formed on a mounting board. Therefore, MCP employs bump balls BPS, rather than lead terminals, so as to electrically connect semiconductor chips CH1 to CH3 to an external device. By arranging bump balls BPS in an array form on the rear surface of mold resin MRJ, a large number of bump balls can be arranged and the number of input and output signals/data can be increased. This package having bump balls arranged in an array form is referred to as "BGP (ball grid package)". MCP is, therefore, a family member of BGP.

A semiconductor memory device is now considered as one example of the semiconductor circuit device. In the semiconductor memory device, a word configuration is changed by setting a bonding pad potential by mask interconnection or bonding wire connection, so as to cover different word configurations with the same chip configuration. The internal configuration is the same, but only the number of data input/output circuits to be used is different. Thus, it is possible to cover a plurality of types of word configurations with chip configuration of a kind, improving manufacturing/design efficiency.

However, pad arrangement is different for different package. It is, therefore, necessary to optimize the layout of the internal circuitry of a semiconductor chip individually according to each package. Conventionally, the arrangement of pads is optimized differently for BGP (ball grid package) and TSOP of SCP, for example.

In the semiconductor memory device, in particular, unlike an embedded DRAM (dynamic random access memory) which is integrated on a semiconductor chip together with a logic circuit, the number of input/output data bits is small (32 bits) and TSOP is normally employed as an assembling package. In case of the semiconductor memory device, an LOC (lead on chip) structure is conventionally, normally used for such TSOP. In LOC structure, pads are arranged in the central portion of a chip to decrease a chip area.

In BGP, such an LOC structure is not employed, but wire bonding, TAB (tape automated bonding) and flip chip bonding and other (s) are employed for making electrical connections between chip pads and package terminals (bump balls).

Therefore, semiconductor memory chips having a pad arrangement optimized for such a TSOP package cannot be applied to BGP.

Furthermore, depending on a processing purpose, the storage capacity required for a memory differs. For example, one memory chip of 128 M bits is required for an application of a simple processing, while a memory of the storage capacity of 256 M bits is required for an application of processing image and audio data in portable equipment.

To implement a memory of 256 M bits using existing memory chips each having a storage capacity of 128 M bits, it is sufficient to employ two memories each of 128 M bits, simply. In this case, if the required storage capacity is to be satisfied using two TSOPs, the area of memory chips disadvantageously increases to obstruct down-sizing of the portable equipment.

Possible consideration to avoid such obstruction is such that memory chips with the same configuration as those for TSOP are applied to MCP to implement a memory of 256 M bits. However, since MCP is of BGP, the memory chips suited for TSOP cannot be applied to MCP.

Moreover, a specification required for a memory of 128 M bits differs from that required for a memory of 256 M bits in some cases. For instance, as to a memory of 256 M bits, if a word structure is of 16 bits, an 8K refresh cycle is set. In contrast, for a memory of 128 M bits with a word structure of 16 bits, the refresh cycle is set to a 4K refresh cycle. Therefore, it is impossible to implement a memory of 256 M bits by simply using two memory chips each having a storage capacity of 128 M bits.

SUMMARY OF THE INVENTION

It is an object of the present invention to provide a semiconductor circuit device applicable to both a single chip package and a multi chip package with the same chip configuration.

It is another object of the present invention to provide a semiconductor memory device having a chip layout capable of forming a multi chip package, using two memory chips each assembled in a single chip package.

It is still another object of the present invention to provide the internal data bus structure of a semiconductor memory device capable of being assembled in a plurality of types of packages.

It is yet another object of the present invention to provide a semiconductor memory device allowing accurate testing of memory cells even in different internal data bus structures, irrespectively of a word structure.

A semiconductor circuit device according to a first aspect of the present invention includes: an internal circuit including memory cells storing data and formed on a semiconductor chip; and a plurality of pads arranged on the periphery of the chip in a region external to the internal circuit. The plurality of pads include a plurality of data pads arranged being distributed over outer peripheral portions of at least four divided regions of the chip and selectively used in each of the divided regions in accordance with a word structure of data inputted and outputted by the internal circuit.

A semiconductor circuit device according to a second aspect of the present invention includes: a plurality of memory cells; test write data lines for transferring data written simultaneously into a predetermined number of memory cells among the plurality of memory cells in a test operation mode; a write circuit for simultaneously writing the data of the test write data lines to the predetermined number of memory cells in the test operation mode; and a compression circuit compressing read data from the predetermined number of memory cells and outputting a signal indicating a compression result to a test read data line different from the test write data lines. Each of the test write data lines and test read data line transfers both the write data and the read data in a normal operation mode.

A semiconductor circuit device according to a third aspect of the present invention includes: a plurality of memory cells each requiring refreshing of storage data; a refresh circuit for refreshing the storage data of the plurality of memory cells in a set refresh cycle; and a refresh cycle setting circuit fixedly setting the refresh cycle in accordance with a package housing the semiconductor circuit device therein.

A semiconductor circuit device according to a fourth aspect of the present invention includes: a plurality of input/output circuits, arranged in four divided regions of a chip, respectively, each inputting and outputting data; and mask pads arranged corresponding to the respective four divided regions, and inputting a plurality of mask signals for masking data write and read of the input/output circuits in corresponding regions when activated.

A semiconductor circuit device according to a fifth aspect of the present invention includes: a memory array including a plurality of memory cells; a plurality of global data lines each transmitting and receiving data to and from a selected memory cell of the memory array; a plurality of preamplifier circuits, arranged corresponding to the respective global data lines, each amplifying and outputting the data of a corresponding global data line when activated; an internal data bus having a predetermined bit width, for transferring output signals of the plurality of preamplifier circuits; a plurality of pads the same in number as and arranged corresponding to the bus lines of the internal data bus; and a pad connection circuit for setting coupling between the bus lines of the internal data bus and the plurality of pads at least in accordance with word structure information.

By arranging the data pads distributedly in the outer peripheral portions of the four divided regions of the semiconductor chip, it is possible to easily arrange the data pads corresponding to the ball grid array of the multi chip package even if the semiconductor chip is assembled in a multi chip package, and to utilize the semiconductor chip the same in configuration for the single chip package and for the multi chip package.

By separating the 1-bit test write data transfer bus line from the data line for transferring a multi-bit test read result in a multi-bit test, it is possible to distribute the circuits connected to the bus for writing and reading the test data, to mitigate bus load, and to transfer the data at high speed in a normal operation mode (since it is unnecessary to connect write/read data buses dedicated to the respective word structures to the same data bus line).

By changing the refresh cycle according to the type of the assembling package, it is possible to execute a refreshing operation in an optimum cycle in accordance with the storage capacity of the memory assembled in the package, ensuring retention of the storage data.

By applying data input/output mask signals to the memory circuits arranged corresponding to the respective four divided regions of the chip, it is possible to individually mask the data input/output in the respective four divided regions, to facilitate the connection between the data input/output mask pads and the data terminals, and to simplify the layout of wiring of data lines between the pads and terminals when the semiconductor memory chip is assembled in a multi chip package.

By setting the connection between the internal data bus lines and the pads at least in accordance with word structure information, it is possible to make the configuration of the internal read circuit such as a preamplifier common irrespectively of the word structure, simplifying the layout of the internal data read section.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a schematic diagram showing the configuration of a memory array shown in FIG. 2;

FIG. 27 is a schematic diagram showing the arrangement of data pads in the fourth embodiment according to the present invention;

FIG. 38 is a schematic diagram showing the allocation of data bits in a memory array in a modification of the sixth embodiment according to the present invention;

FIG. 51 is a schematic diagram showing the configuration of the important parts of a semiconductor circuit device in the eighth embodiment according to the present invention;

FIG. 67 specifically represents the correspondence between the internal data line and the transfer data during a multi-bit test in the tenth embodiment according to the present invention;

DESCRIPTION OF THE PREFERRED EMBODIMENTS

First Embodiment

Figure 1:
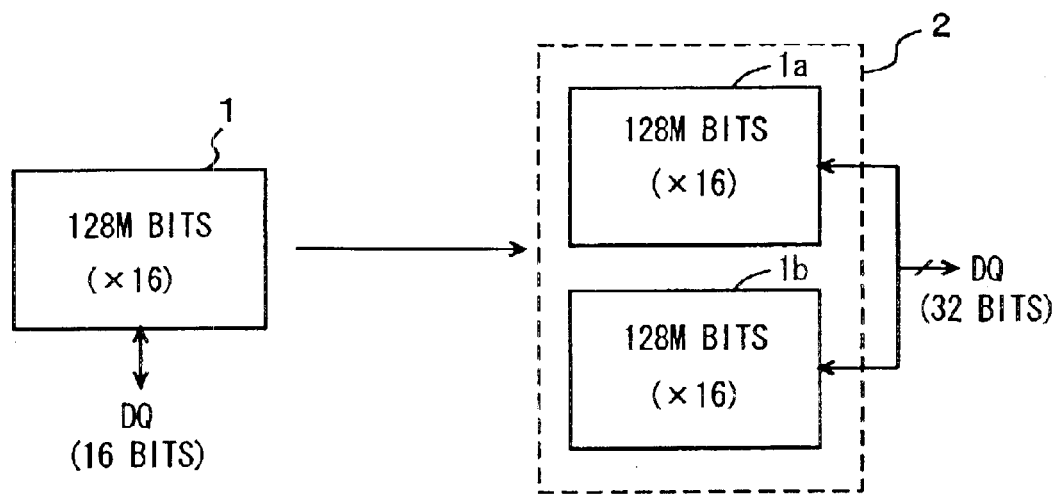
FIG. 1 is a schematic diagram showing the configuration of a semiconductor circuit device assembled in a multi chip package in the first embodiment according to the present invention.

FIG. 1 is a schematic diagram showing the configuration of a semiconductor circuit device in the first embodiment according to the present invention. In FIG. 1, a semiconductor chips 1 for a single chip package is used for implement a semiconductor memory device 2 assembled into a multi chip package (MCP). Semiconductor memory chip 1 has a storage capacity of 128 M bits and a word structure of ×16 bits.

Likewise, each of semiconductor memory chips 1a and 1b has a storage capacity of 128 M bits and a word structure of ×16 bits. These semiconductor memory chips 1a and 1b are operated simultaneously. Therefore, semiconductor memory device 2 has a storage capacity of 256 M bits and a word structure of ×32 bits.

On the other hand, where semiconductor memory chips 1a and 1b are set into a word structure of ×8 bits, and are operated simultaneously, semiconductor memory device 2 has a word structure of ×16 bits. In the case when one of semiconductor memory chips 1a and 1b is operated, it is necessary to select a chip by the most significant bit of a row address signal. Therefore, allocation of the row address signal turns different from that for the semiconductor memory chip with a storage capacity of 128 M bits. Thus, a semiconductor memory device having a storage capacity of 256 M bits cannot be implemented using two semiconductor memory chips the same in configuration. Therefore, in the case of increasing a storage capacity with two semiconductor memory chips the same in configuration, semiconductor memory chips 1a and 1b are operated simultaneously.

Further, when refreshing is performed in semiconductor memory device 2, it is necessary to refresh semiconductor memory chips 1a and 1b simultaneously in parallel. In this case, current consumption increases in a refreshing operation. Particularly in a self refresh mode, such as a power down mode, set when it is required to hold data, low current consumption is required, and the low power consumption specification cannot be met.

In addition, in case of the semiconductor memory device of 128 M bits, a 4 k refresh cycle is normally set for a refresh cycle in accordance with the specification. In case of the semiconductor memory device of 256 M bits, by contrast, when a word structure is ×16 bits, an 8K refresh cycle is normally set for the refresh cycle in accordance with the specification. Therefore, a memory having a storage capacity of 256 M bits and a word structure of ×16 bits cannot be implemented when using two memory chips each having a storage capacity of 128 M bits and a word structure of ×8 bits.

In the 4K refresh cycle, it is required to execute a refreshing operation 4K times to refresh all memory cells once. In the 8K refresh cycle, it is required to execute a refreshing operation 8K times to refresh all memory cells once. Therefore, in the 8K refresh cycle, the number of refresh rows is 8K while in the 4K refresh cycle, the number of refresh rows is 4K. In one refreshing operation, one refresh row is selected and refreshing is performed on the selected row. Refresh row is designated by a refresh address and is the same as or different from a word line connecting memory cells on a row, depending on internal structure.

In the first embodiment, the 4K refresh cycle and the 8K refresh cycle can be selectively made executable in one semiconductor memory chip 1 so as to enable the switching of the refresh cycle between the 8K refresh cycle and the 4K refresh cycle in accordance with the type of an assembling package and the word structure.

Figure 2:
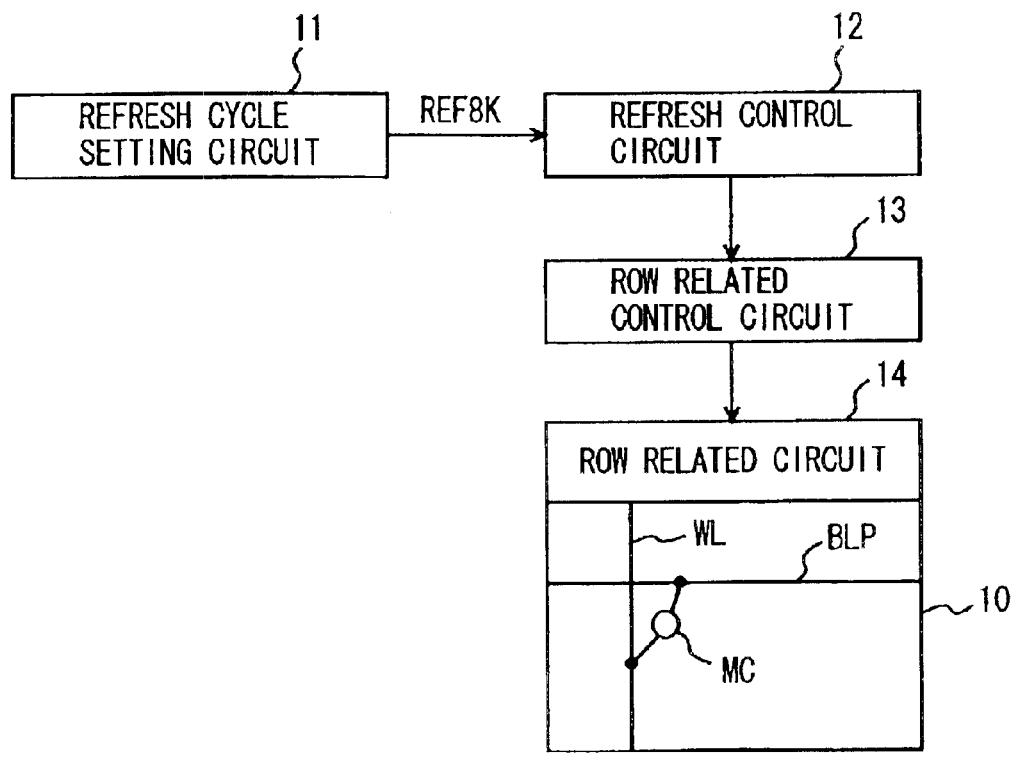
FIG. 2 is a schematic diagram showing the configuration of a main portion of the semiconductor circuit device in the first embodiment according to the present invention.

FIG. 2 is a schematic diagram showing the configuration of a main portion of a semiconductor circuit device (to be referred to as "semiconductor memory device" hereinafter) formed on semiconductor memory chip 1 (1a, 1b) shown in FIG. 1.

In FIG. 2, the semiconductor memory device includes a memory array 10 having a plurality of memory cells MC arranged in rows and columns. In memory array 10, word lines WL are arranged corresponding to the rows of memory cells MC and bit line pairs BLP are arranged corresponding to the columns of memory cells MC. Memory cell MC is normally a one-transistor/one-capacitor type DRAM (dynamic random access memory) cell. Therefore, information is stored in a capacitor in the form of charges, so that it is required to execute a refreshing operation of cyclically rewriting storage data in predetermined cycles.

The semiconductor memory device further includes a refresh cycle setting circuit 11 for setting a refresh cycle in accordance with the type of a package having semiconductor memory chip 1 assembled therein and a word configuration, a refresh control circuit 12 for generating control signals necessary to execute a refreshing operation in cycles set in accordance with a refresh cycle designation signal REF8K applied from refresh cycle setting circuit 11, a row related control circuit 13 for generating a control signal necessary to execute an operation related to the selection of a row in memory cell array 10 in accordance with the refresh control signal applied from refresh control circuit 12, and a row related circuit 14 for performing an operation related to the selection of a row in memory array 10 in accordance with the row related control signal applied from row related control circuit 13.

Row related circuit 14 includes a word line selection/drive circuit for driving a word line WL to a selected state, a sense amplifier for sensing, amplifying and rewriting (restoring) data stored in memory cell MC connected to selected word line WL, and a bit line precharge/equalization circuit for setting each bit line of bit line pair BLP at predetermined voltage level in a standby state.

Bit line pair BLP includes bit lines BL and ZBL for transmitting complementary data when a corresponding memory cell is selected. Memory cell MC is arranged corresponding to an intersection between one of complementary bit lines BL and ZBL and word line WL.

In the configuration shown in FIG. 2, refresh cycle setting circuit 11 sets the refresh cycle at the 4K refresh cycle if semiconductor memory chip 1 is assembled in a single chip package and sets the refresh cycle at the 8K refresh cycle if semiconductor memory chip 1 is assembled in a multi chip package with a word structure of ×16 bits (a semiconductor memory chip solely has a word structure of ×8 bits). Refresh control circuit 12 issues a refresh request in the cycles set according to refresh cycle designation signal REF8K, updates a refresh address, generates and applies a refresh activation signal to row related control circuit 13.

Row related control circuit 13 generates various row related control signals so as to drive word line WL corresponding to the row designated by the refresh address to a selected state in a predetermined sequence in accordance with the refresh activation signal applied from refresh control circuit 12. Row related circuit 14 executes the selection of corresponding word line WL, a sensing operation and a restoring operation (rewrite operation) in accordance with the control signals from row related control circuit 13 and the refresh address signal in the predetermined sequence.

Therefore, in refresh control circuit 12, an interval for activating a refreshing operation in the 8K refresh cycle is set to half times the interval in the 4K refresh cycle. Accordingly, the number of refresh rows is doubled upon assembling in a multi package. Even if semiconductor memory chips 1a and 1b are simultaneously refreshed, the refresh interval for the respective memory cells is made equal to be, for example, 64 ms. It is, therefore, possible to ensure executing a refreshing operation to hold storage data with the same chip configuration.

Further, since the number of refresh rows is doubled, the number of sense amplifiers which operates in one refreshing operation can be halved. It is, therefore, possible to decrease the current consumption in one semiconductor memory chip in the refreshing operation and to prevent an increase in current consumption in the refreshing operation when constructing a 256 M bit configuration memory.

Figure 3:
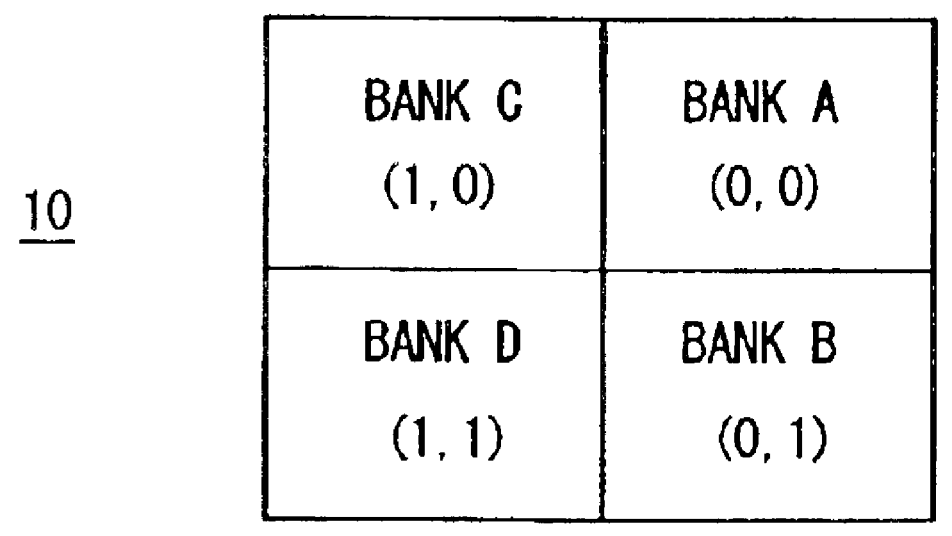

FIG. 3 is a schematic diagram showing the configuration of memory cell array 10 shown in FIG. 2. As shown in FIG. 3, memory cell array 10 is divided into four banks A to D. These banks A to D are designated by bank address BA<1:0>. FIG. 3 shows an example in which bank address (0,0), (0,1), (1,0) and (1,1) of bank address BA<1:0> are allocated to banks A to D, respectively.

Figure 4:
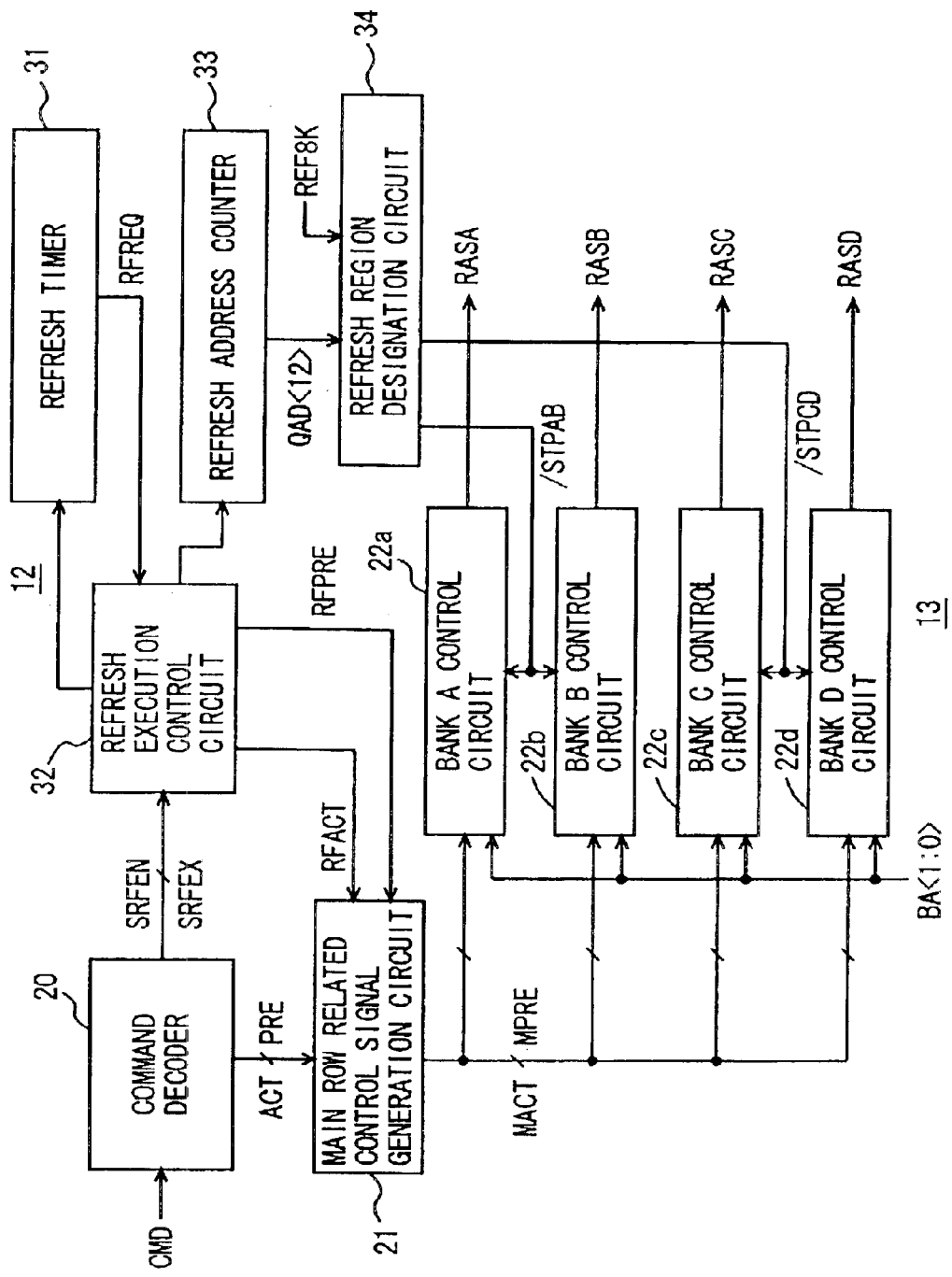
FIG. 4 is a schematic diagram showing the configuration of a refresh control circuit and a row related control circuit shown in FIG. 2.

FIG. 4 shows the configuration of refresh control circuit 12 and row related control circuit 13 shown in FIG. 2 more specifically. In FIG. 4, the semiconductor memory device includes a command decoder 20 that decodes an external command CMD for designating an operation mode, to generate an internal operation instruction signal. Command decoder 20 takes in and decodes command CMD applied externally at, for example, the rising edge of a clock signal, not shown, and generates the operation mode instruction signal for specifying the operation mode designated by the command. FIG. 4 representatively shows an array activation instruction signal ACT for instructing the driving of the memory array to a selected state, a precharge instruction signal PRE for instructing the deactivation of the selected array, a self refresh entry signal SRFEN for instructing the execution of a self refreshing operation, and a self refresh exit signal SRFEX for instructing the completion of a self refresh mode.

Refresh control circuit 12 includes a refresh timer 31 for issuing a refresh request RFREQ in a predetermined cycle when activated, a refresh execution control circuit 32 for activating refresh timer 31 in response to self refresh entry signal SRFEN and self refresh exit signal SRFEX from command decoder 20 and generating a refresh activation signal RFACT and a refresh completion instruction signal RAPRE in accordance with refresh request RFREQ from refresh timer 31, a refresh address counter 33 for generating a refresh address QAD under the control of refresh execution control circuit 32, and a refresh region designation circuit 34 for designating a refresh region (refresh bank) in accordance with refresh address bit QAD<12> and refresh cycle designation signal REF8K.

Refresh execution control circuit 32 activates refresh timer 31 when self refresh entry signal SRFEN is activated, and deactivates refresh timer 31 and completes a refreshing operation when self refresh exit signal SRFEX is activated. Refresh execution control circuit 32 activates refresh activation signal RFACT when refresh request RFREQ is issued, and activates refresh completion instruction signal RFPRE when a predetermined time (time required to restore data under refresh) passes.

Refresh address counter 33 increments or decrements its count value each time a refreshing operation is executed. By way of example, refresh address counter 33 generates refresh address bits QAD<12:0> of 13 bits. FIG. 4 representatively shows the most significant refresh address bit QAD<12> from refresh address counter 33.

Refresh region designation circuit 34 designates a refresh region (refresh bank) in accordance with refresh address bit QAD<12> when refresh cycle designation signal REF8K is active. When refresh cycle designation signal REF8K is at L level, refresh region designation circuit 34 simultaneously activates a refreshing operation for all banks, irrespectively of the refresh address bit QAD<12>. The logical level of refresh cycle designation signal REF8K is set according to the type of the package having the semiconductor memory device assembled therein and the word structure by mask interconnection or by fixing a potential of a mode setting pad.

Row related control circuit 13 includes a row related control signal generation circuit 21 for generating a main array activation instruction signal MACT and a main precharge instruction signal MPRE common to banks A to D in accordance with array activation instruction signal ACT and precharge instruction signal PRE from command decoder 20 and refresh activation signal RFACT and refresh completion instruction signal REPRE from refresh execution control circuit 32, and bank control circuits 22a to 22d provided corresponding to banks A to D, respectively. Bank A control circuit 22a and bank B control circuit 22b each receive a bank designation signal /STPAB from refresh region designation circuit 34, and bank C control circuit 22c and bank D control circuit 22d each receive a bank designation signal /STPCD from refresh region designation circuit 34.

Bank control circuit 22, which generically refer to bank A control circuit 22a to bank D control circuit 22d collectively, receives bank address BA<1:0>. In addition, each of bank control circuits 22a to 22d receives main array activation instruction signal MACT and main precharge instruction signal MPRE.

When active, bank control circuits 22a to 22d generate array activation signals RASA to RASD for activating the row selecting operations of the corresponding banks, respectively. Bank control circuits 22a to 22d can be driven to active/inactive states, independently of one another. In a normal operation mode, one of array activation signals RASA to RASD is activated/deactivated in accordance with bank address BA<1:0>. In a refreshing operation mode, two or four of array activation signals RASA to RASD are simultaneously activated.

Figure 5:
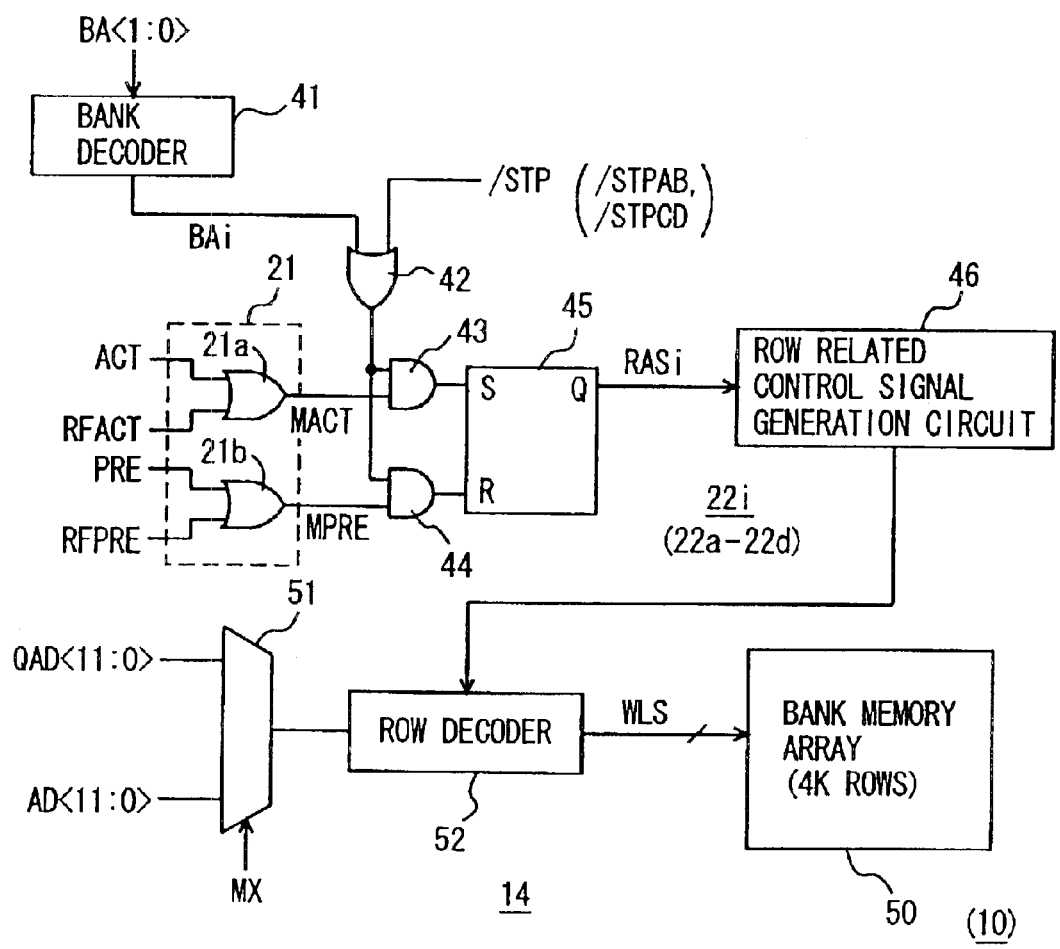
FIG. 5 is a schematic diagram showing the configuration of a bank control circuit shown in FIG. 4 and a row related circuit shown in FIG. 2.

FIG. 5 is a schematic diagram showing the configuration of a row related control circuit and a row related circuit in one bank. In FIG. 5, bank control circuit 22i includes a bank decoder 41 for decoding bank address BA<1:0>, an OR gate 42 receiving a bank select signal BAi and a refresh bank designation signal /STP from bank decoder 41, an AND gate 43 receiving the output signal of OR gate 42 and main array activation instruction signal MACT, an AND gate 44 receiving main precharge instruction signal MPRE and the output signal of OR gate 42, a set/reset flip-flop 45 set in response to the rise of the output signal of AND gate 43 and reset in response to the rise of the output signal of AND gate 44, and a row related control signal generation circuit 46 for generating a row related control signal in a predetermined sequence in accordance with array activation signal RASi from set/reset flip-flop 45.

Bank decoder 41 may be provided commonly to bank control circuits 22a to 22d. OR gate 42 outputs an H-level signal when bank select signal BAi or refresh bank designation signal /STP attains H level. Therefore, in a designated bank, the activation/deactivation of array activation signal RASi is executed in accordance with main array activation instruction signal MACT and main precharge instruction signal MPRE. While array activation signal RASi is active, the designated bank is kept in a selected state and a selected word line is kept in a selected state.

Row related signal generation circuit 46 generates a bit line precharge/equalization instruction signal, a sense amplifier activation signal, a word line drive timing signal and a row decoder enable signal. In accordance with these control signals from row related control signal generation circuit 46, an addressed row is driven to a selected state, and the data of the memory cells connected to a word line in this selected row are sensed, amplified and latched in the selected bank.

The row related circuit includes a row decoder 52 for decoding an address signal applied through a multiplexer 51 to generate a word line select signal WS when active. Row decoder 52 drives one of 4K rows arranged in a corresponding memory bank array 50 to a selected state. In this case, by designating one row, two word lines may be driven to a selected state.

Multiplexer 51 is provided commonly to banks A to D, and selects either refresh address QAD<11:0> from refresh address counter 33 (see FIG. 4) or external address signal AD<11:0> in accordance with a select signal MX. Select signal MX is set in a state for selecting refresh address QAD<11:0> in a refreshing operation.

Figure 6:
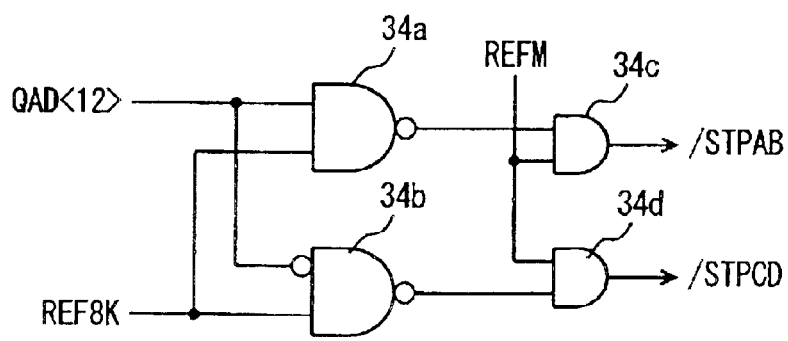
FIG. 6 shows an example of the configuration of a refresh region designation circuit shown in FIG. 4.

FIG. 6 shows an example of the configuration of refresh region designation circuit 34 shown in FIG. 4. In FIG. 6, refresh region designation circuit 34 includes a NAND gate 34a receiving refresh address bit QAD<12> and refresh cycle designation signal REF8K, a gate circuit 34b receiving refresh address bit QAD<12> and refresh cycle designation signal REF8K, an AND gate 34c receiving a refresh mode instruction signal REFM and the output signal of NAND gate 34a and generating refresh region designation signal /STPAB, and an AND circuit 34d receiving refresh mode instruction signal REFM and the output signal of gate circuit 34b and generating refresh region designation signal /STPCD.

Refresh region designation signal /STPAB stops refreshing banks A and B when made active at L level. Refresh region designation signal /STPCD stops refreshing banks C and D when active at L level.

Refresh mode instruction signal REFM is set at H level in a self refresh mode and an auto refresh mode. In the self refresh mode, a refreshing operation is executed internally at pre-set cycles. In the auto refresh mode, refresh addresses are generated internally and a refreshing operation is executed in accordance with an external auto refresh mode instruction signal ARF.

Refresh mode instruction signal REFM is set in accordance with self refresh entry signal SRFEN and self refresh exit signal SRFEX from command decoder 20 and auto refresh mode instruction signal ARF (not shown), under the control of refresh execution control circuit 32 shown in FIG. 4. In a normal operation mode, therefore, self refresh region designation signals /STPAB and /STPCD are both at L level. In this state, as shown in FIG. 5, a bank is selected in accordance with bank select signal BAi through OR gate 42.

When refresh cycle designation signal REF8K is set at H level to designate the 8K refresh cycle, NAND gate 34a and gate circuit 34b generates complementary signals in accordance with refresh address bit QAD<12>. Therefore, where a refreshing operation is executed in this 8K refresh cycle, one of refresh region designation signals /STPAB and /STPCD is set at H level and the other refresh region designation signal is set at L level.

If refresh cycle designation signal REF8K is set at L level, the output signals of NAND gate 34a and gate circuit 34b are set at H level. In the refresh mode, therefore, both of refresh region designation signals /STPAB and /STPCD are set at H level and banks A to D are refreshed in common.

Figure 7A:
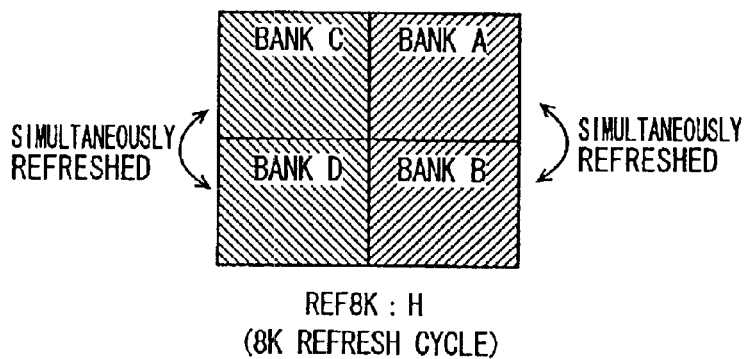
FIG. 7A shows refresh target banks in an 8K refresh cycle.

Accordingly, as shown in FIG. 7A, when refresh cycle REF8K is set at H level to designate the 8K refresh cycle, banks A and B or banks C and D are simultaneously refreshed. The refresh target banks are designated in accordance with refresh address bit QAD<12>.

Figure 7B:
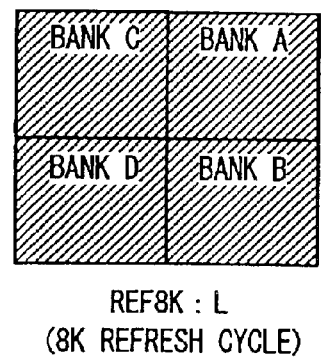
FIG. 7B shows refresh target banks in a 4K refresh cycle.

As shown in FIG. 7B, where refresh cycle REF8K is set at L level, banks A to D are simultaneously refreshed. Consequently, when two semiconductor memory chips are employed to be assembled in a multi chip package, the four banks are simultaneously refreshed along the 8K refresh cycle. In this case, current consumption during the refreshing operation in the 4K refresh cycle is the same as that in the 8K refresh cycle. Thus, a semiconductor circuit device assembled in both a signal chip package and a multi chip package can be implemented with the same chip configuration. Therefore, even if a semiconductor memory device of 256 M bits (a word structure of ×16 bits) is implemented using two semiconductor memory chips each of 128 bits (a word structure of ×8 bits), for example, it is possible to execute refreshing operation without increasing current consumption in the refresh mode.

Alternatively, banks A and D or banks C and B may be refreshed simultaneously in the 8K refresh cycle. In this case, it is possible to distribute simultaneously operating circuit portions over the chip, to prevent the concentration of power and to efficiently dissipate heat.

Further, in the 8K refresh cycle and the 4K refresh cycle, memory cells should be refreshed at, for example, 64 ms intervals. Thus, when the refresh cycle is set at the 8K refresh cycle or 4K refresh cycle, an interval for issuing a refresh request is set at, for example, 8 μs (micro seconds) and 16 μs in the 8K refresh cycle and the 4K refresh cycle, respectively. The configuration for changing the interval of issuing the refresh request will be described later.

In case of a semiconductor memory device having a storage capacity of 256 M bits, the refresh cycle may be determined to be at 4K refresh cycle for ×8 bit configuration and for ×32 bit configuration in accordance with a specification, while for 128 bit memory, the refresh cycle may be determined to be at 4K refresh cycle for all the word structures by the specification. In this case as well, when a 256 M bit multi chip package memory with a ×16 bit word structure is manufactured using two 128 M bit semiconductor memory chips with a ×8 bit word structure, the refresh cycle is set at the 8K refresh cycle. Accordingly, it is possible to implement an MCP memory of 256 M bits using two 128 M bit semiconductor memory chips, irrespectively of its word structure.

The specific value of the refresh cycle is not limited to the above described values, as far as the refresh cycle is made different between a single chip package memory and a multi chip package memory. It would suffice that an appropriate refresh cycle is set according to the type of a package assembling a memory therein.

Figure 8:
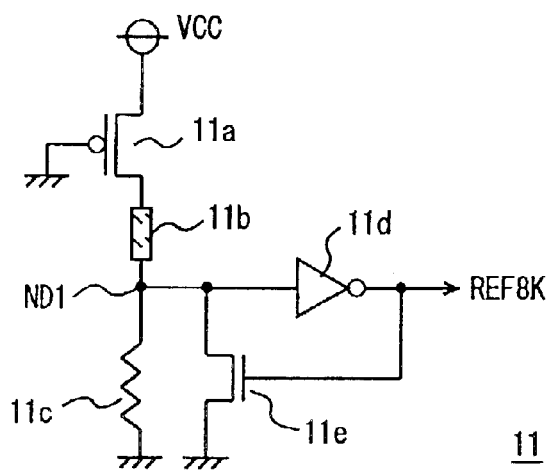
FIG. 8 shows an example of the configuration of a refresh cycle setting circuit shown in FIG. 2.

First Configuration of Refresh Cycle Setting Circuit FIG. 8 shows an example of the configuration of refresh cycle setting circuit 11 shown in FIG. 2. In FIG. 8, refresh cycle setting circuit 11 includes a P-channel MOS transistor (insulated gate field effect transistor) 11a having a source connected to a power supply node and a gate connected to a ground node, a fusible link element (fuse element) 11b connected between a drain node of MOS transistor 11a and a node ND1, a resistance element 11c connected between node ND1 and a ground node, an inverter lid inverting a voltage signal on node ND1 to generating refresh cycle designation signal REF8K, and an N-channel MOS transistor 11e connected between node ND1 and a ground node and having a gate receiving output signal REF8K of inverter 11d.

MOS transistor 1a, receiving a ground voltage at the gate thereof, is kept in a normally conductive state and functions as a current limiting element. Resistance element 11c is sufficiently higher in resistance value than the channel resistance of MOS transistor 11a.

Link element 11b is blown when the refresh cycle is set at the 8K refresh cycle and kept in a non-blown state when the refresh cycle is set at the 4K refresh cycle. When link element 11b is blown, node ND1 is kept at ground voltage level by resistance element 11c and refresh cycle designation signal REF8K is driven to H level by inverter lid. When the level of refresh cycle designation signal REF8K turns H level, MOS transistor 11e turns conductive to surely hold node ND1 at the ground voltage level.

When link element 11b is not blown, the voltage level of node ND1 is raised by a current supplied thereto through MOS transistor 11a and refresh cycle designation signal REF8K is driven to L level by inverter 11d. In this state, MOS transistor lie is kept nonconductive, and a current flows through resistance element 11c. However, the resistance value of resistance element 11c is made sufficiently high, so that the current flowing through resistance element 11c is sufficiently suppressed.

A transistor, which is kept conductive for a predetermined period in response to a reset signal such as a power-on detection signal, may be connected in series to resistance element 11c. Such transistor is made conductive to drive node ND1 to the ground voltage level in an initialization period, and when the transistor turns nonconductive, the voltage level of refresh cycle designation signal REF8K is set in accordance with the blown/non-blown state of link element 11b. Since the resetting transistor is conductive only during the initialization period, it is possible to decrease the current consumption in refresh cycle setting circuit 11.

With either configuration, the refresh cycle can be selectively set at the 8K refresh cycle or the 4K refresh cycle in accordance with the blown/non-blown state of link element 11b.

Second Configuration of Refresh Cycle Setting Circuit

Figure 9:
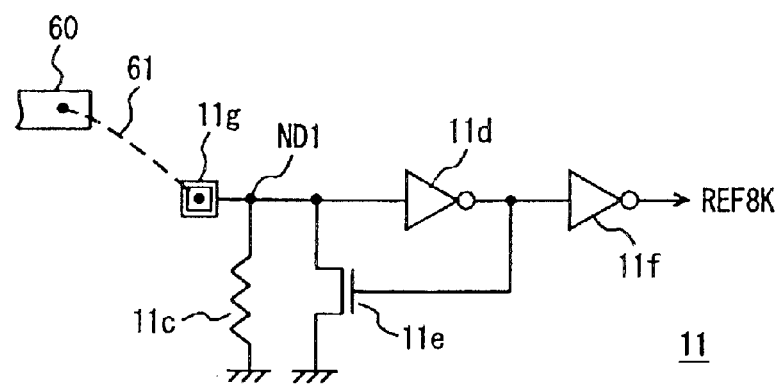
FIG. 9 shows another example of the configuration of the refresh cycle setting circuit shown in FIG. 2.

FIG. 9 shows another example of the configuration of refresh cycle setting circuit 11 shown in FIG. 2. Refresh cycle setting circuit 11 shown in FIG. 9 differs from that shown in FIG. 8 in the following points. In refresh cycle setting circuit 11 shown in FIG. 9, node ND1 is connected to a pad 11g. Link element 11b and MOS transistor 11a are not provided. Refresh cycle setting signal REF8K is outputted from an inverter 1 if that receives the output signal of inverter 11d.

Pad 11g is selectively connected to a power supply terminal 60 through a bonding wire 61. Since the other components of refresh cycle setting circuit 11 shown in FIG. 9 are the same as those of refresh cycle setting circuit 11 shown in FIG. 8, the corresponding elements are denoted by the same reference numerals, and detailed description thereof will not be repeated.

In refresh cycle setting circuit 11 shown in FIG. 9, in the case when the refresh cycle is set at the 8K refresh cycle, pad 11g is connected to power supply terminal 60 through bonding wire 61. In this case, refresh cycle designation signal REF8K is set at H level. On the other hand, when pad 11g is isolated from power supply terminal 60 to set pad 11g in an open state, node ND1 is driven to L level by resistance element 11c, the output signal of inverter 11d becomes H level, MOS transistor 11e becomes conductive and node ND1 is kept at the ground voltage level. Inverter 1 if inverts the output signal of inverter 11d, and refresh cycle designation signal REF8K is set at L level.

In refresh cycle setting circuit 11 shown in FIG. 9, when pad 11g is connected to power supply terminal 60 through bonding wire 61, a current flows from power supply terminal 60 to the ground node through resistance element 11c. In order to suppress such current flow, the resistance value of resistance element 11c is made sufficiently high.

As shown in FIG. 9, by selectively connecting bonding wire 61 to bonding pad 11g, the refresh cycle of this semiconductor memory chip can be set upon assembling into a package.

Alternatively, pad 11g may be selectively connected to the ground terminal through a bonding wire. In this case, resistance element 11c is connected between node ND1 and the power supply node and a P-channel MOS transistor connected between the power supply node and node ND1 is employed in place of MOS transistor 11e.

Further, a switching transistor that turns conductive in accordance with a reset signal during an initialization period may be connected in series to resistance element 11c.

Configuration of Refresh Timer 31

Figure 10:
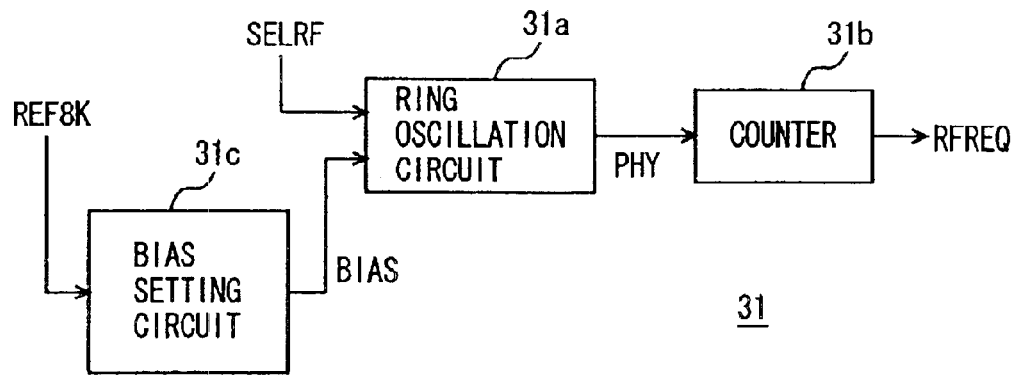
FIG. 10 shows an example of the configuration of a refresh timer shown in FIG. 4.

FIG. 10 is a schematic diagram showing the configuration of refresh timer 31 shown in FIG. 4. In FIG. 10, refresh timer 31 includes a ring oscillation circuit 31a performing an oscillation operation when self refresh mode instruction signal SELRF is activated, a counter 31b counting an output signal of oscillation circuit 31a and issuing a refresh request RFREQ at each predetermined count, and a bias setting circuit 31c for adjusting an operating current of ring oscillation circuit 31a in accordance with refresh cycle designation signal REF8K.

Self refresh mode instruction signal SELRF is activated when self refresh mode entry signal SRFEN is activated and deactivated when self refresh mode exit signal SRFEX is activated. Therefore, ring oscillation circuit 31a performs an oscillation operation while the self refresh mode is set.

Bias setting circuit 31c sets the voltage level of bias voltage BIAS in accordance with refresh cycle designation signal REF8K and changes the operating current of ring oscillation circuit 31a. When refresh cycle designation signal REF8K designates the 8K refresh cycle, bias voltage BIAS from bias setting circuit 31c increases, the operating current of ring oscillation circuit 31a increases and the oscillation cycle of ring oscillation circuit 31a is shortened. When refresh cycle designation signal REF8K designates the 4K refresh cycle, bias voltage BIAS from bias setting circuit 31c decreases, the operating current of ring oscillation circuit 31a decreases below that in the 8K refresh cycle, and the oscillation cycle of ring oscillation circuit 31a is made longer.

In this case, if the 4K refresh cycle is set as a default, bias voltage BIAS of ring oscillation circuit 31a is set at a default in the 4K refresh cycle. In the 8K refresh cycle, bias voltage BIAS is changed from the default (set higher than the default) to shorten the oscillation cycle of ring oscillation circuit 31a.

Counter 31b counts oscillation signals PHY from ring oscillation circuit 31a and issues refresh request RFREQ at each predetermined count. Therefore, when the oscillation cycle of ring oscillation circuit 31a becomes shorter, the period of issuing refresh request RFREQ from counter 31b becomes shorter. In the 8K refresh cycle, refresh request RFREQ can be issued at, for example, 8 $\mu$s intervals. In the 4K refresh cycle, the oscillation cycle of ring oscillation circuit 31a is set half as long as that in the 8K refresh cycle and counter 31b issues refresh request RFREQ at, for example, 16 $\mu$s intervals.

By using refresh timer 31 shown in FIG. 10, it is possible to change the refresh request RFREQ issuance period in accordance with refresh cycle designation signal REF8K with the same circuit configuration. In the 8K refresh cycle, the refresh request RFREQ issuance period is made shorter, whereby the refresh interval for the respective memory cells can be made equal to that in the 4K refresh cycle and it is possible to reliably hold the stored data.

Figure 11:
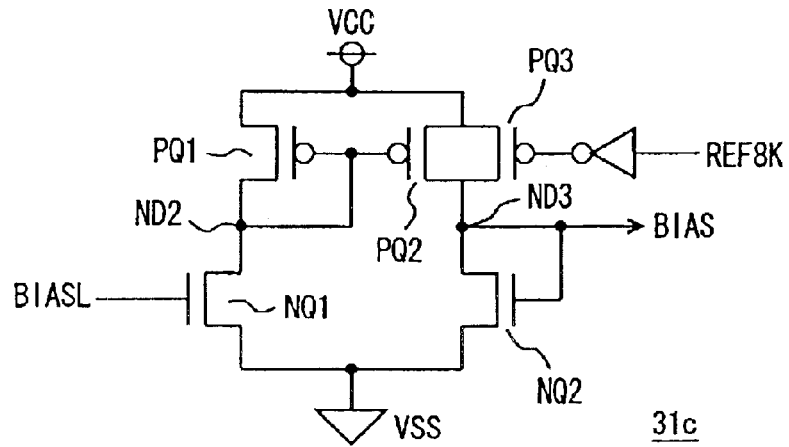
FIG. 11 shows an example of the configuration of a bias setting circuit shown in FIG. 10.

FIG. 11 shows an example of the configuration of bias setting circuit 31c shown in FIG. 10. In FIG. 11, bias setting circuit 31c includes a P-channel MOS transistor PQ1 connected between a power supply node and a node ND2 and having a gate connected to node ND2, a P-channel MOS transistor PQ3 connected between the power supply node and a node ND3 and having a gate connected to node ND2, an N-channel MOS transistor NQ1 connected between node ND2 and a ground node and having a gate receiving a reference voltage BIASL, an N-channel MOS transistor NQ2 connected between node ND3 and a ground node and having a gate connected to node ND3, and a P-channel MOS transistor PQ3 connected between the power supply node and node ND3 and having a gate receiving refresh cycle designation signal REF8K through an inverter. Bias voltage BIAS is outputted from node ND3.

In the configuration of bias setting circuit 31c shown in FIG. 11, MOS transistors PQ1 and PQ2 constitute a current mirror circuit. When MOS transistors PQ1 and PQ2 are the same in size, currents of the same magnitude are supplied to MOS transistors NQ1 and NQ2, respectively. When refresh cycle designation signal REF8K is at L level and the refresh cycle is set at the 4K refresh cycle, MOS transistor PQ3 is nonconductive. In this state, MOS transistors PQ1, PQ2, NQ1 and NQ2 constitute a voltage follower, so that bias voltage BIAS is made equal in voltage level to reference voltage BIASL.

Reference voltage BIASL is supplied from a constant voltage generation circuit, not shown. The output driving capability of the constant voltage generation circuit is set sufficiently low, and merely has a capability of charging the gate of MOS transistor NQ1. By utilizing bias setting circuit 31c, the bias voltage (gate voltage) of the power source transistors of ring oscillation circuit 31a are adjusted with a high driving power.

When refresh cycle designation signal REF8K is set at H level, MOS transistor PQ3 is rendered conductive to supply a current from the power supply node to node ND3. Accordingly, the driving current of MOS transistor NQ2 increases and the voltage level of bias voltage BIAS from node ND3 rises. By adjusting the size (ratio of a channel width to a channel length) of MOS transistor PQ3, the voltage level of bias voltage BIAS is adjusted and the operating current of ring oscillation circuit 31a is adjusted so that the oscillation cycle of ring oscillation circuit 31a in the 8K refresh cycle becomes twice the cycle in the 4K refresh cycle.

Figure 12:
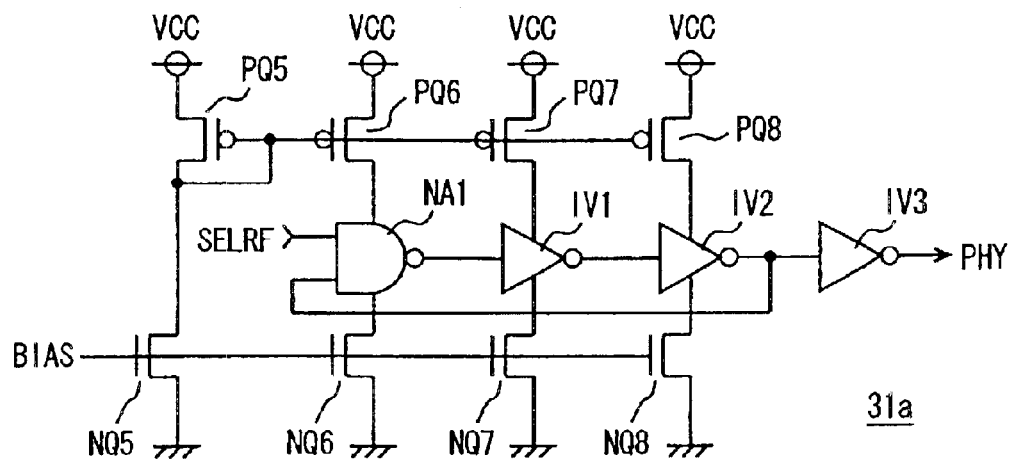
FIG. 12 shows an example of the configuration of a ring oscillation circuit shown in FIG. 10.

FIG. 12 shows an example of the configuration of ring oscillation circuit 31a shown in FIG. 10. In FIG. 12, ring oscillation circuit 34a includes a NAND circuit NA1 having a first input that receives self refresh mode instruction signal SELRF, cascaded inverters IV1 and IV2 receiving the output signal of NAND circuit NA1, and an inverter IV3 inverting an output signal of inverter IV2 to generate oscillation signal PHY. The output signal of inverter IV2 is applied to a second input of NAND circuit NA1.

Ring oscillation circuit 31a further includes an N-channel MOS transistor NQ5 having a gate receiving bias voltage BIAS, a P-channel MOS transistor PQ5 having gate and drain connected together and supplying a current from a power supply node to MOS transistor NQ5, P-channel MOS transistors PQ6 to PQ8 having their respective gates connected to the gate of MOS transistor PQ5 and supplying charging currents to NAND circuit NA1 and inverters IV1 and IV2, respectively, and N-channel MOS transistors NQ6 to NQ8 arranged corresponding to NAND circuit NA1 and inverters IV1 and IV2, respectively and receiving, at their gates, bias voltage BIAS.

P-channel MOS transistor PQ5 supplies a driving current to MOS transistor NQ5 and a current of the same magnitude as that of a current supplied to MOS transistor NQ5 flows through MOS transistor PQ5. MOS transistors NQ5 and NQ2 constitute a current mirror circuit so that MOS transistor NQ5 supplies a mirror current of the current flowing through MOS transistor NQ2 in accordance with bias voltage BIAS.

MOS transistors PQ6 to PQ8 and MOS transistor PQ5 constitute a current mirror circuit and MOS transistors PQ6 to PQ8 supply mirror currents of the current flowing through MOS transistor PQ5, respectively. Therefore, by increasing the voltage level of bias voltage BIAS, the driving currents of MOS transistors NQ5 to NQ8 increase and those of MOS transistors PQ5 to PQ8 increase, accordingly. Thus, the operating current of ring oscillation circuit 31a increases and the oscillation cycle of ring oscillation circuit 31a becomes short. When bias voltage BIAS is low, the driving currents of MOS transistors NQ5 to NQ8 decrease and those of MOS transistors PQ5 to PQ8 decrease, accordingly. Thus, the operating current of ring oscillation circuit 31a decreases and the oscillation cycle of ring oscillation circuit 31a becomes long.

When self refresh mode instruction signal SELRF is at L level, the output signal of NAND circuit NA1 is at H level and inverter IV3 fixes oscillation signal PHY to L level. When self refresh mode instruction signal SELRF is at H level, NAND circuit NA1 and inverters IV1 and IV2 form a ring oscillator in which three inverters are equivalently connected in a ring form, and the ring oscillator performs an oscillation operation. During this oscillation operation, the driving currents of MOS transistors PQ6 to PQ8 and NQ6 to NQ8 set the driving currents of NAND circuit NA1 and inverters IV1 and IV2 and the oscillation cycle of the ring oscillator is set. Inverter IV3 is provided to fix oscillation signal PHY to L level when self refresh mode instruction signal SELRF is deactivated and the operating current of inverter IV3 particularly needs not to be changed according to the refresh cycle. Inverter IV3 also performs waveform shaping of the output signal of inverter IV2 to thereby generate acutely changing oscillation signal PHY.

With the configurations shown in FIGS. 10 to 12, it is possible to set the interval of issuing refresh request RFREQ from refresh timer 31 in accordance with the set refresh cycle.

Modification of Refresh Timer

Figure 13:
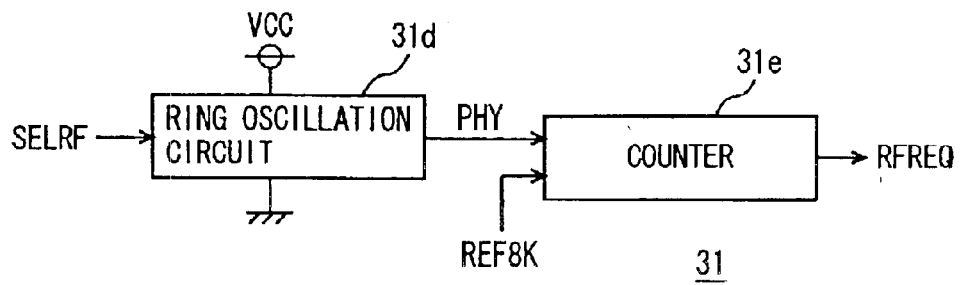
FIG. 13 is a schematic diagram showing another example of the configuration of the refresh timer shown in FIG. 4.

FIG. 13 is a schematic diagram showing the configuration of a modification of refresh timer 31 shown in FIG. 10. In FIG. 13, refresh timer 31 includes a ring oscillation circuit 31d that is activated when self refresh mode instruction signal SELRF is-activated and performs an oscillation operation in a predetermined cycle, and a counter 31e that counts oscillation signals PHY of ring oscillation circuit 31d and issues refresh request RFREQ each time the count reaches a predetermined value. Refresh cycle designation signal REF8K is applied to counter 31e and the predetermined count value is set according to the refresh cycle.

In the configuration of refresh timer 31 shown in FIG. 13, ring oscillation circuit 31d performs an oscillation operation in a predetermined cycle, independently of the refresh cycle. Counter 31e has the predetermined count value for issuing refresh request RFREQ changed in accordance with refresh cycle designation signal REF8K. When refresh cycle designation signal REF8K designates the refresh cycle at the 8K refresh cycle, the count value for issuing refresh request RFREQ is set to be a half of that in the 4K refresh cycle. Thus, refresh request RFREQ can be issued in the 8K refresh cycle in half the period of that in the 4K refresh cycle.

Figure 14:
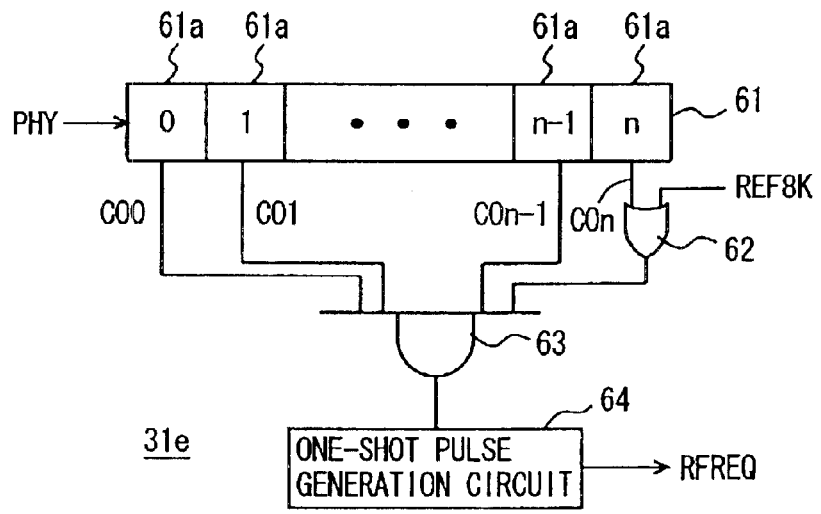
FIG. 14 shows an example of the configuration of a counter shown in FIG. 13.

FIG. 14 shows an example of the configuration of counter 3 le shown in FIG. 13. In FIG. 14, counter 31e includes an (n+1)-bit count circuit 61, an OR circuit 62 that receives the output counter bit COn of the most significant bit (n) of count circuit 61 and a refresh cycle designation signal REF8K, an AND circuit 63 that receives output count bits CO0 to COn−1 of count circuit 61, and a one-shot pulse generation circuit 64 that generates a one-shot pulse signal in response to the rise of an output signal of AND circuit 63.

Refresh request RFREQ is issued from one-shot pulse generation circuit 64.

Count circuit 61 includes 1-bit count circuits 61a each formed of, for example, a D flip-flop. In count circuit 61, when the count value reaches a predetermined value, all of output count bits CO0 to COn become "1" (in case of the (n+1)-bit count circuit configuration). Therefore, in the case when refresh cycle designation signal REF8K is set at H level to designate the 8K refresh cycle, OR circuit 62 outputs a signal at H level. Therefore, when all of count bits CO0 to COn−1 of count circuit 61 become "1", AND circuit 63 outputs an H-level signal and responsively, refresh request RFREQ is issued from one-shot pulse generation circuit 64. On the other hand, in the case where refresh cycle designation signal REF8K is at L level to designate the 4K refresh cycle, when output counter bits CO0 to COn become "1", the output signal of AND circuit 63 attains H level and responsively, refresh request RFREQ from one-shot pulse generation circuit 64 is activated. In the 8K refresh cycle, therefore, refresh request RFREQ can be issued in half the period of refresh request RFREQ in the 4K refresh cycle.

As described above, according to the first embodiment of the present invention, the refresh cycle can be changed according to the type of the package assembling a semiconductor circuit device. It is, therefore, possible to implement a semiconductor memory device capable of being housed in a plurality of types of packages, using one kind of chip.

By assembling two memory chips each having a storage capacity of 128 M bits in MCP, in particular, it is possible to easily implement a memory of 256 M bits.

Second Embodiment

Figure 15A:
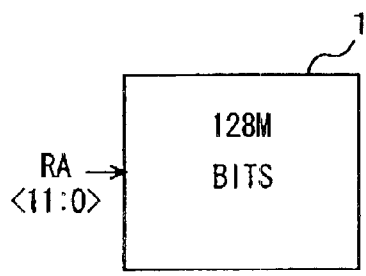
FIG. 15A shows the structure of an external row address of a memory of 128 M bits.
Figure 15B:
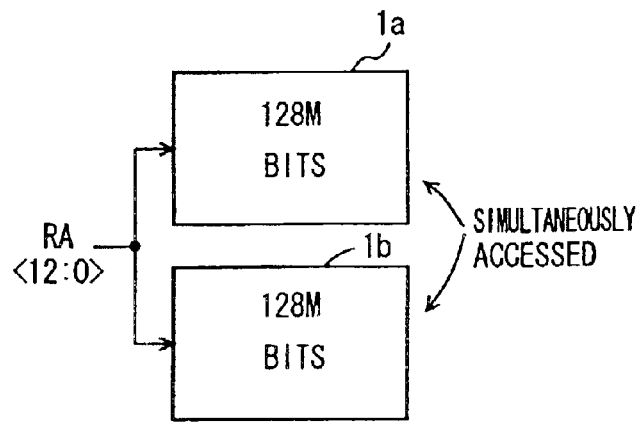
FIG. 15B shows the structure of an external row address of a memory of 256 M bits.

FIGS. 15A and 15B show the structure of row addresses for a memory chip in the second embodiment according to the present invention. As shown in FIG. 15A, row address RA<11:0> of 12 bits is applied to semiconductor memory chip 1 assembled in a single chip package. As shown in FIG. 15B, by contrast, row addresses RA<12:0> of 13 bits are applied in common to semiconductor memory chips 1a and 1b assembled in a multi chip package since a storage capacity is doubled. Semiconductor memory chips 1a and 1b are simultaneously accessed. In the configuration shown in FIG. 15B, the number of input/output data bits of semiconductor memory chips 1a and 1b is set half as large as that of input/output data bits of semiconductor memory chip 1 assembled in the single chip package shown in FIG. 15A, and in total, data of the same word structure is inputted and outputted as that for semiconductor memory chip 1 assembled in the single chip package.

Semiconductor memory chip 1 shown in FIG. 15A has a refresh cycle set at the 4K refresh cycle. Semiconductor memory chips 1a and 1b assembled in the multi chip package shown in FIG. 15 have a refresh cycle set at the 8K refresh cycle. Semiconductor memory chips 1, 1a and 1b are the same in configuration.

In a refresh cycle, as already shown in FIG. 5, refresh address bit QAD<12> is employed for selecting a bank and not employed for selecting a word line WL. In a normal operation mode, bank selection is executed in accordance wit bank address BA<1:0>. It may be considered that semiconductor memory chips 1a and 1b are selected using row address bit RA<12>. In this case, it is necessary to change the internal configuration, particularly the configuration of the decoder of the semiconductor memory chip. Thus, row address bit RA<12> applied externally is employed for selecting a column (data line) when the chips are assembled in MCP.

Figure 16:
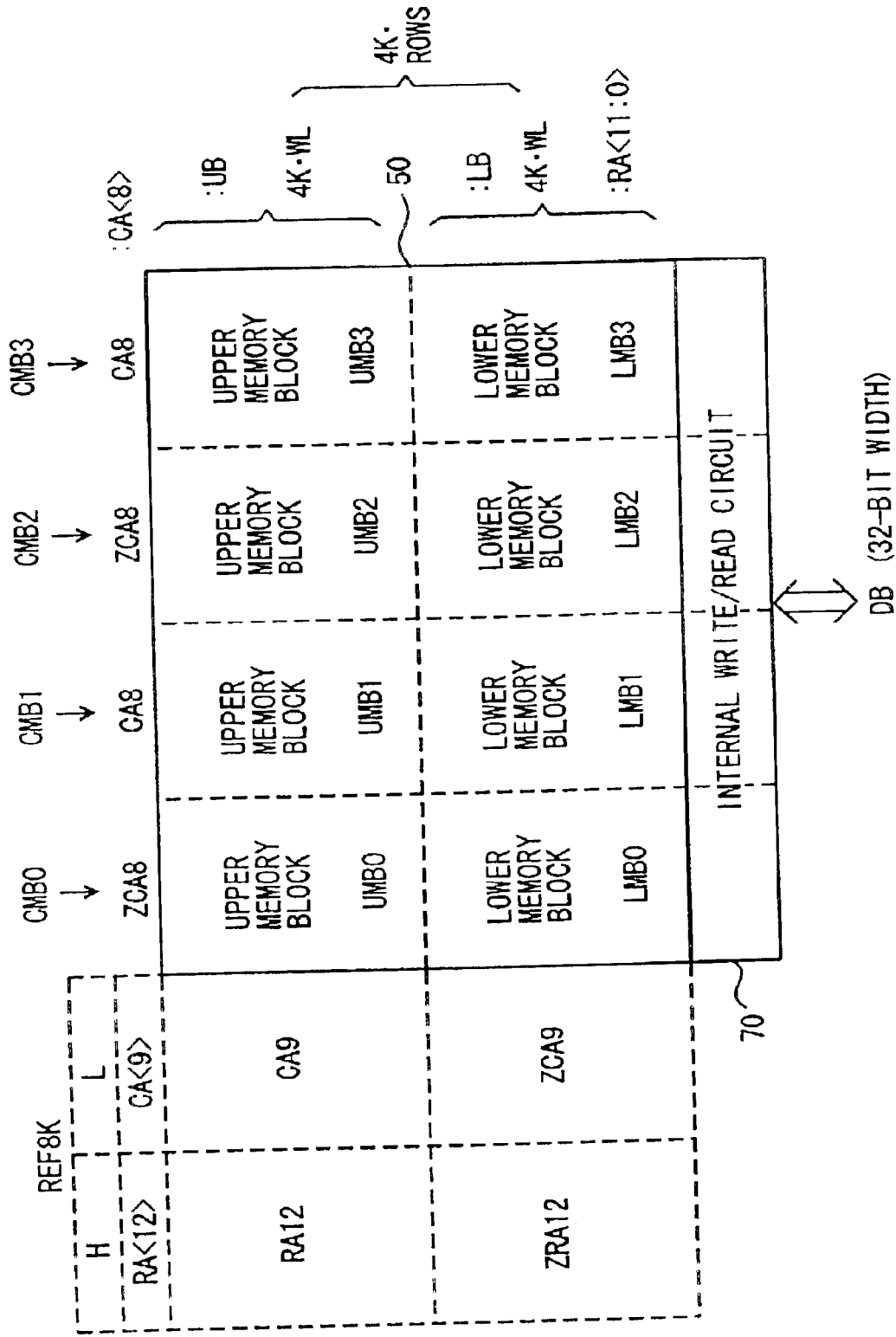
FIG. 16 shows the allocation of addresses of the memory array of a semiconductor circuit device in the second embodiment according to the present invention.

FIG. 16 shows the allocation of data line addresses of a bank memory array in the second embodiment according to the present invention. The data line address specify data lines (global data lines) simultaneously selected in bank memory array 50. This global data line selection is executed in an internal write/read circuit 70 in accordance with data line address. Internal write/read circuit 70, the internal configuration of which will be described later, includes write driver/amplifiers arranged corresponding to the global data lines and selectively activated in accordance with the data line address.

Bank memory array 50 is divided into an upper block UB and a lower block LB in a column direction (column extending direction). 4K word lines WL are arranged in each of upper and lower blocks UB and LB. In accordance with row address RA<11:0>, one word line WL is driven to a selected state in each of upper and lower blocks UB and LB. Therefore, in bank memory array 50, two word lines WL are simultaneously driven to a selected state. Bank memory array 50 is included in one bank.

As indicated in the first embodiment, in four bank configuration, all banks are simultaneously refreshed in the 4K refresh cycle and two banks are simultaneously refreshed in the 8K refresh cycle. With respect to one bank, a refreshing operation is executed 4K times to refresh data stored in all memory cells once.

Upper block UB is divided into upper memory blocks UMB0 to UMB3 in a row direction (row extending direction). Lower block LB is divided into lower memory blocks LMB0 to LMB3 in the row direction.

The memory blocks aligned in the column direction constitute a column block CMB. Specifically, upper memory block UMB0 and lower memory block LMB0 constitute a column block CMB0. Upper memory block UMB1 and lower memory block LMB1 constitute a column block CMB1. Upper memory block UMB2 and lower memory block LMB2 constitute a column block CMB2. Upper memory block UMB3 and lower memory block LMB3 constitute a column block CMB3.

An external column address signal CA8 is allocated to column blocks CMB0 and CMB2 and a column address signal ZCA8 is allocated to column blocks CMB1 and CMB3. These column address signals CA8 and ZCA8 are complementary signals generated from an external column address signal bit CA<8>. That is, when column address CA8 is at H level, a data access is made to column blocks CMB0 and CMB2. If column address ZCA8 is at H level, a data access is made to column blocks CMB1 and CMB3.

In one bank, two word lines WL are simultaneously selected in both 4K refresh cycle and 8K refresh cycle. In a semiconductor memory chip, the refresh cycle is changed by changing the number of banks to be refreshed simultaneously. In each bank, the number of word lines WL to be refreshed simultaneously is not changed.

When the refresh cycle is set at the 4K refresh cycle, a column address bit CA<9> is used for designating upper block UB and lower block LB. When column address signal CA9 is at H level, upper block UB is designated. When column address signal ZCA9 is at H level, lower block LB is designated.

If the refresh cycle is set at the 8K refresh cycle, row address bit RA<12> is used for designating upper block UB and lower block LB. When a row address signal RA12 is at H level, upper block UB is designated. If a row address signal ZRA12 is at H level, lower block LB is designated.

In each of the 4K refresh cycle and the 8K refresh cycle, row address bit RA<12> is not employed for designating a row in a row selection. In a refreshing operation, refresh address bit QAD<12> is employed for specifying a bank. On the other hand, as shown in FIG. 15B, if semiconductor memory chips are assembled in the multi chip package, row addresses RA<12:0> are applied externally. Therefore, if the refresh cycle is set at the 8K refresh cycle, externally applied row address bit RA<12> is employed in place of column address bit CA<9> employed in the 4K refresh cycle. Thus, it is possible to implement a 256 M bit memory (the 8K refresh cycle) assembled in MCP with a word structure of ×16 bits, using the 128 M bit, ×8 word configuration semiconductor memory chips (the 4K refresh cycle) without changing the configuration of the row decoder.

Figure 17:
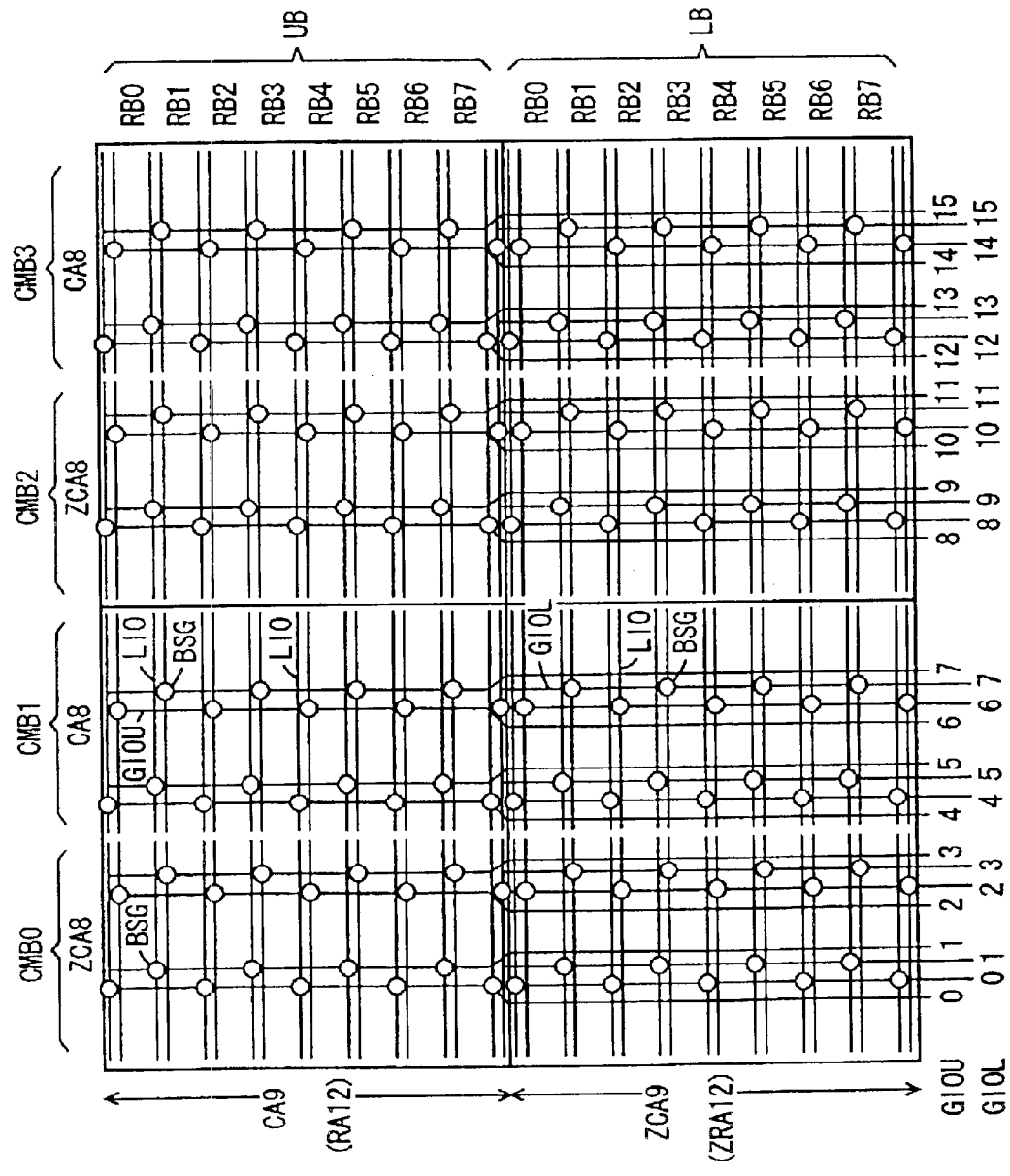
FIG. 17 is a schematic diagram showing the arrangement of global data lines in the memory array shown in FIG. 16.

FIG. 17 is a schematic diagram showing the arrangement of data lines of bank memory array 50 shown in FIG. 16. In FIG. 17, upper block UB is divided into eight row blocks RB0 to RB7 and lower block LB is also divided into eight row blocks RB0 to RB7. The word line selection is executed in units of row blocks RB0 to RB7. That is, in each of row blocks RB0 to RB7 of upper block UB and lower block LB, word lines are arranged extending in the row direction in common to column blocks CMB0 to CMB3. In each of upper block UB and lower block LB, one row block is selected and a word line is driven to a selected state.

Local data lines LIO are arranged corresponding to regions in which column blocks CMB0 to CMB3 and row blocks RB0 to RB7 intersect one another. By way of example, in one row block RBi, four local data lines LIO are arranged corresponding to column blocks CMB0 to CMB3, respectively. Local data line LIO is connected to global data line GIOU or GIOL through a corresponding block select gate BSG. Local data lines LIO arranged corresponding to row blocks RB0 to RB7 included in upper block UB, respectively, are connected to a corresponding global data line GIOU. Local data lines LIO arranged correspond to row blocks RB0 to RB7 included in lower block LB, respectively, are connected to a corresponding global data line GIOL.

Block select gate BSG is set in a conductive state in accordance with, for example, a row block select signal for specifying a row block. In upper block UB, four upper global data lines GIOU are arranged in one column block CMBj. Likewise, in upper block LB, four lower global data lines GIOL are arranged in one column block CMBj. Therefore, 16 upper global data lines GIOU0 to GIOU15 and 16 lower global data lines GIOL0 to GIOL15 are arranged in the bank memory array.

In global data lines GIOU0 to GIOU15 and GIOL0 to GIOL15, an upper global data line and a lower global data line are selected in accordance with column address signals CA9 and ZCA9 in the 4K refresh cycle, while an upper global data line and a lower global data line are selected in accordance with row address signals RA12 and ZRA12 in the 8K refresh cycle. Thus, data of 16 bits can be selected from data of a total of 32 bits. Using column address signals CA8 and ZCA8, ½ selection is further made to select data of 8 bits. Therefore, in the case of allocation of data line addresses as shown in FIG. 17, either of word structures of ×32 bits, ×16 bits and ×8 bits can be selected as internal read data by degeneration of address. In the 8K refresh cycle, in the case of a word structure of ×8 bits, row address bit RA<12> is used in place of column address bit CA<9>. The row decoder executes a decoding operation for row selection in accordance with row address RA<11:0>, irrespectively of the word structure.

Figure 18:
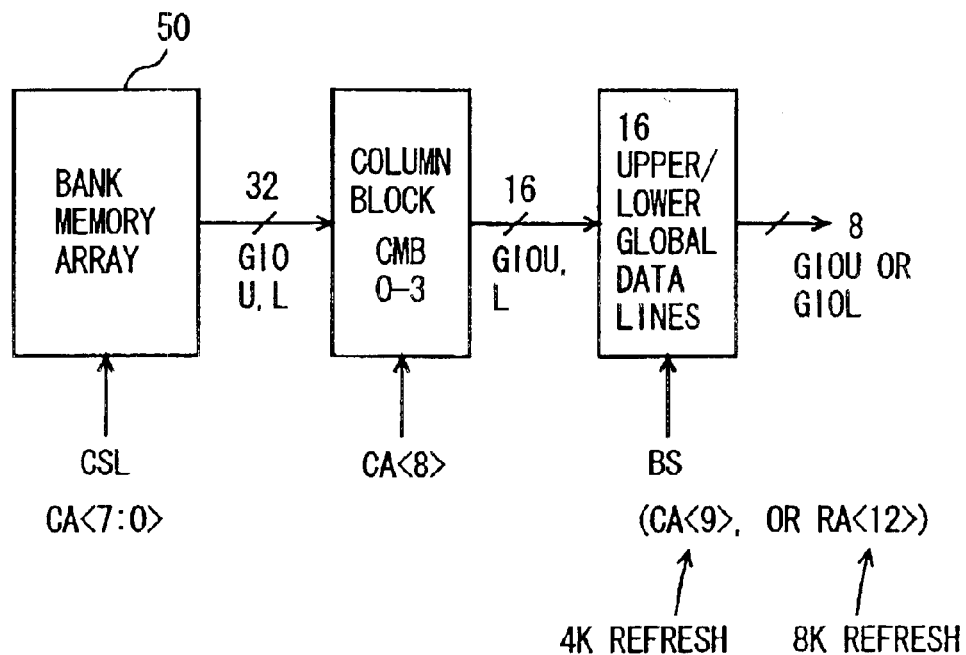
FIG. 18 is a schematic diagram showing the configuration of a data line select section in the second embodiment according to the present invention.

FIG. 18 is a schematic diagram showing the correspondence among data lines, data address signals and data line addresses. In FIG. 18, a column select signal CSL is generated in accordance with column address CA<7:0> of 8 bits, 16 columns are simultaneously selected from each of upper block UB and lower block LB (the columns at the same positions in upper block UB and lower block LB), and the selected memory cells (selected columns) are connected to 32 global data lines GIOU<15:0> and GIOL<15:0>, respectively. Then, in accordance with column address bit CA<8>, even-numbered column blocks or odd-numbered column blocks are selected from column blocks CMB0 to CMB3 and 16 global data lines GIOU and GIOL are selected. Further, in accordance with an upper/lower block select signal BS (CA<9> or RA<12>), either upper global data lines GIOU or lower global data lines GIOL are selected.

Therefore, if column address bit CA<8> and block select signal BS (CA<9> or RA<12>) are all valid, data of 8 bits is transferred. For the word structure of ×8 bits, if the refresh cycle is set at the 4K refresh cycle, column address bit CA<9> is used and if the refresh cycle is set at the 8K refresh cycle (upon assembly in MCP), row address bit RA<12> is used.

In the word structure of ×16 bits, upon assembly in MCP, the MCP memory has a word structure of ×32 bits. Row address bit RA<12> is not used even upon assembly in MCP. In this case, therefore, memory cells of 16 bits are selected in each of the semiconductor memory chips in accordance with column address CA<8:0>.

Figure 19:
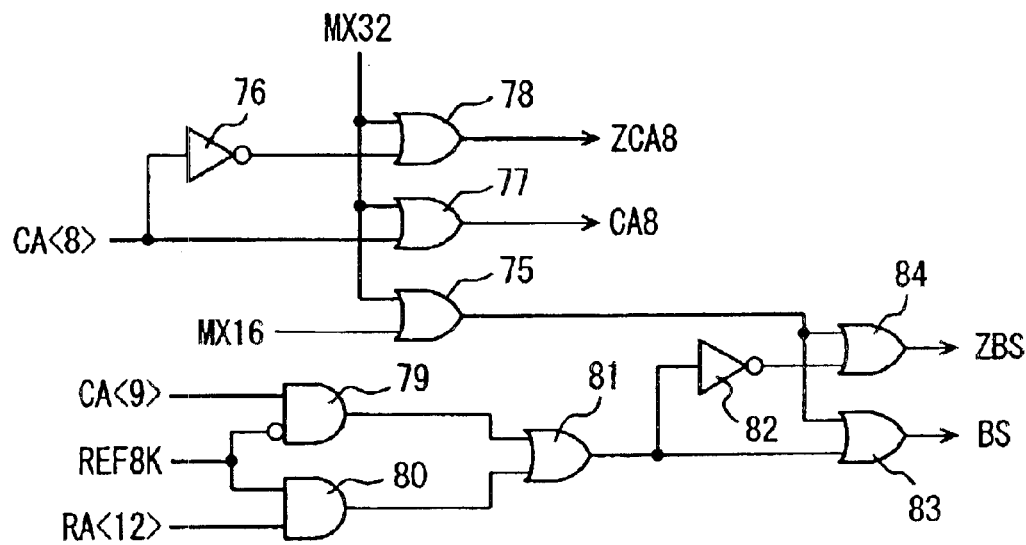
FIG. 19 is a schematic diagram showing the configuration of a data line select signal generation section in the second embodiment according to the present invention.

FIG. 19 shows an example of the configuration of a data line decoder in the second embodiment according to the present invention. In FIG. 19, the data line decoder includes an OR circuit 75 that receives a 16-bit structure indication signal MX16 for indicating a word structure of ×16 bits and a 32-bit structure indicating signal MX32 for indicating a word structure of ×32 bits, an inverter 76 that inverts column address signal bit CA<8>, an OR circuit 77 that receives column address bit CA<8> and 32-bit structure indication signal MX32 and generates column address signal CA8, an OR circuit 78 that receives the output signal of inverter 76 and 32-bit structure indication signal MX32 and generates column address signal ZCA8, a gate circuit 79 that receives column address bit CA<9> and refresh cycle designation signal REF8K, a gate circuit 80 that receives refresh cycle designation signal REF8K and row address bit RA<12>, an OR circuit 81 that receives the output signals of gate circuits 79 and 80, an inverter 82 which inverts the output signal of OR circuit 81, an OR circuit 83 that receives the output signal of OR circuit 75 and the output signals of OR circuit 81 and generates block select signal BS, and an OR circuit 84 that receives the output signal of inverter 82 and the output signal of OR circuit 75 and generates block select signal ZBS.

According to block select signals BS and ZBS, upper block UB and lower block LB are designated.

Gate circuit 79 operates as a buffer circuit when refresh cycle designation signal REF8K is at L level to select the 4K refresh cycle, and outputs an L-level signal when refresh cycle designation signal REF8K is at H level.

Gate circuit 80 operates as a buffer circuit when refresh cycle designation signal REF8K is at H level, and outputs an L-level signal when refresh cycle designation signal REF8K is at L level. Therefore, when refresh cycle designation signal REF8K is set at H level to designate the 8K refresh cycle, row address bit RA<12> instead of column address bit CA<9> is used. In the 4K refresh cycle, column address signal bit CA<9> is correlated with block select signals BS and ZBS.

In the configuration of the data line decoder shown in FIG. 19, if the word structure is ×8 bits, 32-bit structure indication signal MX32 and 16 bit structure indication signal MX16 are both at L level, OR circuits 77 and 78 operate as buffer circuits and OR circuits 83 and 84 also operate as buffer circuits. When refresh cycle designation signal REF8K is at L level, the 4K refresh cycle is designated. In this state, column address signals CA8 and ZCA8 and block select signals BS and ZBS are generated in accordance with column address bits CA<9:8>.

In the case of the word structure of ×16 bits, 16-bit structure instruction signal MX16 is set at H level and 32-bit structure indication signal MX32 is set at L level. Then, the output signal of OR circuit 75 is at H level, block select signals BS and ZBS are both at H level and both upper block UB and lower block LB are designated. OR circuits 77 and 78 each operate as a buffer circuit and column address signals CA8 and ZCA8 are generated in accordance with column address bit CA<8>. In this case, therefore, even-numbered column blocks or odd-numbered column blocks are selected from column blocks CMB0 to CMB3 shown in FIG. 18 in accordance with column address bit CA<8>, upper and lower global data lines GIOU and GIOL are both selected in a selected column block and a total of 16 global data lines are selected.

In the case of the word structure of ×32 bits, 32-bit structure indication signal MX32 is set at H level. In this case, the output signals of OR circuits 78, 77, 83 and 84 are all set at H level and column address signals CA8 and ZCA8 and block select signals BS and ZBS are all at H level. Therefore, all of global data lines GIOU<15:0> and GIOL<15:0> are selected.

It is noted that in the case of the word structure of ×16 bits, both of block select signals BS and ZBS are set at H level, independently of whether the 4K refresh cycle or the 8K refresh cycle is set. According to the specification, for a 256 M bit semiconductor memory device with a 32 bit word structure, the 4K refresh cycle is normally set as a default. In this case, therefore, row selection is performed in accordance with row address RA<11:0> and column selection is performed in accordance with address RA<12> and CA<8:0>. This is because row address RA<12:0> and column address <8:0> are normally applied to a 256 M bit semiconductor memory device with ×32 bit word structure. It is thus possible to implement a semiconductor memory device accurately having a designated refresh cycle and a word structure using two semiconductor memory chips of the same configuration for assembly into a multi chip package.

In the 4K refresh cycle, in one semiconductor memory chip, refresh address QAD<12> is degenerated and the four banks are simultaneously refreshed. Therefore, row address bit RA<12> is not particularly used in the semiconductor memory chip of 128 M bits. In assembly into a multi chip package of 256 M bits, even if the 8K refresh cycle is designated and row address bit RA<12> is applied, it is possible to accurately execute a refreshing operation and data line selection.

Even when the refresh cycle is changed, the data line decoder simply exchange column address signal bit CA<9> and row address signal bit RA<12> and it is unnecessary to change the circuit configuration of the decoder, thereby facilitating changing of the refresh cycle.

Figure 20:
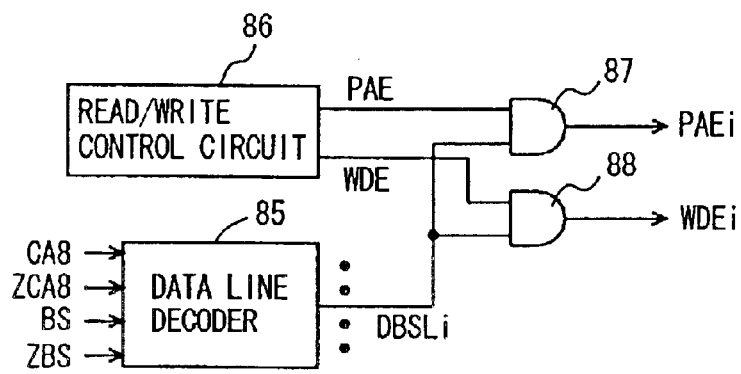
FIG. 20 is a schematic diagram showing the configuration of a write/read control section in the second embodiment according to the present invention.

FIG. 20 is a schematic diagram showing an example of a section for generating control signals applied to internal read circuit 70 shown in FIG. 16. In FIG. 20, the internal read/write control section includes a data line decoder 85 that decodes block select signals BS and ZBS and generates a data line select signal DBSLi, a read/write control circuit 86 that generates a preamplifier activation signal PAE and a write driver enable signal WDE in accordance with an operation mode instruction signal from a not shown command decoder, an AND gate 87 that generates a local preamplifier activation signal PAEi in accordance with data line select signal DBSLi and preamplifier activation signal PAE from data line decoder 85, and an AND gate 88 that receives data line select signal DBSi and write driver enable signal WDE from data line decoder 85 and generates a local write driver enable signal WDEi.

Data line decoder 85 is simply formed of a decoding circuit, and generates data line select signal DBSLi for each intersection region between upper and lower blocks UB and LB and column blocks CMB0 to CMB3. Therefore, data line select signal DBSLi is generated for a set of four global data lines.

Figure 21:
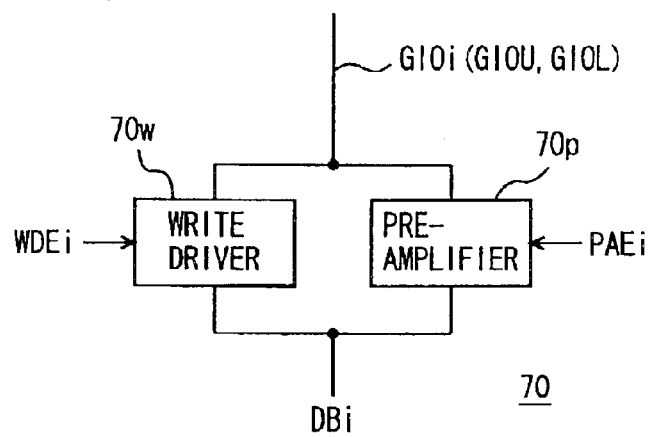
FIG. 21 is a schematic diagram showing the configuration of an internal write/read section in the second embodiment according to the present invention.

FIG. 21 is a schematic diagram showing the configuration of internal read write circuit 70 for one global data line GIOi. Global data line GIOi corresponds to upper global data line GIOU or lower global data line GIOL. A preamplifier 70p and a write driver 70w are provided corresponding to global data line GIOi. Preamplifier 70p and write driver 70w are coupled to an internal data bus line DBi.

Preamplifier 70p is activated in response to the activation of local preamplifier activation signal PAEi to amplify and transmit internal read data on global data line GIOi onto data bus line DBi.

Write driver 70w is activated in response to the activation of local write driver enable signal WDEi, to amplify data on internal data bus line DBi and drive global data line GIOi. Global data line GIOi and internal data bus line DBi are each formed of complementary signal lines, however, in FIG. 21, they are shown as single-end signal lines, in order to simplify the drawing.

Internal read/write circuit 70 has a read operation/write operation activated in units of four preamplifiers or four write drivers in accordance with local preamplifier activation signal PAEi or local write driver enable signal WDEi, to transfer internal data.

As will be described later in detail, internal data bus line DBi may be selected in accordance with column address signals CA8 and ZCA8. A configuration for changing the correspondence between internal data bus lines and data output terminals in accordance with a word structure will be also described later in detail.

As described above, according to the second embodiment of the present invention, the row address bit and the column address bit are exchanged in data line decoding in accordance with the refresh cycle. It is, therefore, possible to easily change the refresh cycle without changing the circuit configuration of the data line decoder. It is thus possible to assemble semiconductor memory chips with the same configuration in MCP to implement a semiconductor memory device having a large storage capacity.

In the above description, the semiconductor memory device having a storage capacity of 256 M bits is implemented using two 128 M bit semiconductor memory chips. These storage capacities are given only as an example. In addition, the specific refresh cycles are given only as an example. Therefore, different refresh cycles and a semiconductor memory device of different storage capacity may be employed.

Third Embodiment

Figure 22:
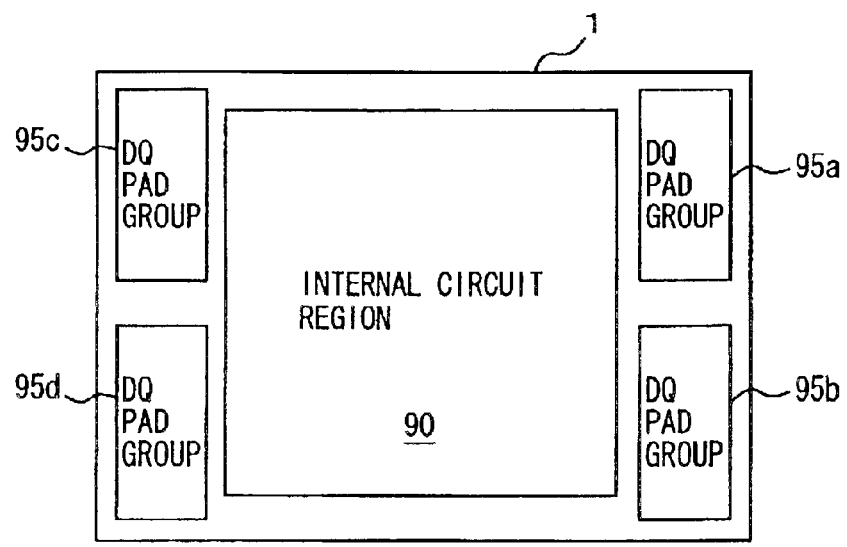
FIG. 22 is a schematic diagram showing the arrangement of pads of a semiconductor circuit device in the third embodiment according to the present invention.

FIG. 22 is a schematic diagram showing the arrangement of pads of a semiconductor memory chip in the third embodiment according to the present invention. In FIG. 22, semiconductor memory chip 1 includes an internal circuit region 90 in which banks and peripheral control circuits are arranged, and DQ pad groups 95a to 95d which are arranged in a distributed manner on an outer periphery of internal circuit region 90.

DQ pad groups 95a and 95b are arranged along one of opposite two sides of semiconductor memory chip 1 and DQ pad groups 95c and 95d are arranged along the other side thereof. In each of DQ pad groups 95a to 95d, eight DQ pads are arranged, so that a word structure of ×32 bits at the maximum can be implemented. By arranging DQ pad groups 95a to 95d in outer peripheral regions corresponding to the four divided regions of semiconductor memory chip 1, it is possible to apply to both a single chip package and a multi chip package with the same pad arrangement.

Figure 23:
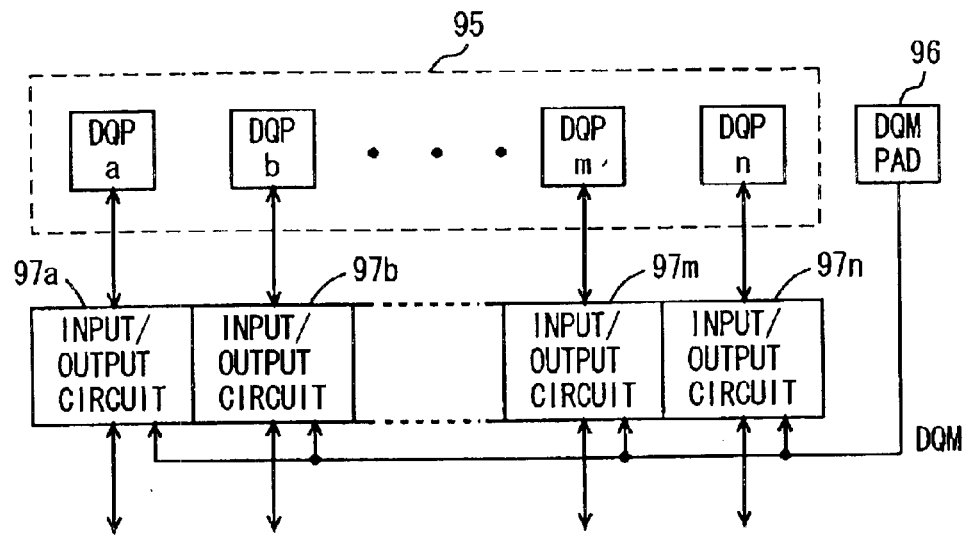
FIG. 23 is a schematic diagram showing the arrangement of a DQ pad group and DQ pads shown in FIG. 22.

FIG. 23 is a schematic diagram showing the configuration of a section related to one DQ pad group. In FIG. 23, DQ pad group 95 includes DQ pads DQa to DQn. Input/output circuits 97a to 97n are arranged corresponding to DQ pads DQPa to DQPn, respectively. In accordance In the word structure of semiconductor memory chip 1, DQ pads DQP included in DQ pad group 95 and input/output circuits 97a to 97n are selectively connected to change the correspondence between input/output circuits 97a to 97n and the preamplifiers/write drivers of internal read/write circuit 70. However, even if the word structure is different, a candidate of the preamplifier/write drivers to which DQ pad DQP included in DQ pad group 95 can be connected is predetermined. Although the correspondence between preamplifiers/write drivers and DQ pad DQP differ according to the word structure, preamplifier/write drivers are selectively coupled to DQ pads DQP included in corresponding DQ pad group 95.

A DQM pad 96, which receives a mask signal DQM for setting a mask in data input/output, is arranged corresponding to DQ pad group 95. In accordance with mask signal DQM from DQM pad 96, the data writing/reading of input/output circuits 97a to 97n are masked. Accordingly, even if the word structure is made different, it is possible to surely mask write/read data by applying a masking on input/output circuits 97a to 97n arranged corresponding to DQM pad 96 in common. Mask signal DQM may be applied to corresponding write drivers. As will be described later in detail, when the correspondence between internal data buses and data pad groups is uniquely set, it is possible to uniquely set a write driver group arranged corresponding to data pad group 95. Therefore, the data writing of a corresponding write driver can be masked in accordance with mask signal DQM from mask pad 96.

Figure 24:
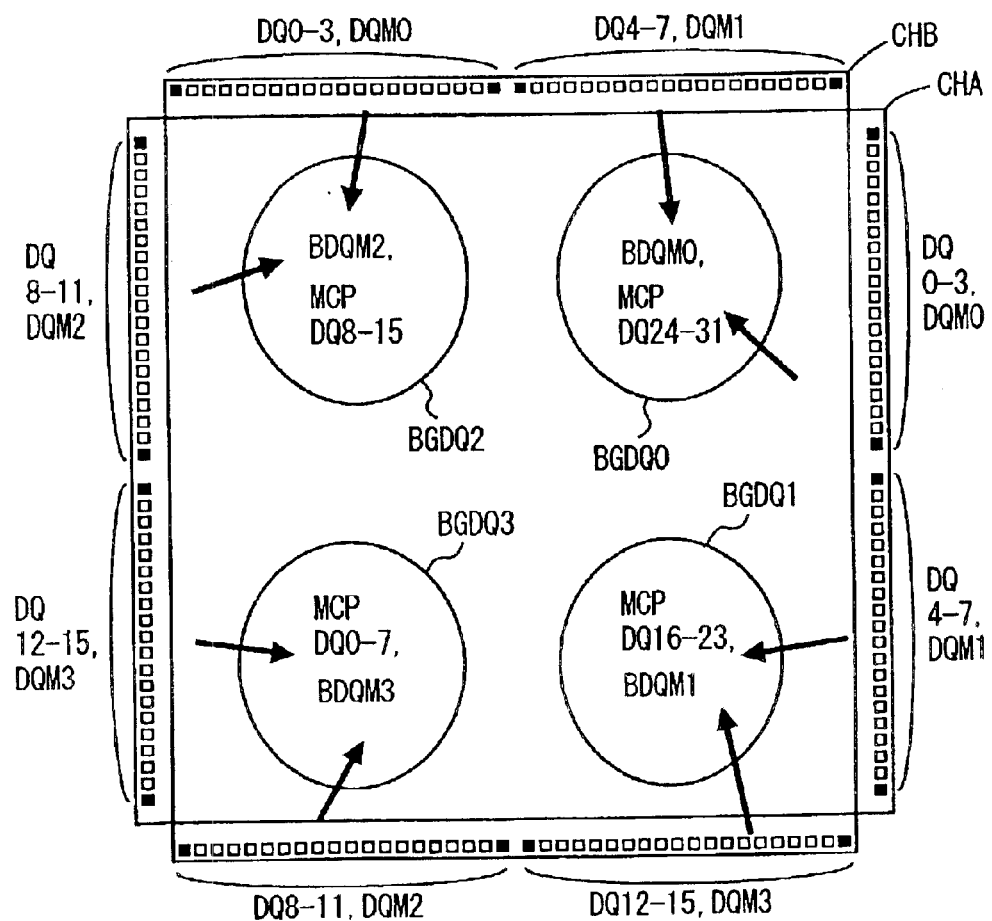
FIG. 24 shows an example of the arrangement of chips when the semiconductor circuit device is assembled in a multi chip package in the third embodiment according to the present invention.

FIG. 24 is a schematic diagram showing the layout of a semiconductor circuit device in the third embodiment according to the present invention when assembled in a multi chip package. In FIG. 24, in the multi chip package, data terminal groups BGDQ0 to BGDQ3 each including ball grids (bump balls) are arranged being distributed in the four divided regions, respectively, on the rear surface of the package.

Semiconductor memory chip CHB is stacked on semiconductor memory chip CHA with a rotational angle of 90° with respect to the chip CHA.

In semiconductor memory chip CHA, DQ (data) pads DQ0 to DQ3, DQ mask pad DQM0, and DQ pads DQ4 to DQ7, DQ mask pad DQM1 are arranged along one side thereof and data pads DQ8 to DQ11, DQ mask pad DQM2, and DQ pads DQ12 to DQ15, DQ mask pad DQM3 are arranged along an opposite side thereof.

Likewise, in semiconductor memory chip CHB, DQ pads DQ0 to DQ3, DQ mask pad DQM0, and DQ pads DQ4 to DQ7, DQ mask pad DQM1 are arranged along one side thereof and DQ pads DQ8 to DQ11, DQ mask pad DQM2, and DQ pads DQ12 to DQ15, DQ mask pad DQM3 are arranged along the opposite side thereof. Semiconductor memory chip CHB is stacked on semiconductor memory chip CHA with a rotational angle of 90° with respect to semiconductor memory chip CHA. Therefore, when a semiconductor memory device is assembled in MCP, the DQ pads and DQ mask pads are arranged along the four sides of this rectangular region in a plan view. DQ pads DQ0 to DQ3 of semiconductor memory chip CHA and DQ pads DQ4 to DQ7 of semiconductor memory chip CHB are connected to data terminal group (ball grid region) BGDQ0, and connected to data terminals MCPDQ24 to MCPDQ31 set upon assembly in the multi chip package (MCP). Further, DQ mask pad DQM0 of semiconductor memory chip CHA and DQ mask pad DQM1 of semiconductor memory chip CHB are connected to a DQ mask terminal BDQM0 in data terminal group (ball grid region) BGDQ0.

DQ pads DQ4 to DQ7 of semiconductor memory chip CHA and DQ pads DQ12 to DQ15 of semiconductor memory chip CHB are connected to MCP data terminals MCPDQ16 to MCPDQ23 in data terminal group (ball grid region) BGDQ1, and DQ mask pad DQM1 of semiconductor memory chip CHA and DQ mask pad DQM3 of semiconductor memory chip CHB are connected to a DQ mask terminal BDQM1 in data terminal group (ball grid region) BGDQ1.

DQ pads DQ12 to DQ15 of semiconductor memory chip CHA and DQ pads DQ8 to DQ11 of semiconductor memory chip CHB are connected to MCP data terminals MCPDQ0 to MCPDQ7 in data terminal group (ball grid region) BGDQ3. DQ mask pad DQM3 of semiconductor memory chip CHA and DQ mask pad DQM2 of semiconductor memory chip CHB are connected to a DQ mask terminal BDQM3 in data terminal group (ball grid region) BGDQ3.

Therefore, DQ pads DQ12 to DQ15 of semiconductor memory chip CHA and DQ pads DQ8 to DQ11 of semiconductor memory chip CHB are connected MCP data terminals MCPDQ0 to MCPDQ7, used when the memory is assembled in MCP, in data terminal group (ball grid region) BDQM3.

DQ pads DQ8 to DQ11 of semiconductor memory chip CHA and DQ pads DQ0 to DQ3 of semiconductor memory chip CHB are connected to MCP data terminals MCPDQ8 to MCPDQ15 in data terminal group (ball grid region) BGDQ2.

DQ mask pad DQM2 of semiconductor memory chip CHA and DQ mask pad DQM0 of semiconductor memory chip CHB are connected to DQ mask terminal BDQM2 in data terminal group (ball grid region) BGDQ2.

As shown in FIG. 24, each of ball grid regions BGDQ0 to BGDQ3 includes data terminals of 8 bits. Ball grid regions BGDQ0 to BGDQ3 control the masking of the data of the corresponding data terminals in accordance with DQ mask signals applied to DQ mask terminals BDQM0 to BDQM3, respectively. Thus, even if semiconductor memory chips CHA and CHB are assembled in the multi chip package (MCP), it is possible to prevent wiring for connecting the data pads of semiconductor memory chips CHA and CHB to the MCP data terminals in the ball grid array of MCP from being complicated. In addition, it is possible to easily implement a semiconductor circuit device having a doubled storage capacity (and having a doubled word structure) using semiconductor memory chips CHA and CHB the same in configuration.

The DQ mask pads are arranged corresponding to the data pad groups in the four divided regions to mask the data inputting/outputting of the corresponding divided regions, respectively. Accordingly, when semiconductor memory chips CHA and CHB each having a word structure of ×8 bits are assembled in the multi chip package (MCP), it is possible to easily implement an MCP assembled semiconductor circuit device having a word structure of ×16 bits using the two semiconductor memory chips each having a word structure of ×8 bits without complicating the wiring to the ball grid regions.

Figure 25:
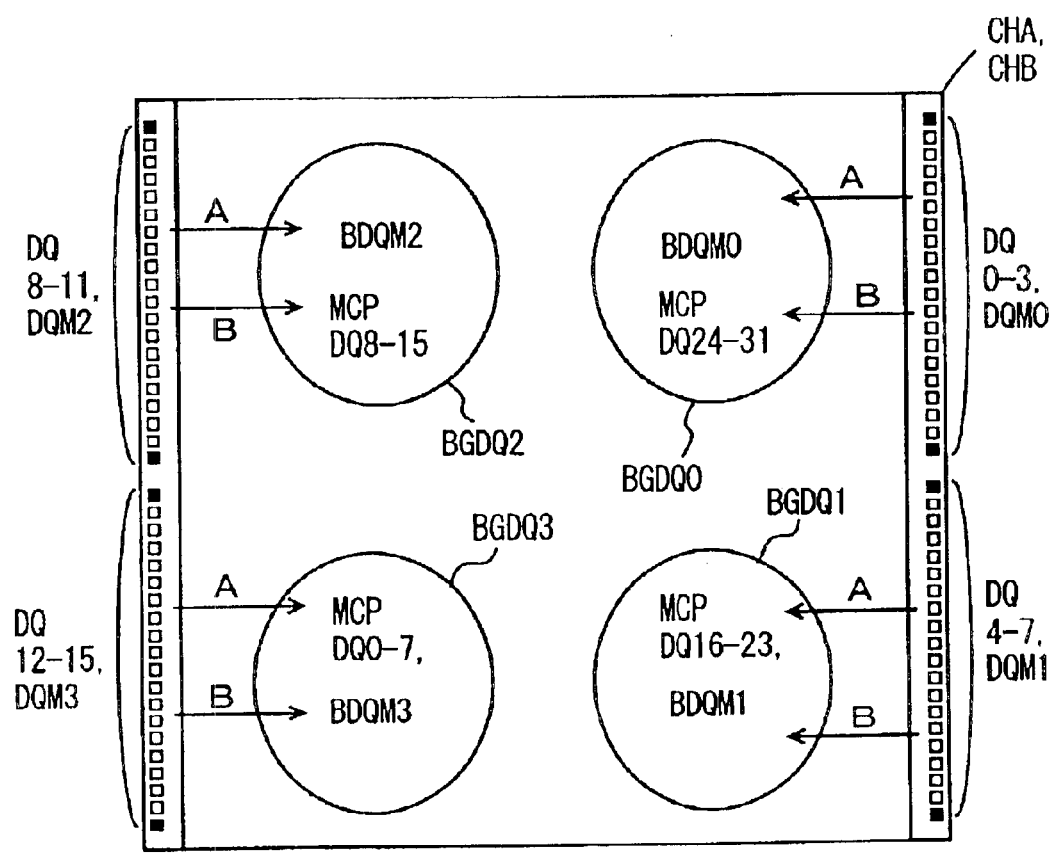
FIG. 25 is a schematic diagram showing another example of the arrangement of chips when the semiconductor circuit device is assembled in a multi chip package in the third embodiment according to the present invention.

It is also possible to implement an MCP assembled semiconductor circuit device having a word structure of ×64 bits using semiconductor memory chips CHA and CHB each having a word structure of ×32 bits. Modification of Assembly in Multi Chip Package FIG. 25 is a schematic diagram showing the layout of the semiconductor memory chips in a modification of the third embodiment according to the present invention when assembled in a multi chip package. In the arrangement shown in FIG. 25, semiconductor memory chips CHA and CHB are stacked with a rotational angle of 0° with respect to each other. Therefore, data pads DQ0 to DQ3, DQ4 to DQ7, DQ8 to DQ11 and DQ12 to DQ14 and DQ mask pads DQM0, DQM1, DQM2 and DQM3 of semiconductor memory chip CHA and CHB are arranged being superimposed in a plan view with a rotational angle of 0°.

DQ pads DQ0 to DQ3 of semiconductor memory chips CHA and CHB are connected to data pads DQ20 to DQ31 in ball grid region BGDQ0 and DQ mask pads DQM0 thereof are connected to DQ mask terminal BDQM0 in common. DQ pads DQ4 to DQ7 of semiconductor memory chips CHA and CHB are connected to MCP data terminals MCPDQ16 to MCPDQ23 in ball grid region BGDQ1 and DQ mask pads DQM1 thereof are connected to DQ mask terminal BDQM1 in common.

DQ pads DQ8 to DQ11 of semiconductor memory chips CHA and CHB are connected to MCP data terminals MCPDQ8 to MCPDQ15 in ball grid region BGDQ2 and DQ mask pads DQM2 thereof are connected to DQ mask terminal BDQM2 in common.

DQ pads DQ12 to DQ15 of semiconductor memory chips CHA and CHB are connected to MCP data terminals MCPDQ0 to MCPDQ7 in ball grid region BGDQ3 and DQ mask pads DQM3 thereof are connected to DQ mask terminal BDQM3 in common.

As shown in FIG. 25, therefore, even if semiconductor memory chips CHA and CHB are assembled in the multi chip package and stacked with a rotational angle of 0° relative to each other, it is possible to apply masking on corresponding data input pads in accordance with ball grid regions BGDQ0 to BGDQ3 by arranging DQ mask pads corresponding to the four divided regions, respectively.

Furthermore, it is possible to easily implement a multi chip package assembled semiconductor circuit device doubled in word structure and storage capacity by stacking the semiconductor memory chips the same in configuration without complicating the wiring layout.

Moreover, in the semiconductor circuit device assembled in the multi chip package shown in FIGS. 24 and 25, a data mask is applied externally for each byte (in a unit of 8 bits).

When semiconductor memory chips CHA and CHB the same in configuration are stacked, bump balls may be connected to the pads of the lower semiconductor memory chip and connected to ball grids of the multi chip package through an interposer. In this case, one of semiconductor memory chips CHA and CHB is arranged face-up and the other semiconductor memory chip is arranged face-down.

Alternatively, gaps may be formed between the pads of the two stacked semiconductor memory chips using an upper chip supporting member and bonding wires may be formed utilizing the gaps.

Further, the mounting with 0° rotation may be implemented utilizing another wiring method and interconnecting method.

As described above, according to the third embodiment of the present invention, the data pads are arranged in the outer peripheral regions in correspondence to the four divided regions of the chip. Therefore, it is possible to implement a semiconductor memory chip capable of being assembled in both a single chip package and a multi chip package (ball grid package).

Further, by allocating the DQ mask signals to the DQ pad groups in correspondence to the respective four divided regions, the data input/output can be masked for each divided region and the wiring layout between pads and terminals can be made simplified even if the semiconductor memory chips are assembled in the multi chip package.

Fourth Embodiment

Figure 26:
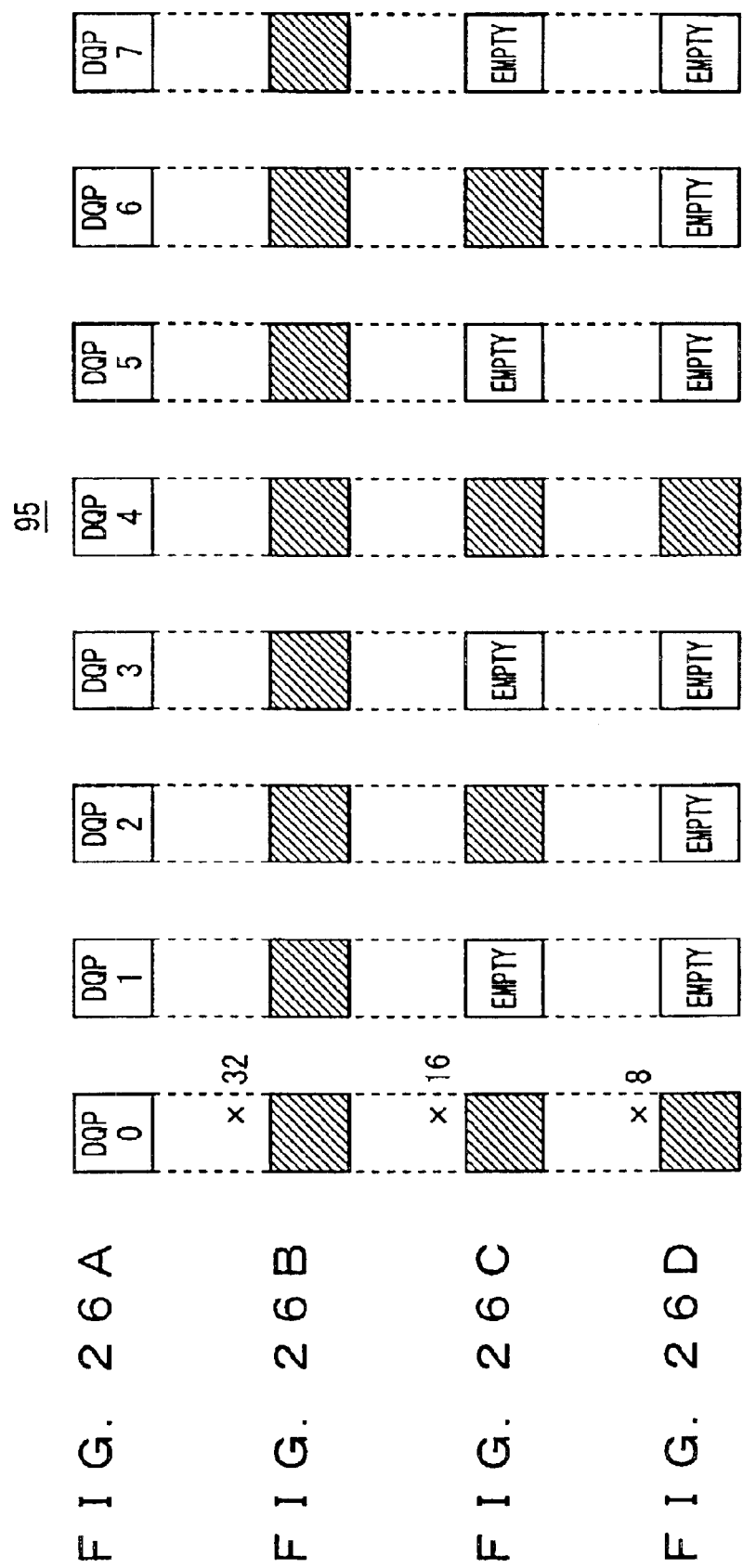
FIGS. 26A–26D are schematic diagrams showing the arrangement of data pads used in a semiconductor circuit device in the fourth embodiment according to the present invention.

FIG. 26A is a schematic diagram showing the arrangement of data pads (DQ pads) of one of DQ pad groups 95a to 95d shown in FIG. 22. Since DQ pad groups 95a to 95d are the same in configuration, FIG. 26A representatively shows one DQ pad group 95.

In FIG. 26A, DQ pad group 95 includes eight data pads (DQ pads) DQP0 to DQ7. As shown in FIG. 26B, in a word structure of ×32 bits, all of data pads DQP0 to DQP7 in data pad group 95 are used.

In a word structure of ×16 bits, four data pads are used in data pad group 95. In FIG. 26C, data pads to be used are selected such that non-used data pad indicated by the term "empty" is arranged between the used data pads indicated by oblique lines. Specifically, in FIG. 26C, data pads DQP0, DQP2, DQP4 and DQP6 are used while data pads DQP1, DQP3, DQP5 and DQP7 are unused. By arranging each empty pad, i.e., unused pad between the used pads, it is possible to increase the distance between the used pads, to reduce the capacitance coupling between output signal lines during data output, resulting in decreased output noise.

In a word structure of ×8 bits, as shown in FIG. 26D, two data pads in DQ pad group 95 are used. Specifically, in FIG. 26D, data pads DQP0 and DQP4 are used while remaining data pads DQP1 to DQP3 and DQP5 to DQP7 are unused.

As shown in FIGS. 26C and 26D, when the word configuration is reduced in number of data bits from the maximum word configuration and an empty or free pad is present, pads to be used are selected such that a unused data pad is present between used data pads and that the distances between any used pads are equal for all the used data pads. It is thus possible to decrease the capacitance coupling between signal lines and accordingly to decrease noise (output noise, in particular).

FIG. 27 is a schematic diagram showing the pin arrangement of the data pad groups in the fourth embodiment according to the present invention. This semiconductor memory device is set to one of word structures of ×32 bits, ×16 bits and ×8 bits.

FIG. 27 schematically shows the allocation of data bits of the data pads for the respective divided regions in each word structure.

In each of data pad groups 95a to 95d, data pads of 8 bits are used and a data input/output circuit of a total of 32 bits is implemented in ×32 structure. In the word structure of ×32 bits, data bits DQ<7:0> are allocated to data pad group 95a, data bits DQ<15:8> are allocated to data pad group 95b, data bits DQ<23:16> are allocated to data pad group 95c, and data bits DQ<31:24> are allocated to data pad group 95d.

In the word structure of ×16 bits, four data pads are used in each data pad group. Data bits DQ<3:0> are allocated to data pad group 95a, data bits DQ<7:4> are allocated to data pad group 95b, data bits DQ<11:8> are allocated to data pad group 95c, and data bits DQ<15:12> are allocated to data pad group 95d. Therefore, data pads of 4 bits are used in each data pad group.

In the word structure of ×8 bits, data pads of 2 bits are used in each of data pad groups 95a to 95d. Data bits DQ<1:0> are allocated to data pad group 95a, data bits DQ<3:2> are allocated to data pad group 95b, data bits DQ<5:4> are allocated to data pad group 95c, and data bits DQ<7:6> are allocated to data pad group 95d.

Even if the used data pads are the same in each word structure, data bits to be allocated to the same pads differ for different word structures. In FIG. 27, the data bits allocated to the respective data pads in each word structure are shown. In FIG. 27, therefore, the positions of the data pads to be used are also indicated.

Therefore, in each of the word structures of ×16 bits and ×8 bits, in DQ groups 95a to 95d, an unused or free data pad is arranged between the used data pads, whereby it is possible to widen the distance between any used data pads for decreasing noise.

Figure 28:
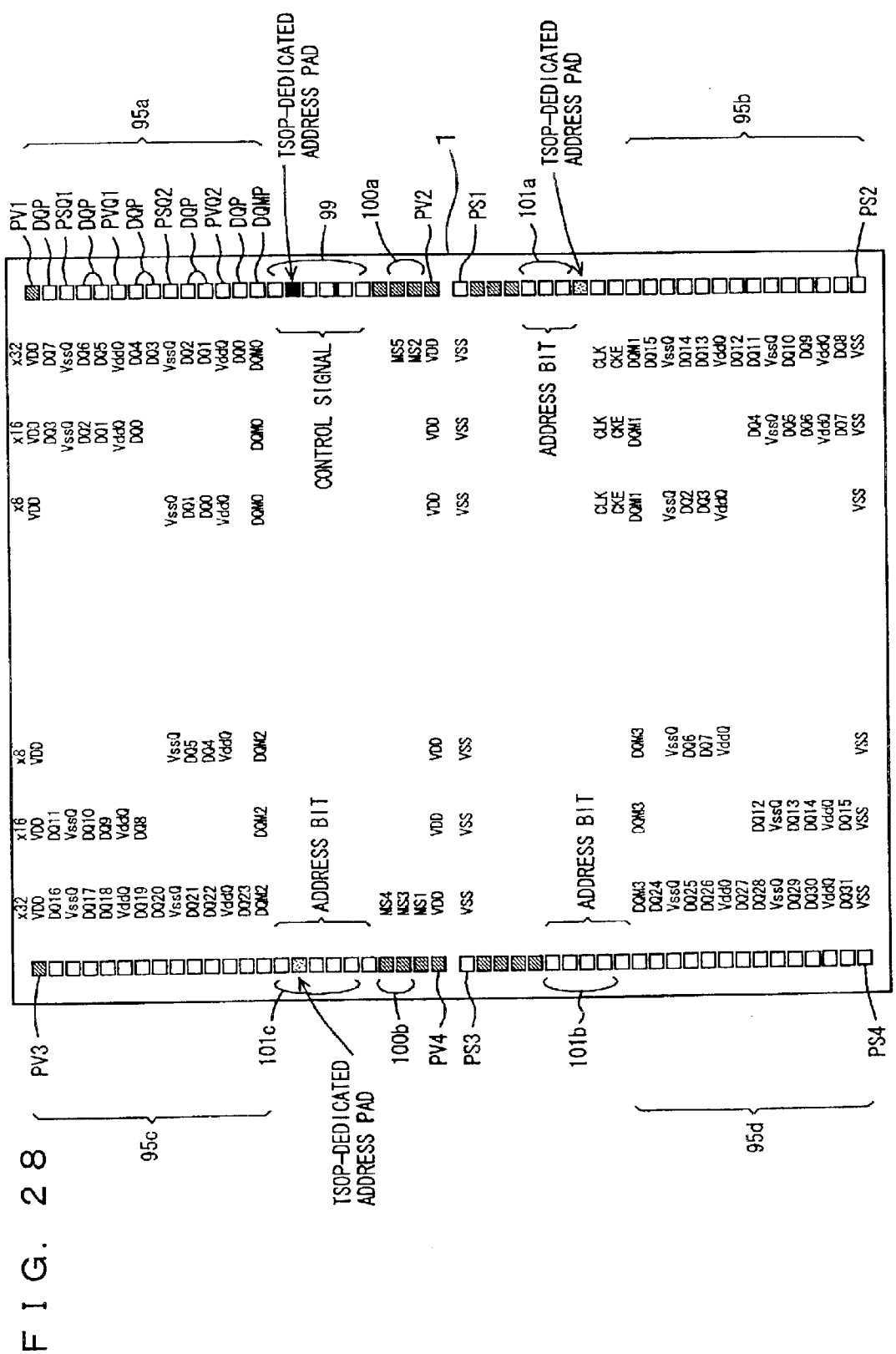
FIG. 28 concretely shows the arrangement of pads of the semiconductor circuit device in the fourth embodiment according to the present invention.

FIG. 28 shows the arrangement of the pads in the fourth embodiment according to the present invention more specifically. In FIG. 28, in semiconductor memory chip 1, data pad groups 95a to 95d are arranged corresponding to the four divided regions, respectively. A power supply pad PV1 for receiving a power supply voltage VDD and a ground pad PS2 for receiving a ground voltage VSS are arranged on opposite ends of one side of semiconductor memory chip 1, respectively. On this one side, a power supply pad PV2 and a ground pad PS1 are arranged at a central region.

A control signal pad group 99 for receiving control signals and a mode select pad group 100a for designating specific operation modes according to bonding option are arranged between data pad group 95a and power supply pad PV2. In the bonding option, the potential of a specific pad is fixed depending on connection and no connection of a bonding wire to the specific pad in a bonding process, whereby operation modes, such as a refresh cycle and a word structure, are set.

An address pad group 101a for receiving address bits and pads for receiving a clock signal CLK and a clock enable signal CKE are arranged between ground pad PS1 and data pad group 95b. Semiconductor memory chip 1 includes, as internal circuitry, a synchronous semiconductor memory device which operates synchronously with clock signal CLK. When clock enable signal CKE is active, an internal clock signal is generated in accordance with clock signal CLK and an internal operation is executed in accordance with the clock signal. If clock enable signal CKE is inactive, then the internal clock signal is not generated, an external signal is not taken in and a further internal operation is not executed.

On the other side of semiconductor memory chip 1, a power supply pad PV3 and a ground pad PS4 are arranged oppositely on both ends and a power supply pad PV4 and a ground pad PS3 are arranged in a central region. A mode select pad group 100b is arranged adjacently to power supply pad PV4. An address pad group 101c for receiving address signal bits is arranged between mode select pad group 100b and data pad group 95c. In addition, an address pad group 101b for receiving address signal bits is arranged between ground pad PS3 and data pad group 95d.

In each of data pad groups 95a to 95d, an output power supply pad for receiving an output-dedicated power supply voltage VddQ and an output ground pad for receiving an output-dedicated ground voltage VssQ are arranged between the data pads in the same manner. In FIG. 28, only the output power supply pads and the output ground pads in data pad group 95a are denoted by reference symbols PVQ1, PVQ2, and PSQ1, PSQ2, respectively, for simplification of the drawing.

In the word structure of ×32 bits, output ground pad PSQ1 for receiving output ground voltage VssQ is arranged between data pads DQP for receiving data bits DQ7 and DQ6, respectively. Output power supply pad PVQ1 for receiving output power supply voltage VddQ is arranged between data pads DQP for receiving data bits DQ5 and DQ4, respectively. Output ground pad PSQ2 is arranged between data pads DQP for receiving data bits DQ3 and DQ2, respectively. Output power supply pad PVQ2 is arranged between data pads DQP for receiving data bits DQ1 and DQ0, respectively. A DQ mask pad DQMP is arranged adjacently to data pad DQP for receiving data bit DQ0.

Output power supply voltage VddQ and output ground voltage VssQ applied to output power supply pads PVQ1, PVQ2 and output ground pads PSQ1, PSQ2, respectively, are supplied as operating power source voltages to output buffer circuits arranged corresponding to data pads DQP, respectively. The driving capability of each output buffer circuit is set sufficiently high so as to drive a heavy load at high speed. If power supply noise occurs during data output, there is a possibility that other internal circuit malfunctions. In order to prevent malfunction due to the power supply noise that occurs during data output, dedicated output power supply voltage VddQ and output ground voltage VssQ are applied to these output buffers.

In a word structure of ×16 bits, output power supply pad PVQ2 and output ground pad PSQ2 are not used. In a word structure of ×8 bits, output power supply pad PVQ1 and output ground pad PSQ1 are not used. The ground pad and the output power supply pad arranged corresponding to used output buffer circuits are utilized so as to stably supply operating power supply voltages to the corresponding output buffer circuits that operate.

In the arrangement of the data pads shown in FIG. 28, the data pads to be used are arranged adjacently. Alternatively, as already described with reference to FIG. 27, in the word structures of ×16 bits and ×8 bits, the data pads to be used may be selected such that an unused data pad is arranged between the data pads to be used.

Further, if the data pads are thinned out according to the word structure, the output power supply pads and the output ground pads may not be thinned out but used to enhance the power supply of the output buffer circuits to be used. It is possible to ensure a more stable data output operation. In this case, if an output power supply line and an output ground line arranged corresponding to each output buffer group are divided corresponding to the power supply pads in the output circuits, the divided power supply lines may be connected in accordance with word structure information. It becomes possible to achieve the enhancement of the output power source. Alternatively, the output power supply line and the output ground line may be arranged commonly to the output circuits arranged corresponding to the respective data pad regions. In this case, the number of power supply terminals/ground terminals connected to the common output power supply line/ground line differ depending on the word structure (if the power supply pads are thinned out).

As described above, according to the fourth embodiment of the present invention, the data pads are used being thinned out such that an unused data pad is arranged between any used data pads in the data pad regions depending on the word structure. Consequently, the distance between the data pads to be used can be made long and output noise can be accordingly decreased.

Fifth Embodiment

Figure 29:
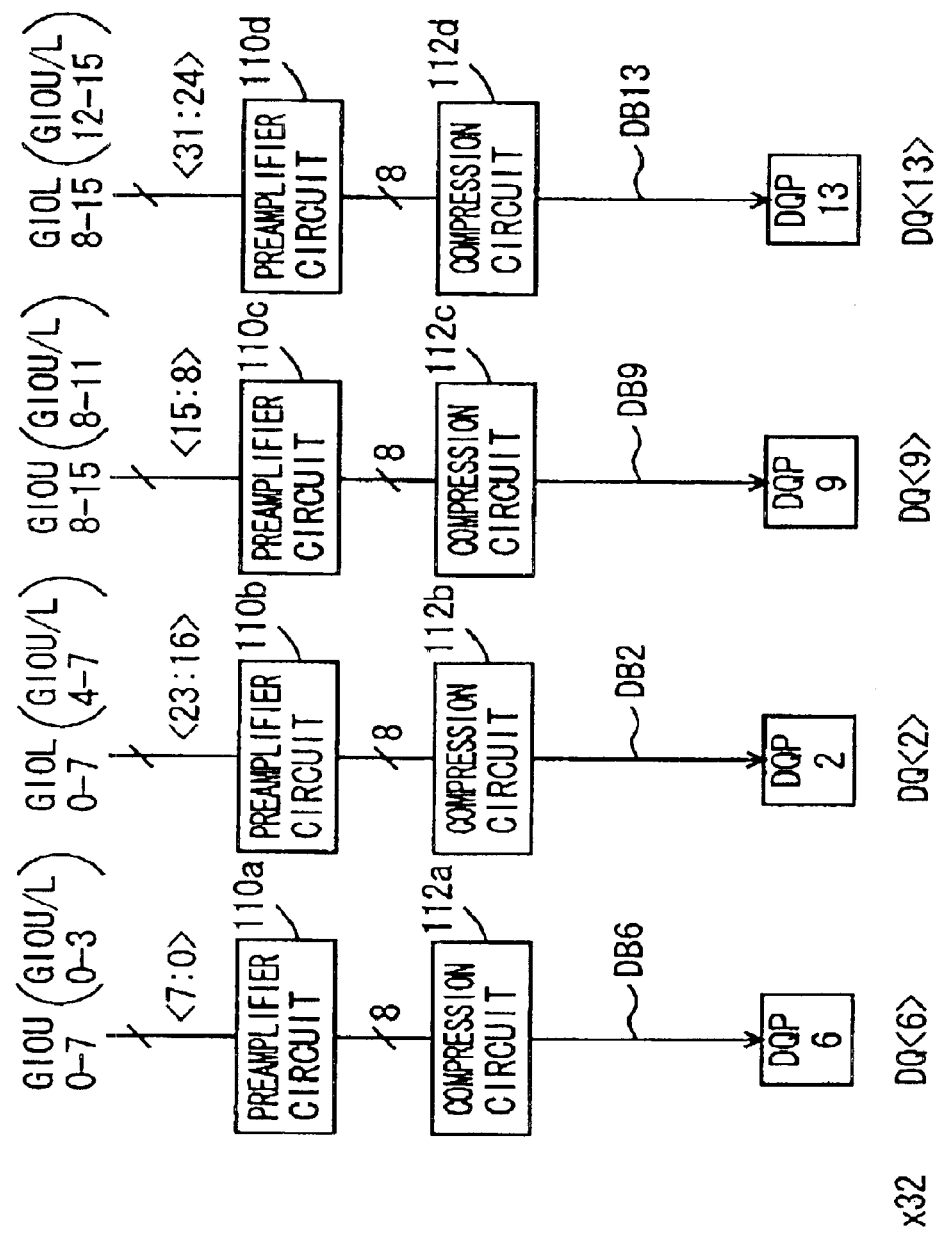
FIG. 29 is a schematic diagram showing the configuration for performing a compression test in ×32-bit structure in the semiconductor device according to the fifth embodiment of the present invention.

FIG. 29 is a schematic diagram showing the configuration for a multi-bit test in the fifth embodiment according to the present invention. FIG. 29 schematically shows the configuration of a section that outputs the compression result of the multi-bit test in a semiconductor chip of a word structure of ×32 bits. In the multi-bit test, memory cells of a plurality of bits are simultaneously tested. That is, data of the same logical level is simultaneously written to the memory cells of a plurality of bits and it is internally determined whether the logical levels of the data read from the memory cells of a plurality of bits are equal and a determination result is outputted externally. Since the memory cells of a plurality of bits can be simultaneously tested, it is possible to shorten a test time.

In FIG. 29, a preamplifier circuit 110a is provided corresponding to upper global data lines GIOU0 to GIOU7 and a preamplifier circuit 110b is provided corresponding to lower global data lines GIOL0 to GIOL7. A preamplifier circuit 110c is provided corresponding to upper global data lines GIOU8 to GIOU15 and a preamplifier circuit 110d is provided corresponding to lower global data lines GIOL8 to GIOL15. Each of preamplifier circuits 110a to 110d includes preamplifiers of 8 bits.

In a word structure of ×32 bits, in data reading, preamplifiers 110a to 110d are simultaneously activated. In the word structure of ×32 bits, preamplifier 110a generates internal data corresponding to data DQ<7:0>. In the word structure of ×32 bits, preamplifier 110b generates internal data corresponding to data DQ<23:16>. In the word structure of ×32 bits, preamplifier 110c generates internal data corresponding to data DQ<15:8>. In the word structure of ×32 bits, preamplifier 110d generates internal data corresponding to data DQ<31:20>.

To perform a multi-bit test, compression circuit 112a to 112d are provided corresponding to preamplifiers 110a to 110d, respectively. Each of compression circuits 112a to 112d detects the coincidence/non-coincidence of the logical levels of applied data of 8 bits and outputs a signal indicating a detection result. Each of compression circuits 112a to 112d includes, for example, a coincidence detection circuit or an AND circuit.

The output signal of compression circuit 112a is transmitted to external data pad DQP6 through internal data bus line DB6. The output signal of compression circuit 112b is transmitted to external data pad DQP2 through internal data bus line DB2. The output signal of compression circuit 112c is transmitted to external data pad DQP9 through internal data bus line DB9. The output signal of compression circuit 112d is transmitted to external data pad DQP13 through internal data bus line DB13.

In the word structure of ×32 bits, data bit DQ<6> is outputted to data pad DQP6, data bit DQ<2> is outputted to data pad DQP2, data bit DQ<9> is outputted to data pad DQP9, and data bit DQ<13> is outputted to data pad DQP13.

In this word structure of ×32 bits, during the multi-bit test, associated data of 8 bits is compressed into data of 1 bit and outputted to a corresponding data pad.

In the word structure of ×32 bits, therefore, compression results are outputted to data pin terminals DQ<6>, DQ<2>, DQ<9> and DQ<13> connected to data pads DQP6, DQP2, DQP9 and DQP13, respectively.

Figure 30:
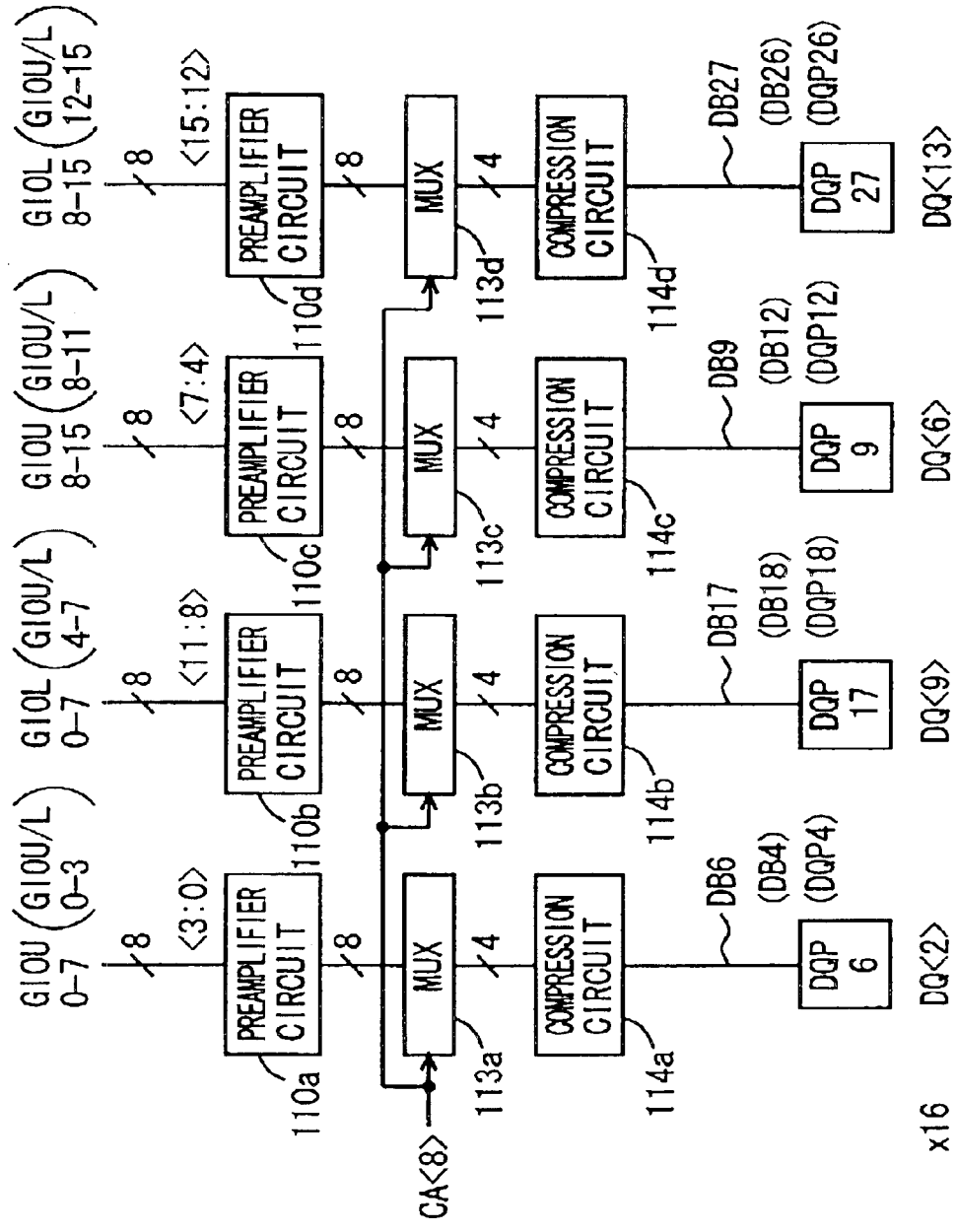
FIG. 30 is a schematic diagram showing the configuration for performing a compression test in ×16-bit structure in the semiconductor device according to the fifth embodiment of the present invention.

FIG. 30 is a schematic diagram showing the configuration of a compression data output section for a word structure of ×16 bits. In FIG. 30, multiplexers 113a to 113d each for selecting output signals of 4 bits from the output signals of 8 bits of a corresponding preamplifier circuit in accordance with column address bit CA<8>, and compression circuits 114a to 114d for compressing the 4-bit output signals of multiplexers 113a to 113d to data of 1-bit signals are provided corresponding to preamplifier circuits 110a to 110d, respectively. The output signal of compression circuit 114a is transmitted to data pad DQP6 through internal data bus line DB6. The output signal of compression circuit 114b is transmitted to data pad DQP17 through internal data bus line DB17. The output signal of compression circuit 114c is transmitted to data pad DQP9 through internal data bus line DB9. The output signal of compression circuit 114a is transmitted to data pad DQP27 through internal data bus line DB27.

In the word structure of ×16 bits, data pad DQP6 outputs data bit DQ<2>, data pad DQP17 outputs data bit DQ<9>, data pad DQP9 outputs data bit DQ<6>, and data pad DQP27 outputs data bit DQ<13>.

Instead of the configuration shown in FIG. 30, compression circuit 114a may transmit an output signal onto internal data bus line DB4, compression circuit 114b may transmit an output signal onto internal data bus line DB18, compression circuit 114c may transmit an output signal onto internal data bus line DB12, and compression circuit 114d may transmit an output signal onto internal data bus line DB26. Internal data bus lines DB4, DB18, DB12 and DB26 are coupled to data pads DQP4, DQP18, DQP12 and DQP26, respectively. Even in this case, the output data bits are the same in the word structure of ×16 bits.

Figure 31:
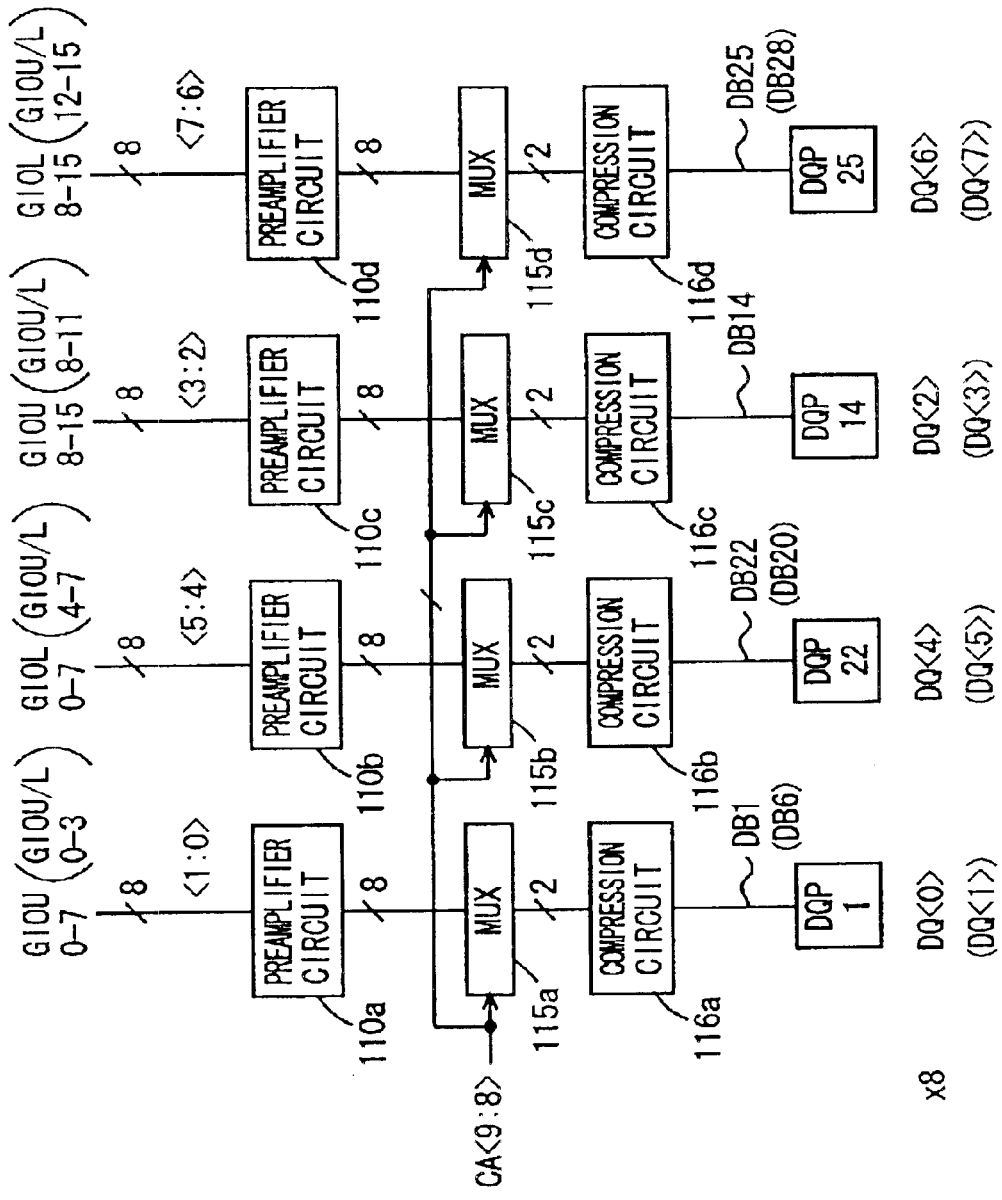
FIG. 31 is a schematic diagram showing the configuration of a section for performing a compression operation in the semiconductor circuit device of a ×8 bit configuration in the fifth embodiment according to the present invention.

FIG. 31 is a schematic diagram showing the configuration of a multi-bit test result output section for a word structure of ×8 bits. In FIG. 31, multiplexers (MUX) 115a to 115d each for selecting signals of 2 bits in accordance with column address bits CA<9:8> and compression circuits 116a to 116d for compressing the 2-bit data from multiplexers 115a to 115d are provided corresponding to preamplifier circuits 110a to 110d.

The output signal of compression circuit 116a is transmitted to data pad DQP1 through internal data bus line DB1. The output signal of compression circuit 116b is transmitted to data pad DQP22 through internal data bus line DB22. The output signal of compression circuit 115c is transmitted to data pad DQP14 through internal data bus line DB14. The output signal of compression circuit 116d is transmitted to data pad DQP25 through internal data bus line DB25. In the word structure of ×8 bits, data bit DQ<0> is outputted to data pad DQP1, data bit DQ<4> is outputted to data pad DQP22, data bit DQ<2> is outputted to data pad DQP14, and data bit DQ<6> is outputted to data pad DQP25.

In the configuration shown in FIG. 31, the output signal of compression circuit 116a may be transmitted to internal data bus line DB6, the output signal of compression circuit 116b may be transmitted to internal data bus line DB20, the output signal of compression circuit 116c may be transmitted to internal data bus line DB14, and the output signal of compression circuit 116d may be transmitted to internal data bus line DB26. If internal data bus lines DB6, DB20, DB14 and DB28 are employed, data bits DQ<1>, DQ<5>, DQ<3> and DQ<7> are outputted to the corresponding data pads, respectively.

As shown in FIGS. 29 to 31, the pads outputting compression results (internal data lines) differ among the word structures of ×32 bits, ×16 bits and ×8 bits. Therefore, the internal data bus lines driven by compression circuits 112a to 112d, 114a to 114d and 116a to 116d differ, and it is possible to distribute the loads of data bus lines and to make the loads of the respective internal data bus lines equal to each other. By making the loads of the internal data lines equal, it is possible that the respective internal data lines have the same transfer characteristics in data transfer. In a normal operation mode, therefore, it is possible to transfer internal data at high speed and to achieve high-speed access.

Figure 32:
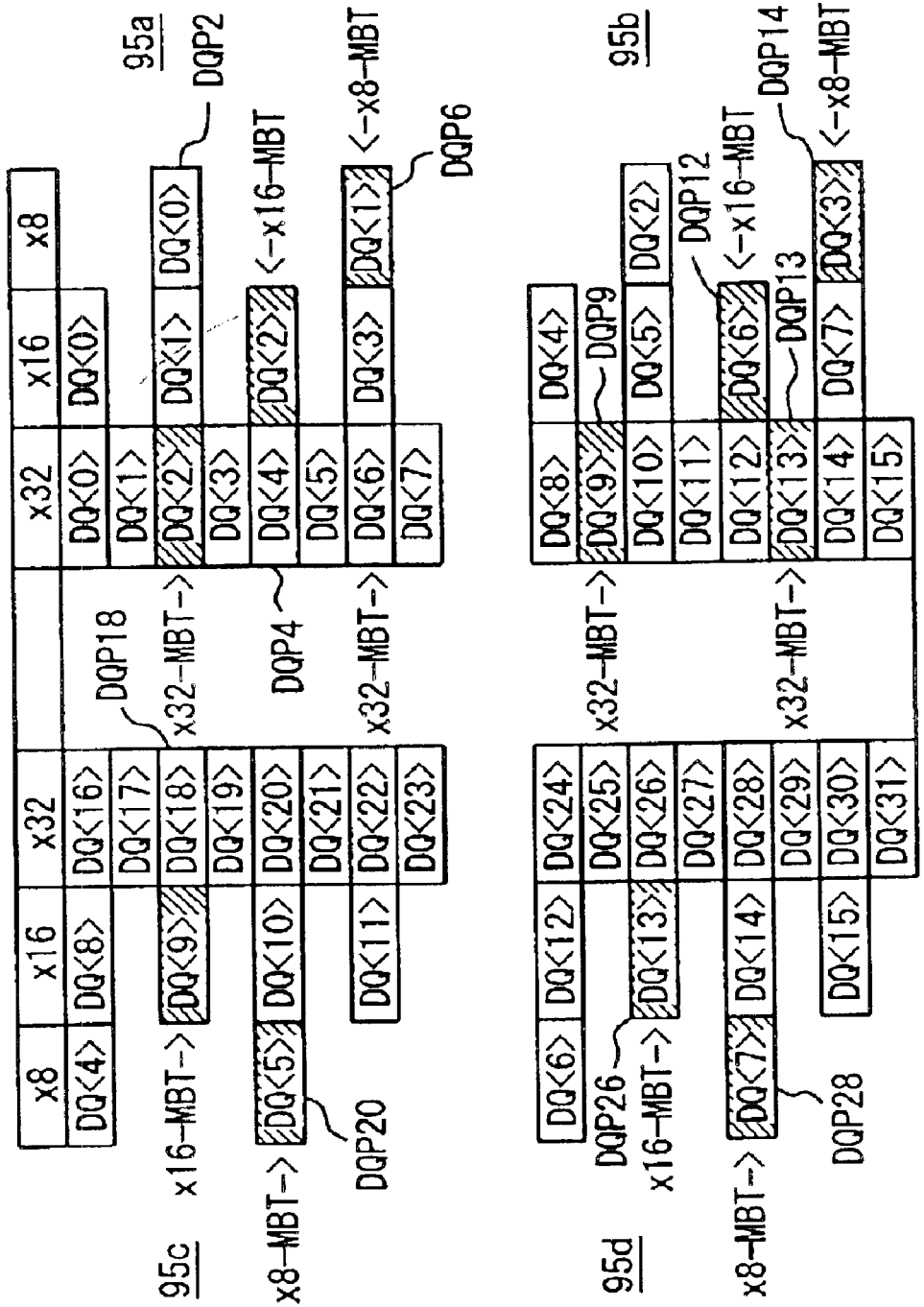
FIG. 32 shows an example of the arrangement of data pads and compression result output pads of the semiconductor circuit device in the fifth embodiment according to the present invention.

FIG. 32 shows the correspondence between the data pads and the output data bits in the respective word structures in the fifth embodiment according to the present invention. In FIG. 32, the relationship between the data pads in the data pad regions and the data bits in each word structure is shown.

In a word structure of ×32 bits, all the data pads are used and data DQ<31:0> of 32 bits are outputted. In a word structure of ×16 bits, alternate data pads are used in each of data pad groups 95a to 95d and data bits DQ<15:0> are outputted. In a word structure of ×8 bits, two data pads are used in each of data pad groups 95a to 95d and data bits DQ<7:0> are outputted.

While the data pads to be used are the same, allocated data bits differ according to the word structure. The connection between the internal data buses and the write/read circuits (preamplifiers/write drivers) and connection between the internal data buses and the data pads are determined according to the word structure in the word structure of ×32 bits, as indicated by reference symbol ×32-MBT, in each of data pad groups 95a and 95b, the compression results are outputted to the pads for inputting and outputting data bits DQ<2>, DQ<6>, DQ<9> and DQ<13>, respectively.

In the word structure of ×16 bits (indicated by reference symbol ×16 MBT), the compression results are outputted to data pads DQP4, DQP12, DQP18 and DQP26, respectively. In the word structure of ×16 bits, therefore, compression result data is outputted to the data pads corresponding to data bits DQ<2>, DQ<6>, DQ<9> and DQ<13>under the word structure of ×16 bits.

In the word structure of ×8 bits, the compression results are outputted to data pads DQP2, DQP14, DQP20 and DQP28, respectively. In the word structure of ×8 bits, data bits DQ<1>, DQ<3>, DQ<5> and DQ<7> are outputted to the data pads, respectively.

The correspondence between the data pads and the compression result output pads shown in FIG. 32 corresponds to the correspondence between the internal data buses and the data pads in parentheses shown in FIGS. 30 and 31. The connection between the pads and the internal data buses for implementing the correspondence between the internal data buses and the data pads shown in FIGS. 30 and 31 will be described later in detail. With any word structure, the compression result is outputted to the different internal data bus lines (different data pads), thereby making the loads of the internal data bus lines equal.

As described above, according to the fifth embodiment of the present invention, the compression result is outputted to the different internal data bus lines (different data pads) depending on the word structure. It is, therefore, possible to make the loads of the respective internal data bus lines equal, to make the data transfer speed of the respective internal data bus lines equal and to thereby achieve high-speed access.

Sixth Embodiment

Figure 33:
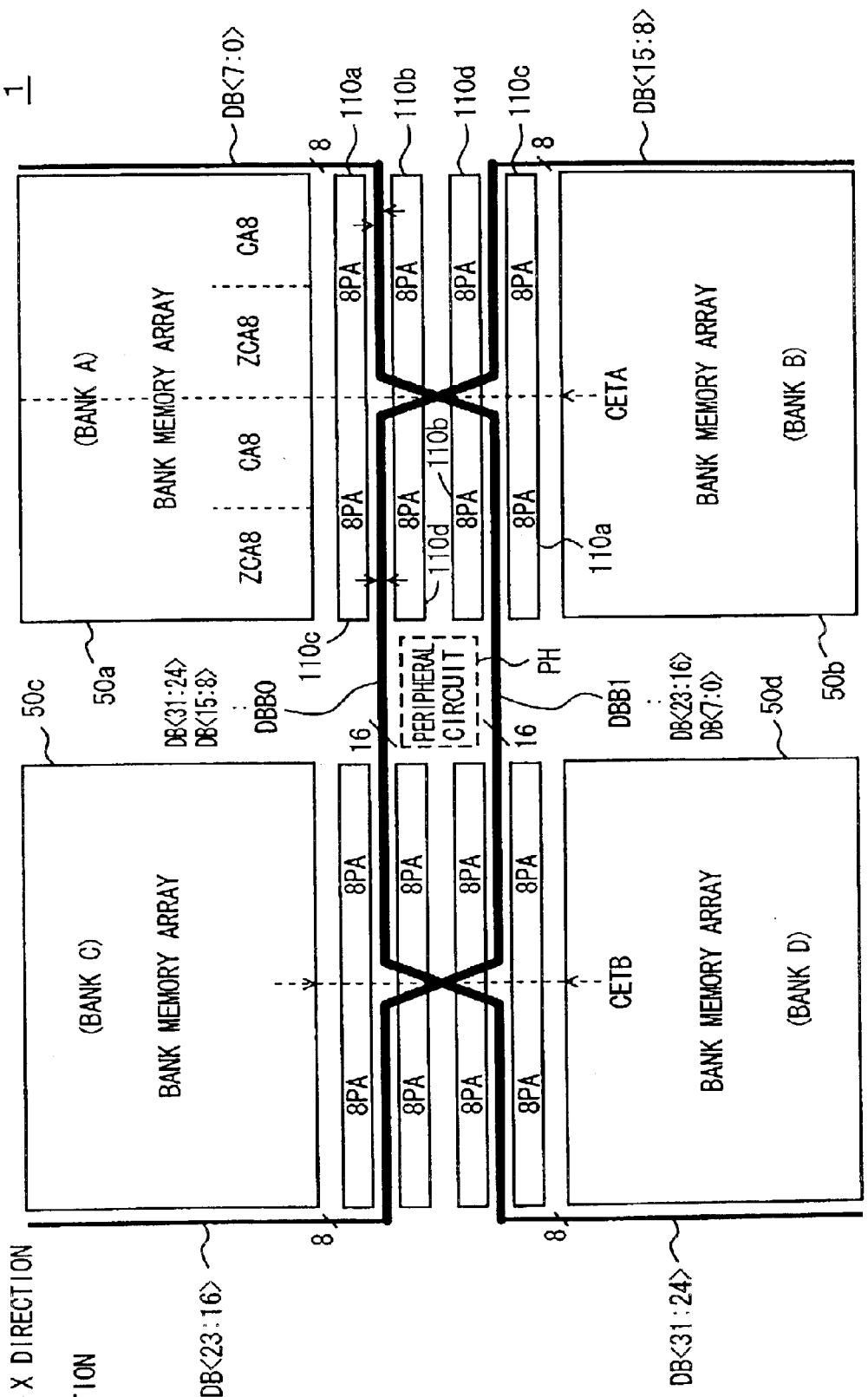
FIG. 33 is a schematic diagram showing the arrangement of an internal data bus of a semiconductor circuit device in the sixth embodiment according to the present invention.

FIG. 33 is a schematic diagram showing the configuration of a semiconductor memory chip in the sixth embodiment according to the present invention. In FIG. 33, semiconductor memory chip 1 includes bank memory arrays 50a to 50d that constitute banks A to D, respectively. Each of bank memory arrays 50a to 50d is divided into four column blocks by column address bit CA<8>. FIG. 33 representatively shows column blocks divided by column address signals CA8 and ZCA8 in bank memory array 50a. Preamplifier (PA) groups are arranged on two lines corresponding to bank memory arrays 50a to 50d, respectively. FIG. 33 representatively shows preamplifier circuits 110a to 110d arranged corresponding to bank memory array 50a and preamplifier circuits 110a to 110d arranged corresponding to bank memory array 50b. Preamplifier circuits 110a to 110d are the same as preamplifier circuits 110a to 110d shown in FIGS. 29 to 31.

Preamplifier circuits 110a and 110c are arranged in alignment in line and preamplifier circuits 110b and 110d are arranged in alignment in line for bank memory array 50a. Bank memory array 50b, the internal configuration of which will be described later in detail, is different in internal data bit mapping from bank memory array 50. Therefore, for bank memory array 50b, preamplifier circuits 110a and 110b are arranged point-symmetrically with respect to preamplifier circuits 110a and 110b for bank memory array 50a, and preamplifier circuits 110c and 110d are arranged point-symmetrically with respect to preamplifier circuits 110c and 110d for bank memory array 50a. 16-bit data buses DBB0 and DBB1 are provided in a region between bank memory arrays 50a and 50b and between bank memory arrays 50c and 50d. 16-bit data buses DBB0 and DBB1 have a cross-over region in a central region CETA in the row direction of bank memory arrays 50a and 50b and a cross-over region in a central region CETB in the row direction of bank memory arrays 50c and 50d. With these cross-over regions, data buses DBB0 and DBB1 have their positions exchanged.

16-bit data bus DBB0 includes 8-bit data buses DB<15:8> and DB<31:24>, and 16-bit data bus DBB1 includes 8-bit data buses DB<23:16> and DB<7:0>. In central regions CETA and CETB, data buses DBB0 and DBB1 have cross-over regions, whereby 32-bit data bus can be coupled to the respective banks in 4-bank configuration and a data bit output position can be divided into the four divided regions of the memory chip 1.

8-bit data bus DB<7:0> is provided, adjacent to bank memory array 50a, extending in a Y direction. 8-bit data bus DB<15:8> is provided, adjacent to bank memory array 50b, extending in the Y direction.

Likewise, data bus DB<23:16> of 8 bits is provided, adjacent to bank memory array 50c, extending in the Y direction. Data bus DB<31:24> of 8 bits are provided, adjacent to bank memory array 50d, extending in the Y direction. 8-bit data buses DB<7:0>, DB<15:8>, DB<23:16> and DB<31:24> are equal in interconnection length and load. It is, therefore, possible to make the load of data bus lines equal to one another and to transfer data bits at the same transfer speed.

By symmetrically arranging internal data buses DBB0 and DBB1 about the dividing lines of the four divided regions of the bank memory arrays, in particular, it is possible to equal 8-bit data buses DB<7:0>, DB<15:8>, DB<23:16> and DB<31:24> in interconnection length with each other, to readily make these data buses equal in interconnection load with each other. Thus, regardless of the position of a selected bank, data can be transferred at the same timing to the data pads arranged being distributed into the four divided regions.

Further, by intersecting 16-bit data buses DBB0 and DBB1 with each other in central regions CETA and CETB, data bits can be transferred from one bank to the data pads arranged being distributed into the four divided regions, irrespectively of the word structure of the semiconductor memory chip. In addition, such cross-over structure enables 16-bit data buses DBB0 and DBB1 to be provided in the region among the preamplifier circuits.

Furthermore, a peripheral circuit formation region H can be provided between 16-bit data buses DBB0 and DBB1. Peripheral circuits can be readily laid out, compared with a configuration in which 16-bit data buses DBB0 and DBB1 linearly extend in an X direction in the regions between bank memory arrays 50a and 50c and bank memory arrays 50b and 50d.

Figure 34:
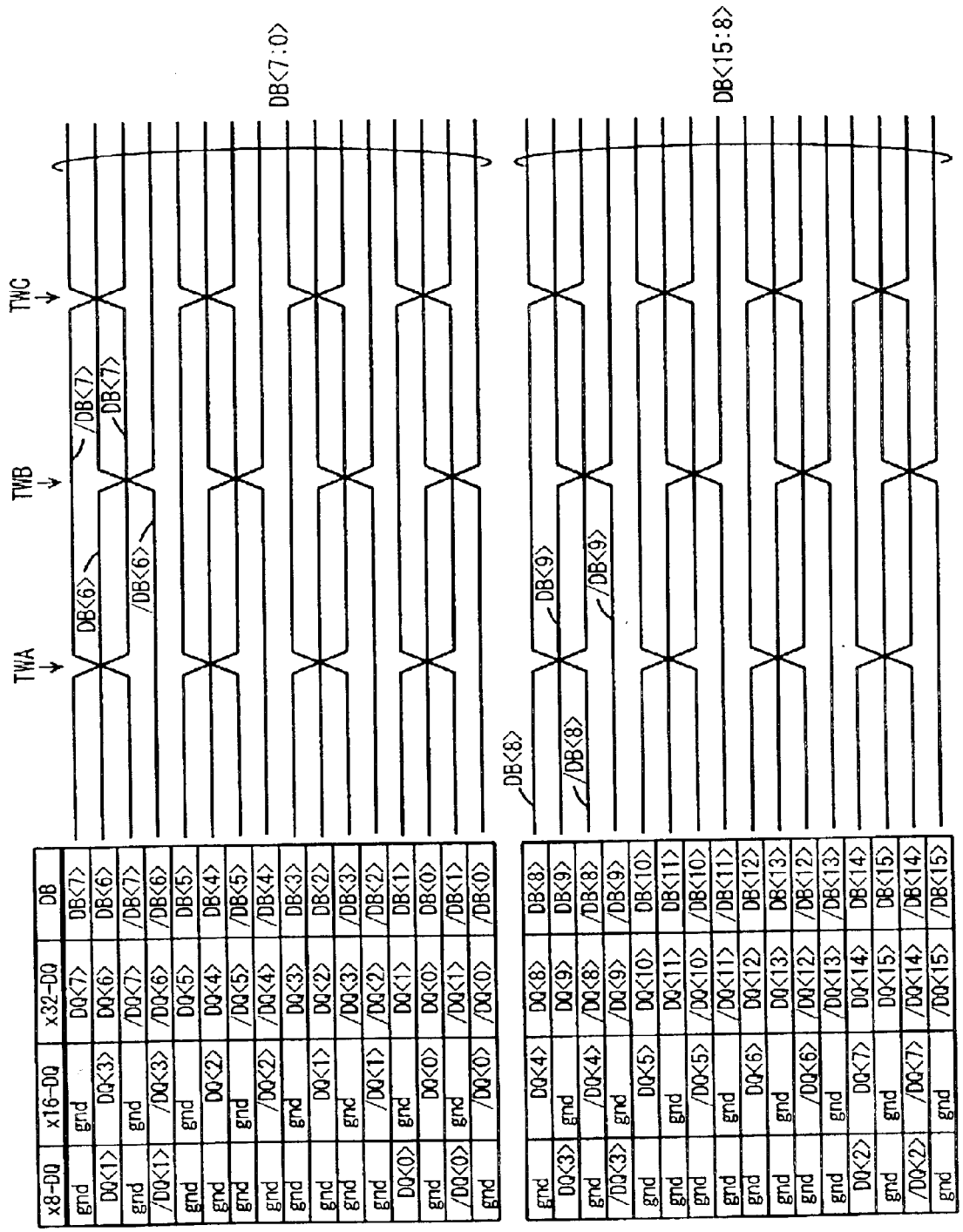
FIG. 34 shows the arrangement of the internal data bus shown in FIG. 33 more specifically.

FIG. 34 is a schematic diagram showing the arrangement of internal data bus lines of 8-bit internal data buses DB<7:0> and DB<15:8>. As shown in FIG. 34, the internal data bus lines of internal data buses DB<7:0> and DB<15:8> each include complementary data bus lines DB<i> and /DB<i>, with i being any of 0 to 15. In a word structure of ×32 bits, the internal data bus lines of internal data buses DB<7:0> and DB<15:8> are employed to transmit internal data bits DQ<7:0> and DQ<15:8>, respectively.

In a word structure of ×16 bits, alternate internal bus line of internal data buses DB<7:0>, i.e., even-numbered data bus lines DB<2j> and /DB<2j> are employed to transfer internal data bits. Odd-numbered internal data bus lines DB<2j+1> and /DB<2j+1> are set to a ground voltage gnd.

In a word structure of ×8 bits, data bus lines DB<6>, DB<1> and /DB<1> are employed to transfer data bits DQ<1>, /DQ<1>, DQ<0> and /DQ<0>, respectively. As for data bus DB<15:8>, data bus lines DB<9>, /DB<9>, DB<14> and /DB<14> are employed to transfer data bits DQ<3>, /DQ<3>, DQ<2> and /DQ<2>, respectively.

With internal data lines of 2 bit being a set, the data bus lines are arranged such that the internal data bus line each bit sandwiches the data bus line of the other bit in each set. For example, internal data bus lines DB<6> and /DB<6> and internal data bus lines DB<7> and /DB<7> are alternately arranged in the order of DB<6>, DB<7>, /IDB<6> and /DB<7>.

Further, these internal data bus lines are arranged into a twist structure having crossing portions. In FIG. 34, in crossing portions TWA and TWC, odd-numbered internal data bus lines have crossing portions. In a crossing portion TQB, even-numbered internal data bus lines have crossing portions. With this twisted structure, it is possible to decrease the coupling capacitance between the internal data bus lines. By alternately arranging the complementary internal data bus lines, common phase noise can be generated on each internal data bus line to cancel the noise.

As described above, in the word structures of ×16 bits and ×8 bits, the unused internal data bus lines are kept at ground voltage. Therefore, the unused internal data bus lines function as shield lines for the used internal data bus lines, making it possible to suppress generation of noise on transfer data and to accurately employ the transfer data as internal data. Even if internal read data is a small amplitude signal, in particular, it is possible to accurately transfer the internal read data at high speed without influence noise on the internal read data.

Figure 35:
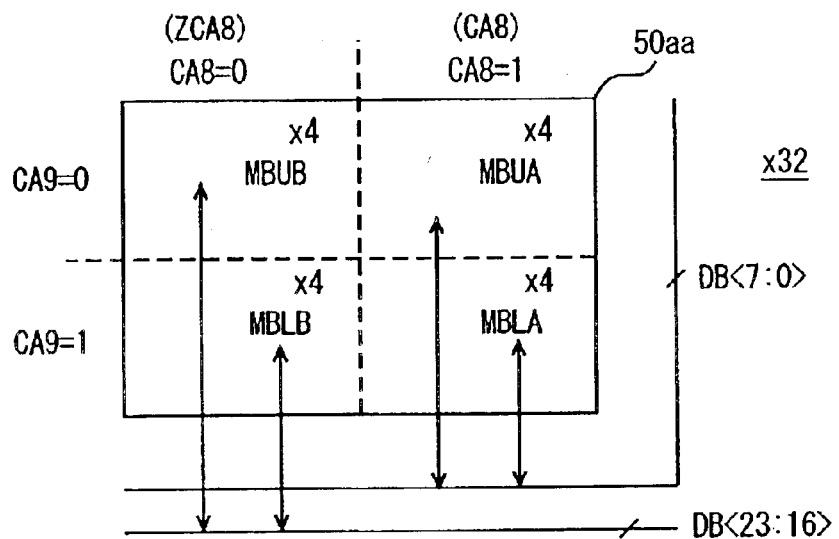
FIG. 35 is a schematic diagram illustrating the connection between a memory sub-block and the internal data bus in the semiconductor circuit device in the sixth embodiment according to the present invention.

FIG. 35 is a schematic diagram showing the connection between a sub-bank memory array 50aa, which is a half region of one bank memory array, and internal data bus lines in 32 bit word configuration. In FIG. 35, sub-bank memory array 50aa includes sub-memory blocks MBUA, MBLA, MBUB and MBLB.

When column address signal CA9 is "0", sub-memory blocks MBUB and MBUA are designated. When column address signal CA9 is "1", sub-memory blocks MBLB and MBLA are designated. When column address signal CA8 is "1", sub-memory blocks MBUA and MBLA are designated. If column address signal CA8 is "0", sub-memory blocks MBUB and MBLB are designated.

In each of sub-memory blocks MBUA, MBLA, MBUB and MBLB, memory cells of 4 bits are simultaneously selected in accordance with a column select signal.

In the word structure of ×32 bits, column address signal CA8 is set in a degenerated state and both of column address signals CA8 and ZCA8 are set at "1" for column address bit CA<8>. In sub-bank memory array 50aa, therefore, all of the sub-memory blocks are selected, and memory cells of 8 bits in sub-memory blocks MBUA and MBLA are coupled in parallel to internal data bus DB<7:0> and memory cells of 8 bits in sub-memory blocks MBUB and MBLB are connected in parallel to internal data bus DB<23:16>, respectively.

Figure 36:
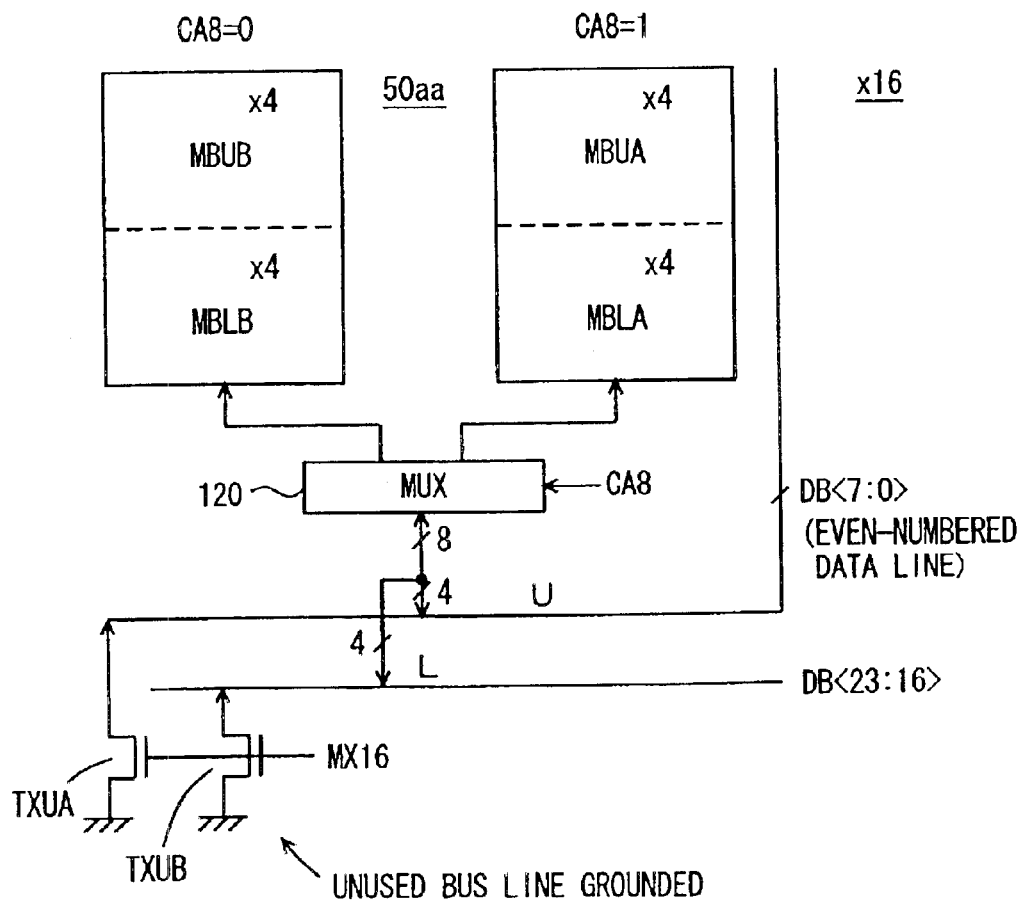
FIG. 36 is a schematic diagram illustrating the connection between the internal data bus and a memory block in ×16 bit configuration of the semiconductor circuit device in the sixth embodiment according to the present invention.

FIG. 36 is a schematic diagram showing the connection between selected memory cells of the sub-memory blocks and internal data bus lines in the word structure of ×16 bits. In FIG. 36, bank memory array 50aa is divided into two column blocks by column address bit CA<8>. A multiplexer (MUX) 120 that selects one column block by column address signal CA8 is provided for the two column blocks. Multiplexer (MUX) 120 selects sub-memory blocks MBUA and MBLA if column address signal CA8 is "1" and selects sub-memory blocks MBUB and MBLB if column address signal CA8 is "0".

Among the memory cell data of 8 bits selected by multiplexer 120, 4 bits of sub-memory block MBU are coupled to the even-numbere of internal data bus DB<0:7> and 4 bits of sub-memory block MBL are coupled to the odd-numbered data lines of internal data bus DB<23:16>.

MOS transistors TXUA and TXUB, which are rendered conductive when ×16 bit structure instruction signal MX16 is active and drive the unused internal data bus lines to ground voltage level when rendered conductive, are provided for internal data buses DB<7:0> and DB<23:16>, respectively. Therefore, MOS transistor TXUA drives odd-numbered data lines DB1, DB3, DB5 and DB7, which are not used in internal data bus DB<7:0> in the word structure of ×16 bits, to the ground voltage level. Likewise, MOS transistor TXUB drives odd-numbered data lines DB23, DB21, DB19 and DB17, which are not used in internal data bus DB<23:16> in the word structure of ×16 bits, to the ground voltage level.

With the configuration shown in FIG. 36, therefore, 4-bit data is transmitted from upper sub-memory blocks MBUA and MBUB to data bus DB<7:0> and 4-bit data is transmitted from lower sub-memory blocks MBLA and MBLB to data bus DB<23:16>. 4-bit data is transmitted in parallel to the even-numbered data lines in internal data bus DB<23:16> while the unused internal data lines are fixed to the ground voltage level by MOS transistor TXUB.

Figure 37:
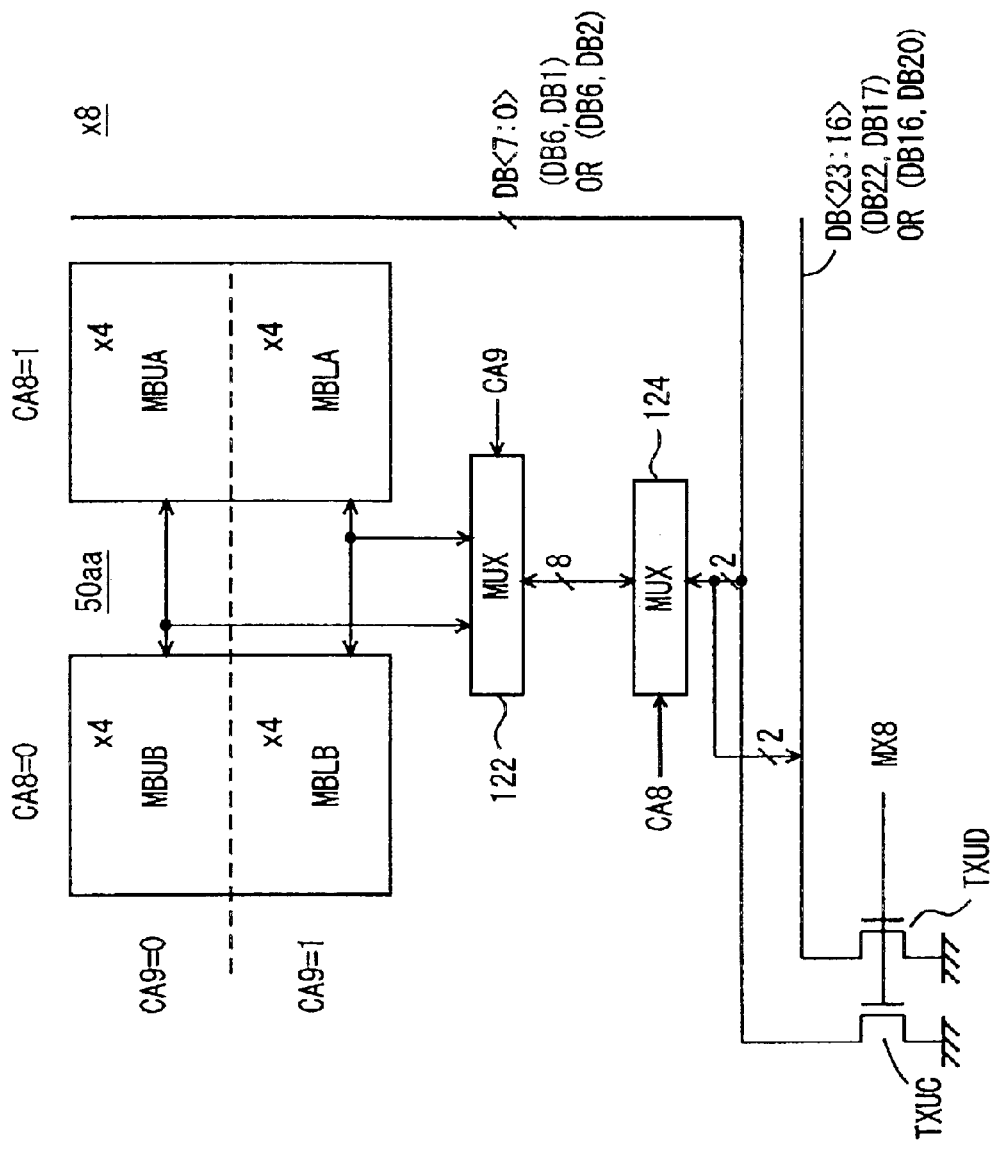
FIG. 37 is a schematic diagram illustrating the connection between the memory sub-block and the internal data bus in ×8 bit configuration of the semiconductor circuit device in the sixth embodiment according to the present invention.

FIG. 37 is a schematic diagram showing the coupling between selected memory cells of the sub-memory blocks and internal data bus lines in the word structure of ×8 bits. In FIG. 37, a multiplexer (MUX) 122 that selects either upper sub-memory blocks MBUA and MBUB or lower sub-memory blocks MBLA and MBLB in accordance with column address signal CA9, and a multiplexer MUX) 124 that generates 4-bit data from 8-bit data from multiplexer (MUX) 122 in accordance with column address signal CA8 are provided.

Multiplexer (MUX) 122 selects 8-bit data from either the upper sub-memory blocks or the lower sub-memory blocks in accordance with column address signal CA9. Multiplexer (MUX) 124 selects one of the two column blocks in accordance with column address signal CA8.

Among the 4-bit data selected by multiplexer (MUX) 124, two-bit data is transmitted to internal data bus lines DB<1> and DB<6> of internal data bus DB<7:0>while the other two-bit data is transmitted to internal data lines DB<22> and DB<17> of internal data bus DB<23:16>. Alternatively, 2-bit data may be transferred to internal data bus lines DB<2> and DB<6> in parallel on internal data bus DB<7:0> and 2-bit data may be transferred to internal data bus lines DB<16> and DB<20> on internal data bus DB<23:16>.

For the unused internal data bus lines of internal data buses DB<7:0> and DB<23:16>, MOS transistors TXUC and TXUD which are rendered conductive in accordance with 8-bit structure instruction signal MX8 and transmit the ground voltage when made conductive, are provided.

With the configuration shown in FIG. 37, one of sub-memory blocks MBUA, MBUB, MBLA and MBLB is selected by multiplexers 122 and 124 and 4-bit data of this selected sub-memory block is divided into two 2-bit data and the two 2-bit data are transmitted to the corresponding internal data bus lines of internal data bus DB<7:0> and of internal data bus DB<23:16>, respectively. The unused internal data bus lines are kept at the ground voltage level by MOS transistors TXUC and TXUD.

With the allocation of the column address signals shown in FIGS. 35 to 37, the word structures of ×32 bits, ×16 bits and ×8 bits can be implemented by changing the connection path between the internal data buses and the sub-memory blocks (preamplifiers/write drivers) using the multiplexer(s) in accordance with a change in word structure. In this case, depending on the word structure, the mapping of the selected memory cells and the internal data buses differ with respect to one sub-memory block. However, it is possible to reliably change the connection between the selected memory cells and the internal data buses and to fix the unused internal data bus lines to the ground voltage level for each word structure.

Modification of Sixth Embodiment

FIG. 38 shows a modification of the allocation of sub-memory blocks and column address bits in the sixth embodiment according to the present invention. In FIG. 38, one bank sub-memory array 50aa is divided into four sub-column blocks SCBK0 to SCBK3 along a row direction. Each of sub-column blocks SCBK0 to SCBK3 includes an upper sub-memory block UB and a lower sub-memory block UL.

No column address is allocated to upper and lower sub-memory block UB and UL. Sub-column blocks SCBK0 and SCBK1 are designated by column address bit CA8="0" and column address signal CA8="1" is allocated to sub-column blocks SCBK2 and SCBK3. Column address signal CA9="0" is allocated to sub-column blocks SCBK0 and SCBK2 and column address signal CA9="1" are allocated to sub-column blocks SCBK1 and SCBK3.

That is, according to the allocation of column address bits shown in FIG. 38, column address bits CA8 and CA9 are employed for division of the memory array into the column blocks and the upper sub-memory block and the lower sub-memory block are simultaneously accessed. Internal data buses DB<7:0> and DB<23:16> are allocated to bank sub-memory array 50aa.

Figure 39:
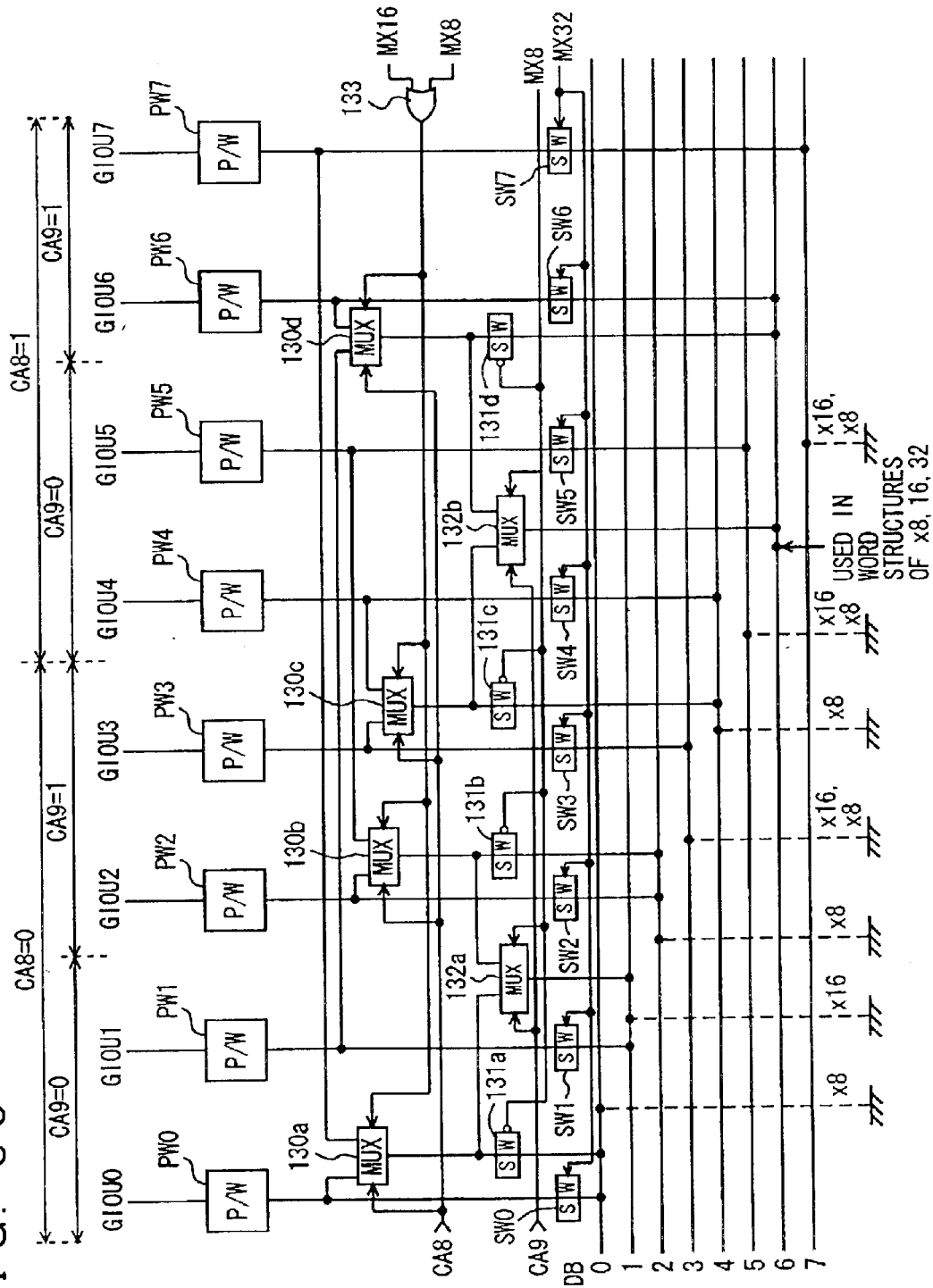
FIG. 39 is a schematic diagram showing the configuration of an internal data write/read section of a semiconductor circuit device in the modification of the sixth embodiment according to the present invention.

FIG. 39 is a schematic diagram showing the configuration of a data write/read section for writing and reading data to and from upper global data lines GIOU0 to GIOU7 arranged corresponding to upper block UB of bank sub-memory array 50aa shown in FIG. 38. Upper global data lines GIOU0 to GIOU3 are selected when column address signal CA8 is "0" and upper global data lines GIOU4 to GIOU7 are selected when column address signal CA8 is "1".

Upper global data lines GIOU0, GIOU1, GIOU4 and GIOU5 are selected when column address signal CA9 is "0". Upper global data lines GIOU2, GIOU3, GIOU6 and GIOU7 are selected when column address signal CA9 is "1".

Preamplifiers/write drivers (P/W) PW0 to PW7 are arranged corresponding to upper global data lines GIOU0 to GIOU7, respectively. Preamplifiers/write drivers PW0 to PW7 are simultaneously activated, irrespectively of the word structure.

Internal data bus lines DB0 to DB7 are arranged for upper global data lines GIOU0 to GIOU7. Internal data lines DB0 to DB7 correspond to internal data bus DB<7:0> shown in FIG. 38.

Switch circuits (SW) SW0 to SW7 which are rendered conductive when 32-bit structure instruction signal MX32 is activated, are arranged corresponding to preamplifiers/write drivers PW0 to PW7, respectively. When conductive, switch circuits SW0 to SW7 couple corresponding preamplifiers/write drivers PW0 to PW7 to internal data bus lines DB0 to DB7, respectively.

To implement a word structure of ×16 bits, multiplexers (MUX) 130a to 130d which perform selecting operations in accordance with column address bit CA8 when made active, and switch circuits 131a to 131d which are rendered nonconductive when 8-bit structure instruction signal MX8 is active are provided. When conductive, switch circuit 131a couples multiplexer 130a to internal data bus line DB0, switch circuit 131b couples multiplexer 130b to internal data bus line DB2, switch circuit 131c couples multiplexer 130c to internal data bus line DB4, and switch circuit 131d connects multiplexer 130d to internal data bus line DB6.

The output signal of an OR circuit 133 which receives 16-bit structure instruction signal MX16 and 8-bit structure instruction signal MX8 is applied as an activation control signal to multiplexers 130a to 130d in common. Multiplexers 130a to 130d perform selecting operations in accordance with column address signal CA8 when the output signal of OR circuit 133 is active.

When the output signal of OR circuit 133 is inactive (at L level), multiplexers 130a to 130d are kept nonconductive. When the output signal of OR circuit 133 is active, each multiplexer executes a data line selecting operation. Specifically, multiplexer 130a selects one of preamplifiers/write drivers PW0 and PW7, multiplexer 130b selects one of preamplifiers/write drivers PW2 and PW5, multiplexer 130c selects one of preamplifiers/write drivers PW3 and PW4, and multiplexer 130d selects one of preamplifiers/write drivers PW1 and PW6.

Switch circuits 131a to 131d, which are rendered nonconductive when 8-bit structure instruction signal MX8 is active, are arranged between multiplexers 130a to 130d and internal data bus lines DB0, DB2, DB4 and DB6, respectively. Switch circuits SW0 to SW7, which are rendered conductive when 32-bit structure instruction signal MX32 is active, are arranged between preamplifiers/write drivers PW0 to PW7 and internal data bus lines DB0 to DB7, respectively.

In the word structure of ×16 bits, multiplexers 130a to 130d and switch circuits 131a to 131d couple one of preamplifiers/write drivers PW0 and PW7 to internal data bus line DB0. Multiplexer 130b couples one of preamplifiers/write drivers PW2 and PW5 to internal data bus line DB2. Multiplexer 130c couples one of preamplifiers/write drivers PW3 and PW4 to internal data bus line DB4. Multiplexer 130d couples one of preamplifiers/write drivers PW1 and PW6 to internal data bus line DB6.

To implement a word structure of ×8 bits, there are provided a multiplexer 132a that selects an output signal of multiplexer 130a or 130b in accordance with column address signal CA9 and connects the selected multiplexer to internal data bus line DB1, and a multiplexer 132b that selects an output signal of multiplexer 130c or 130d in accordance with column address signal CA9 and connects the selected multiplexer to internal data bus line DB6. Multiplexers 132a and 132b turn conductive when 8-bit structure instruction signal MX8 is active and perform selecting operations in accordance with column address signal CA9. Multiplexers 132a and 132b are kept nonconductive when 8-bit structure instruction signal MX8 is inactive.

As indicated by broken lines in FIG. 39, a switching transistor which drives unused internal data bus lines to the ground voltage level is provided for each of internal data bus lines DB0 to DB7. In FIG. 39, the switching transistor is not shown, for the purpose of simplification of the drawing. Internal data bus line DB0 is fixed to the ground voltage level in the word structure of ×8 bits and internal data bus line DB1 is fixed to the ground voltage level in the word structure of ×16 bits. Internal data bus line DB2 is fixed to the ground voltage level in the word structure of ×8 bits and internal data bus line DB3 is fixed to the ground voltage level in the word structure of ×8 bits or ×16 bits. Internal data bus line DB4 is fixed to the ground voltage level in the word structure of ×16 bits and internal data bus line DB5 is fixed to the ground voltage level in the word structure of ×8 bits or ×16 bits. Internal data bus line DB7 is fixed to the ground voltage level in the word structure of ×8 bits or ×16 bits and internal data bus line DB6 is used in each word structure. The selective fixing of each internal data bus line to the ground voltage level can be implemented by selectively setting the MOS transistor to be conductive in accordance with word structure instruction signals MX8 and MX16.

Figure 40:
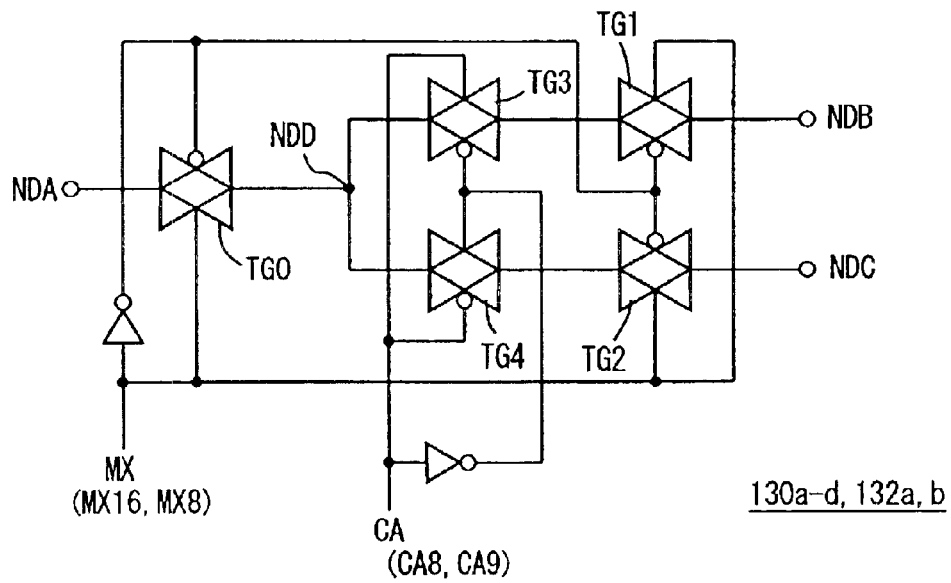
FIG. 40 shows an example of the configuration of a multiplexer shown in FIG. 39.

FIG. 40 shows an example of the configuration of multiplexers 130a to 130d and 132a to 132b shown in FIG. 39. Since these multiplexers are the same in configuration, FIG. 40 representatively shows the configuration of one multiplexer. In FIG. 40, each of multiplexers 130a to 130d, 132a and 132b includes a CMOS transmission gate TG0 that is rendered selectively conductive in accordance with word structure instruction signal MX (MX8 or MX16) and electrically couples nodes NDA and NDD when made conductive, CMOS transmission gate TG1 and TG2 that is rendered selectively conductive in accordance with word structure instruction signal MX, and CMOS transmission gates TG3 and TG4 that are rendered conductive complementarily to each other in accordance with column address signal CA ,to electrically couple internal node NDD to CMOS transmission gates TG1 and TG2, respectively. CMOS transmission gates TG0 and TG1 are coupled to nodes NDB and NDC, respectively.

When word structure instruction signal MX is inactive, CMOS transmission gates TG0 to TG3 are all nonconductive and nodes NDA, NDB and NDC are electrically disconnected from one another. In this state, therefore, regardless of column address signal CA (CA8 or CA9), the multiplexer is kept nonconductive and does not perform a selecting operation.

When word structure instruction signal MX (MX16 or MX8) is activated, CMOS transmission gates TG0 to TG2 turn conductive. In this state, CMOS transmission gate TG3 and TG4 is made conductive in accordance with column address signal CA and node NDA is electrically coupled to node NDB or NDC. It is possible to set a bidirectional data transfer path in accordance with the word structure and the column address bits.

Figure 41:
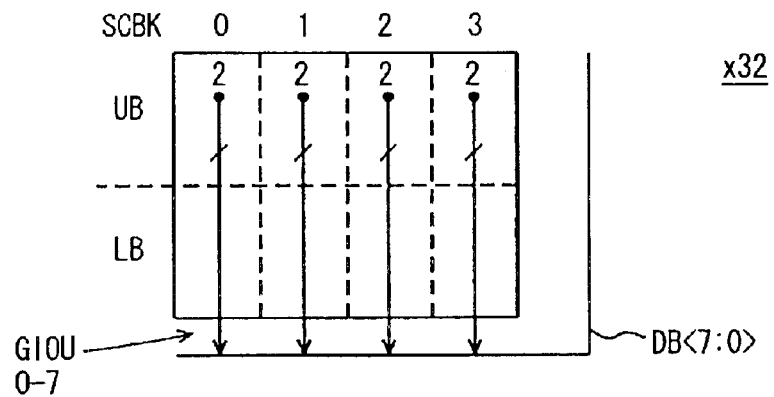
FIG. 41 is a schematic diagram illustrating the connection between an internal data bus and a global data line in ×32 bit configuration of the semiconductor circuit device in the modification of the sixth embodiment according to the present invention.

FIG. 41 is a schematic diagram showing the connection between global data lines GIU0 to GIU7 and internal data bus lines in the word structure of ×32 bits. As shown in FIG. 41, In the word structure of ×32 bits, the upper global data lines of 2 bits are selected and coupled to internal data bus DB<7:0> in parallel in each of sub-column blocks SCBK0 to SCBK3. Namely, in the configuration shown in FIG. 39, all of multiplexers 130a to 130d, 132a and 132b are kept nonconductive, all of switch circuits SW0 to SW7 are kept conductive, and global data lines GIOU0 to GIOU7 are coupled to internal data bus lines DB0 to DB7, respectively. It is noted that each of switch circuits 131a to 131d and SW0 to SW7 is formed of, for example, a CMOS transmission gate.

Figure 42:
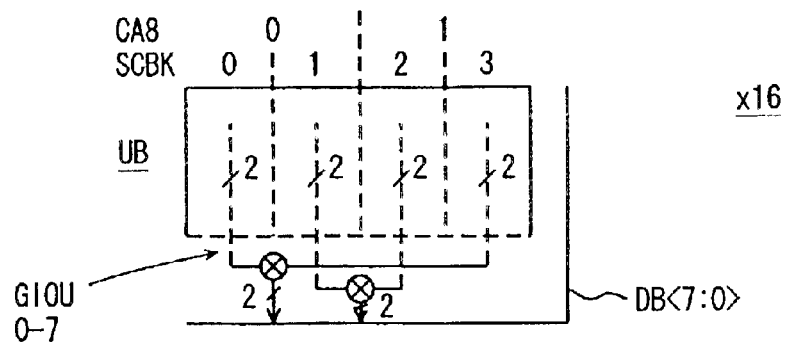
FIG. 42 is a schematic diagram illustrating the connection between an internal data bus and a global data line in ×16 bit configuration of the semiconductor circuit device in the modification of the sixth embodiment according to the present invention.

FIG. 42 is a schematic diagram showing the connection between global data lines GIU0 to GIU7 and internal data lines in the word structure of ×16 bits. In FIG. 42, in the word structure of ×16 bits, two global data lines GIOU in one of sub-column blocks SCBK0 and SCBK3 and two global line pairs GIOU in one of sub-column blocks SCBK1 and SCBK2 are selected in upper block UB and coupled to the corresponding internal data bus lines of internal data bus DB<7:0>. Namely, multiplexers 130a to 130d are activated to perform selecting operations and switch circuits 131a to 131d turn conductive. Therefore, a selecting operation of selecting one of the two column blocks in each block, i.e., of selecting two sub-blocks from four sub-column blocks in total is executed.

Figure 43:
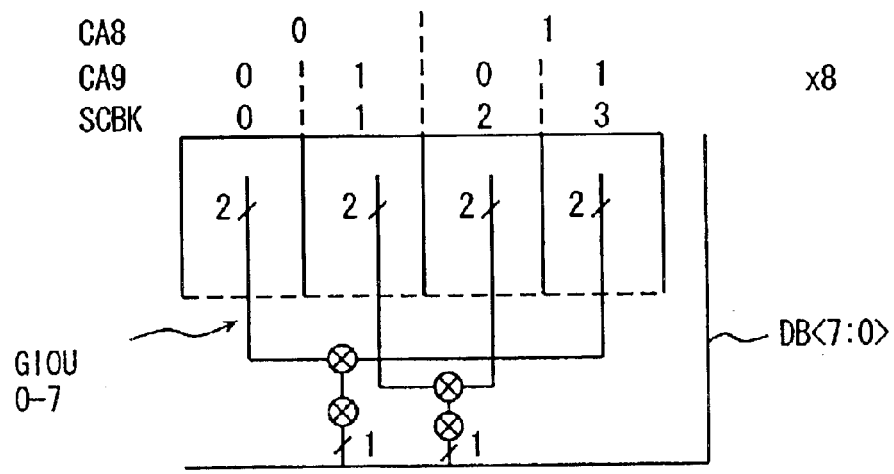
FIG. 43 is a schematic diagram illustrating the connection between a global data line and an internal data line the semiconductor circuit device in ×8 bit configuration of the modification of the sixth embodiment according to the present invention.

FIG. 43 is a schematic diagram showing the connection between global data lines GIU0 to GIU7 and internal data bus lines in the word structure of ×8 bits. As shown in FIG. 41, in the word structure of ×8 bits, switch circuits 131a to 131d shown in FIG. 39 are nonconductive and switch circuits SW0 to SW7 are also nonconductive. Multiplexers 132a and 132d are activated to perform selecting operations in accordance with column address signal CA9. Therefore, in each of sub-column blocks SCBK0 and SCBK3, one global data line is selected from the four global data lines by column address signals CA8 and CA9 and connected to internal data bus line DB1 or DB6. Likewise, in each of sub-column blocks SCBK1 and SCBK2, one global data line is selected from the four global data lines and connected to the other internal data bus line DB6 or DB1.

As shown in FIGS. 39 to 43, therefore, by using column address signals CA8 and CA9 to select a sub-column block, 4 bits and 2 bits can be selected from 8-bit data in upper block UB including four sub-column blocks for the 8-bit data bus DB<7:0> in the word structures of ×16 bits and ×8 bits, respectively.

The same data line selecting operation is executed in the lower block.

As described above, according to the sixth embodiment of the present invention, internal data buses are symmetrically arranged internally in a unit of internal data bus lines of 8-bit width and made equal in interconnection length. Thus, it is possible to make the internal data bus lines equal in load and in data output timing, irrespectively of the word structure. Further, by fixing the unused internal data bus lines to the ground voltage level and using them as shield lines, it is possible to transfer data at high speed without influence of coupling noise in the data transfer.

Seventh Embodiment

Figure 44:
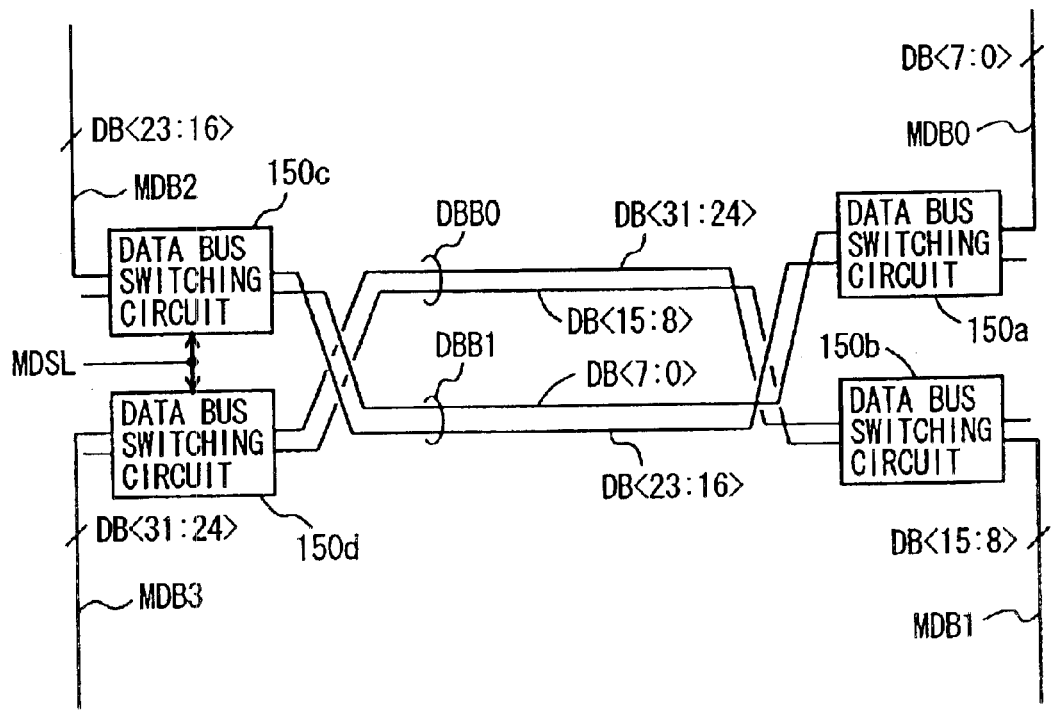
FIG. 44 is a schematic diagram showing the configuration of an internal data bus in the seventh embodiment according to the present invention.

FIG. 44 is a schematic diagram showing the arrangement of internal data buses of a semiconductor memory device in the seventh embodiment according to the present invention. In FIG. 44, internal data buses include 16-bit data buses DBB0 and DBB1. 16-bit data bus DBB0 include 8-bit data buses DB<15:8> and DB<31:20>. 16-bit data bus DBB1 include 8-bit data buses DB<7:0> and DB<23:16>.

8-bit data buses MDB0 to MDB3 are arranged correspondingly to the data pad regions, respectively. Data buses MDB0 to MDB3 are respectively coupled to data input/output circuits arranged corresponding to the data pads.

A data bus switching circuit 150a is arranged between 16-bit data bus DBB1 and 8-bit data bus MDB0. A data bus switching circuit 150b is arranged between 16-bit data bus DBB0 and 8-bit data bus MDB1. A data bus switching circuit 150c is arranged between 16-bit data bus DBB1 and 8-bit data bus MDB2. A data bus switching circuit 150d is arranged between 16-bit data bus DBB0 and 8-bit data bus MDB3. Data bus switching circuits 150a to 150d switch connection paths of data bus DBB1 between data buses MDB0 and MDB2 and between data bus DBB0 and data buses MDB1 and MDB3 in accordance with a mode selection signal MSDSL. The mode selection signal indicates the type of a package and a word structure.

In the word structure of ×32 bits, 8-bit data bus MDB2 is connected to data bus DB<23:16> in a one-to-one correspondence and data bus MDB3 is connected to internal data bus DB<31:24> in a one-to-one correspondence. Likewise, 8-bit data bus MDB0 is coupled to data bus DB<7:0> in a one-to-one correspondence and data bus MDB1 is connected to internal data bus DB<15:8> in a one-to-one correspondence.

Figure 45:
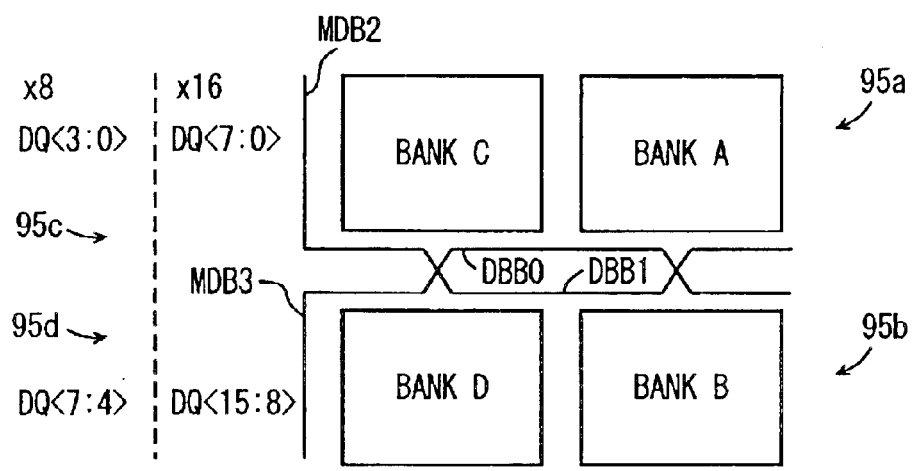
FIG. 45 is a schematic diagram showing the arrangement of data pads of a semiconductor circuit device in the seventh embodiment according to the present invention.

FIG. 45 is a schematic diagram showing an example of the manner of bus switching by data bus switching circuits 150a to 150d. In this semiconductor memory device, four banks A to B are provided and data buses DBB0 and DBB1 are provide between the banks. In a word structure of ×16 bits, data bits DB<7:0> are outputted to data bus MDB2 and data bits DB<15:8> are outputted to data bus MDB3. In a word structure of ×8 bits, four data bits DB<3:0> are outputted to data bus MDB2 and data bits DB<7:4> are outputted to data bus MDB3. Thus, no data is transferred to the pads provided in pad group regions 95a and 95b, but data is transferred by the data pads provided in data pad regions 95c and 95d.

Figure 46:
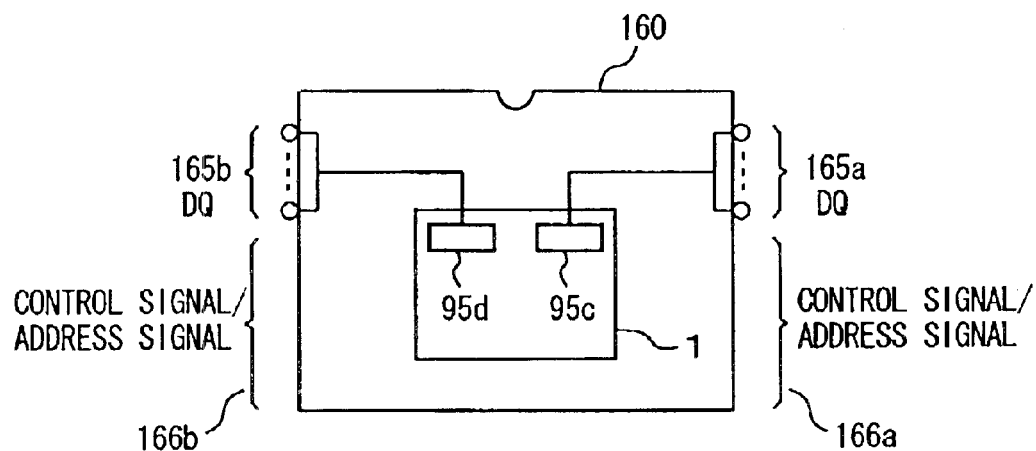
FIG. 46 is a schematic diagram showing the configuration of the semiconductor circuit device in the seventh embodiment according to the present invention upon assembly of the semiconductor circuit device in a multi chip package.

FIG. 46 is a schematic diagram showing the configuration of the semiconductor memory device shown in FIG. 45 when being assembled in a package. In FIG. 46, semiconductor memory chip 1 is assembled in a TSOP package 160. In TSOP package 160, data terminal groups 165a and 165b are arranged on first ends of opposite two sides of a rectangular region, respectively. Pad groups 166a and 166b for receiving control signals/address signals are arranged on the other ends of the opposite two sides. In semiconductor memory chip 1, as already shown, data is transferred to data pad groups 95c and 95d arranged along one side of the rectangular region by data bus switching circuits 150a to 150d.

Therefore, upon assembly in TSOP package 160, the data pads of data pad group 95c of the memory chip 1 are connected to the data terminals of data terminal group 165a of TSOP package 160 and the data pads of data pad group 95d are connected to the data terminals of data terminal group 165b. In the data pad groups arranged being divided into four divided regions in order to assemble the semiconductor memory device in BGA package with the same chip configuration, the used data pads are arranged on one side of the semiconductor memory chip to enable the assembly of semiconductor memory chip 1 in TSOP package 160.

TSOP package includes a type having pin terminals arranged on a longer side and another type having pin terminals arranged on a shorter side. Whichever type the TSOP package is, it is possible to assemble semiconductor memory chip 1 in the TSOP package by arranging data pads to be used on one side of semiconductor memory chip 1.

Figures 47, 48:
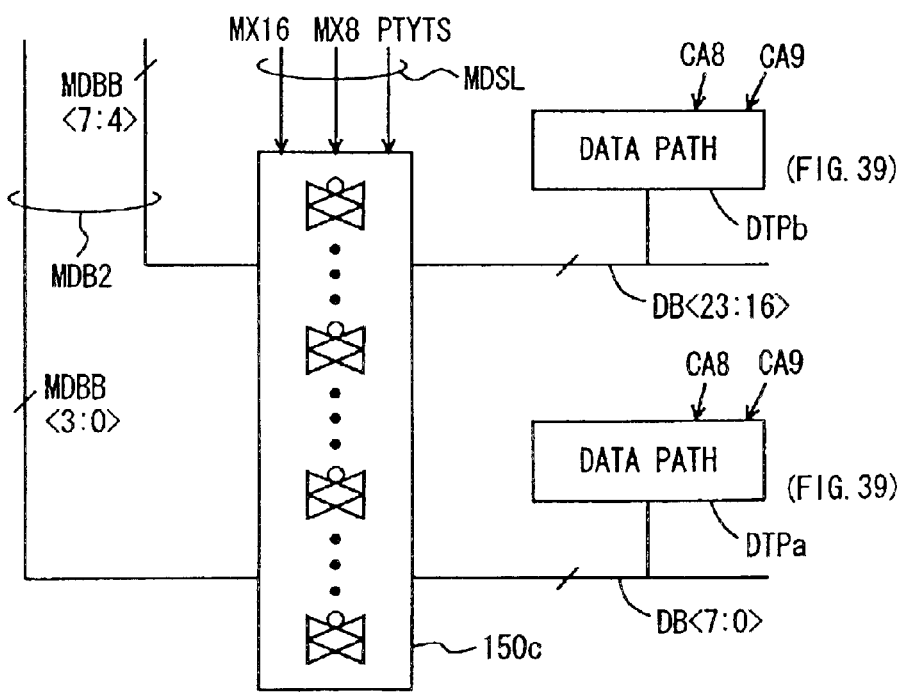
FIG. 47 specifically shows the arrangement of the data pads in the seventh embodiment according to the present invention.
FIG. 48 is a schematic diagram showing a modification of the seventh embodiment according to the present invention.

FIG. 47 shows an example of the arrangement of data terminals upon assembly in TSOP package for each word structure. In FIG. 47, in a word structure of ×32 bits, internal data bus lines DB0 to DB31 are coupled to the data pads arranged in data pad groups 95a to 95d to transmit data bits DQ<0> to DQ<31>, respectively.

In a word structure of ×16 bits, data bits DQ<0> to DQ<15> are transmitted to data pad groups 95c and 95d while no data is transferred to data pad groups 95a and 95b. In this state, data bus switching circuits 150a and 150b shown in FIG. 44 are set in an output high impedance state to thereby disconnect internal data bus DB<15:8> from internal output data bus MDB1 and to disconnect data bus DB<7:0> from output data bus MDB0. Data bus switching circuits 150c and 150d switch the connection between internal data buses DB<7:0> and DB<23:16> and data bus MDB2 and between internal data buses DB<31:24> and DB<15:8> and data bus MDB3.

In a word structure of ×8 bits, in data pad groups 95c and 95a, data bits DQ<0> to DQ<3> and DQ<4> to DQ<7> are outputted to alternate data pads.

FIG. 48 is a schematic diagram showing the configuration of a section related to data bus switching circuit 150c shown in FIG. 44. Data bus switching circuit 150c switches the connection between internal data buses DB<23:16> and DB<7:0> and data buses MDBB<3:0> and MDBB<7:4>. 16-bit structure instruction signal MX18, 8-bit structure instruction signal MX8 and a package instruction signal PTYTS are applied, as mode select signal MDSL to data bus switching circuit 150c. If the TSOP package is employed as a package in word structure of ×8 bits or ×16 bits, package instruction signal PTYTS is set in an active state of H level.

If the TSOP package is employed as a package of ×32 bit word structure, the data terminals are normally arranged corresponding to the four divided regions. In this case, therefore, it is not particularly required to switch the connection to the data pads.

Data paths DTPa and DTPb are coupled to internal data buses DB<7:0> and DB<23:16>, respectively. The configuration of data paths DTPa and DTPb correspond to that of the section which switches the connection between the internal data buses and the preamplifiers/write drivers shown in FIG. 39. Data paths DTPa and DTPb switch the connection between the internal data buses and the preamplifiers/write drivers in accordance with column address signals CA8 and CA9.

In data bus switching circuit 150c, a CMOS transmission gate is arranged to switch the data transfer route. By switching the connection of internal data buses DB<7:0> and DB<23:16> to data buses MDBB<3:0> and MDBB, it is possible to implement the arrangement of the data pads in accordance with the package in which semiconductor memory chip is assembled.

Figure 49:
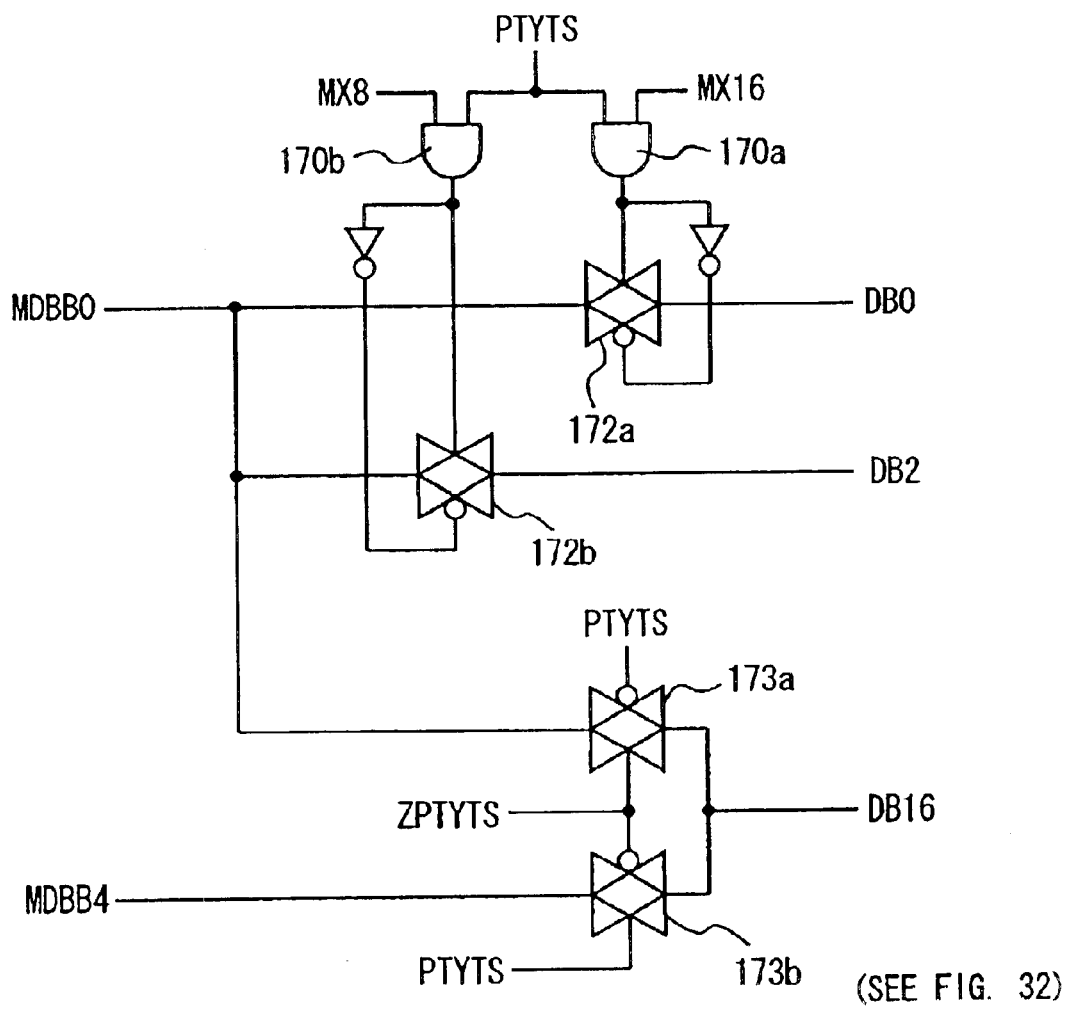
FIG. 49 shows an example of the configuration of a data line switch circuit shown in FIG. 48.

FIG. 49 is a schematic diagram showing the configuration of a section of data bus switching circuit 150c shown in FIG. 48 related to data bus lines MDBB0 and MDBB4. Data bus line MDBB0 is included in data bus MDBB<3:0> and data bus line MDBB4 is included in data bus MDBB<7:4>. Data bus lines MDBB0 and MDBB4 correspond to the portions which output data bits DQ<0> and DQ<4> in ×16 bit word structure shown in FIG. 49, respectively.

Internal data bus lines DB0, DB2 and DB16 are connected to the preamplifiers/write drivers so as to meet the correspondence between the data buses and the data pads shown in FIG. 32. Using the data paths shown in FIG. 39, data is transferred through internal data bus lines DB0, DB2 and DB16. Internal read data is transferred through data bus line DB0 in the word structure of ×32 bits or ×16 bits, and internal read data is transferred to internal data bus line DB2 in the word structure of ×32 bits. Internal read data is transferred to internal data bus line DB16 in the word structure of ×32 bits, ×16 bits or ×8 bits.

A CMOS transmission gate 172a is arranged to internal data bus line DB0, and a CMOS transmission gate 172b is arranged to internal data bus line DB2. When an output signal of a gate circuit 170a that receives package instruction signal PTYTS and 16-bit structure instruction signal MX16 is at H level, CMOS transmission gate 172a turns conductive to electrically couple internal data bus line DB0 to data bus line MDBB0. When the output signal of a gate circuit 170b, which receives 8-bit structure instruction signal MX8 and package instruction signal PTYTS, is at H level, CMOS transmission gate 172b turns conductive to electrically couple internal data bus line DB2 to data bus line MDBB0.

In assembly into TSOP, in the case of the word structure of ×16 bits, internal data bus line DB0 is coupled to output data bus line MDBB0 and in the case of the word structure of ×8 bits, internal data bus line DB2 is coupled to output data bus line MDBB0. In assembly into BGP (MCP), in the case of the word structure of ×32 bits, CMOS transmission gates 172a and 172b are nonconductive to disconnect internal data bus lines DB0 and DB2 from data bus line MDBB0.

CMOS transmission gates 173a and 173b, which become complementarily conductive in accordance with package instruction signals PTYTS and ZPTYTS, are provided for internal data bus line DB16. When an assembling package is BGP (MCP), package instruction signal PTYTS is at L level and complementary package instruction signal ZPTYTS is at H level. Accordingly, CMOS transmission gate 173a is conductive and CMOS transmission gate 173b is nonconductive. In this case, therefore, internal data bus line DB16 is electrically coupled to data bus line MDBB0. If package instruction signal PTYTS is at H level and complementary package instruction signal ZPTYTS is at L level, then TSOP is designated as an assembling package, CMOS transmission gate 173a is nonconductive, and CMOS transmission gate 173b is conductive. Accordingly, internal data bus line DB16 is coupled to data bus line MDBB4.

In the case of assembly in TSOP, in the word structure of ×32 bits, ×6 bits or ×8 bits, the data transferred from internal data bus line DB16 is transferred to data bus line MDDB4, and then transferred to the external data pad through the corresponding output buffer circuit.

It is noted that the configuration of the data bus switching circuit shown in FIG. 49 is provided only by way of example. The connection of the internal data buses to be used to the bus lines of the data buses coupled to the final pads has only to be appropriately set in accordance with the correspondence between the data pads and the data bits to be actually used.

The voltage levels of word structure instruction signals MX8 and MX16 and package instruction signal PTYTS may only be set by, for example, bonding wires to the mode selecting pads MS shown in FIG. 28.

Figure 50:
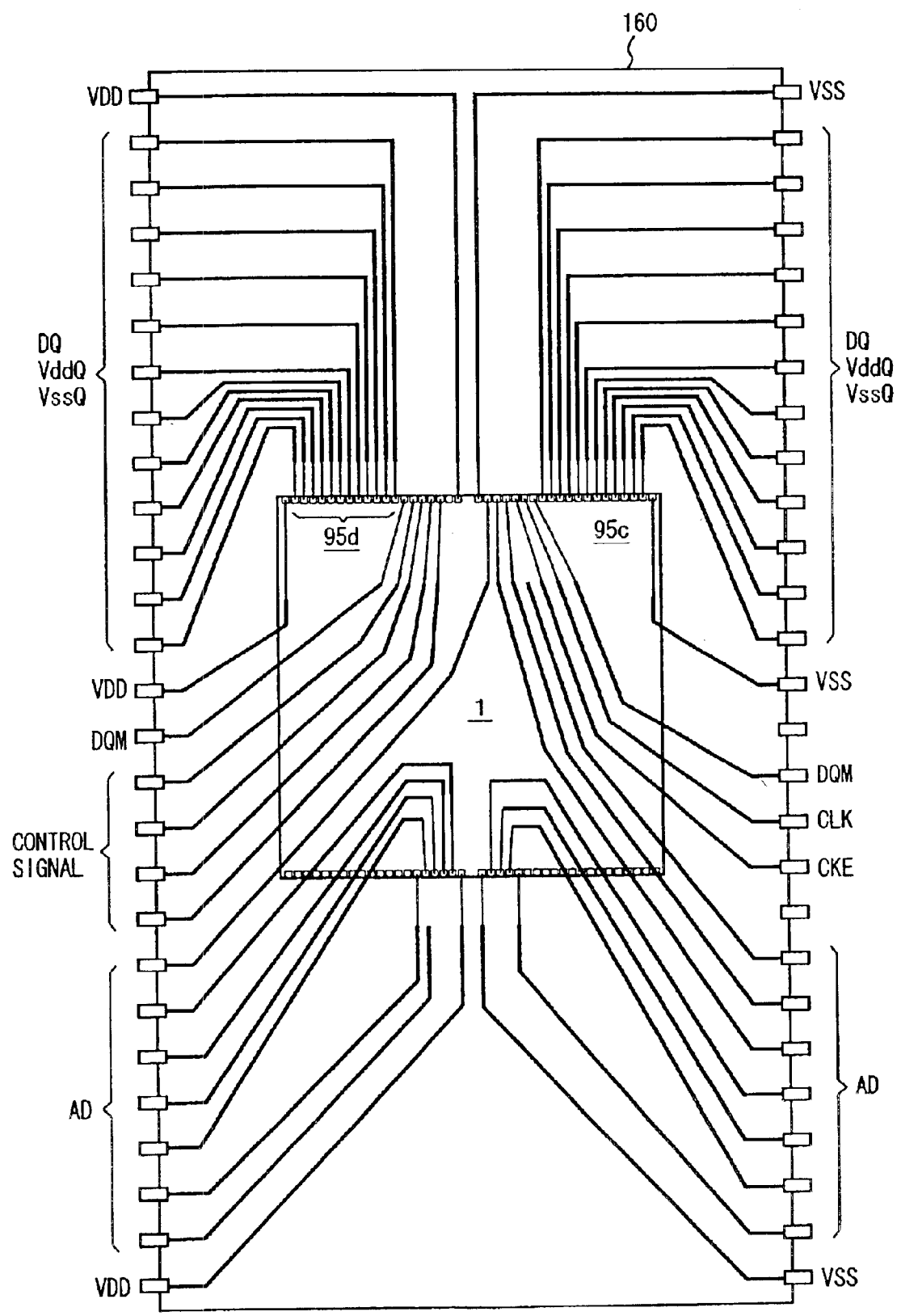
FIG. 50 shows an example of the manner of bonding upon assembly into a single chip package of the semiconductor circuit device in the seventh embodiment according to the present invention.

FIG. 50 is a schematic diagram showing the connection between external terminals and pads upon assembly in TSOP 160. As shown FIG. 50, in TSOP 160, data output terminal groups are arranged on one-side ends of opposite two sides thereof. Pin terminals for supplying output power source voltage VddQ and VssQ are arranged between the data output terminal groups. A power supply terminal and a ground terminal for supplying power supply voltage VDD and ground voltage VSS are arranged on the one-side ends, respectively.

Likewise, on the other-side ends of the opposite two sides of TSOP 160, a power supply terminal and a ground terminal receiving power supply voltage VDD and ground voltage VSS are arranged oppositely, respectively. Address terminal groups are arranged adjacently to the power supply terminal and the ground terminal, respectively. Address signal bits AD are supplied to these address terminal groups. A control input terminal group is provided adjacently to the address terminal group along one side of TSOP 160 and a clock terminal receiving clock signal CLK and a clock enable terminal receiving clock enable signal CKE are provided adjacently to the address terminal group along the other side TSOP 160.

Furthermore, DQ mask pin terminals DQM for masking data input/output are arranged on the both sides oppositely. A power supply terminal and a ground terminal for supplying power supply voltage VDD and ground voltage VSS are arranged in central regions on both sides oppositely.

In semiconductor memory chip 1, the DQ pads and the pads for supplying the power supply voltage and the ground voltage are arranged in each of data pad groups 95c and 95d. These pads are connected to corresponding terminals through lead frame and bonding wires. In addition, the pads for supplying the address signals, the control signals and power supply voltage are coupled to the pads of semiconductor memory chip 1 through lead frame and bonding wires.

Address signal pads, power supply pads and ground pads are arranged adjacent pad groups 95a and 95b of semiconductor memory chip 1. These pads are also connected to the address terminals, power supply terminals and ground terminals arranged on the other-side ends of the opposite two sides of TSOP.

As shown in FIG. 50, even with the configuration in which the data input/output terminals are arranged only one-side end of each of the opposite two side of the package, it is possible to easily connect the respective pads of the data pad groups to the external terminals and to assemble semiconductor memory chip 1 in TSOP for the word structure of ×16 bits or ×8 bits by arranging the data pad groups along one side of semiconductor memory chip 1.

It is noted that the arrangement of the pads in the word structure of ×32 bits is the same as that shown in FIG. 28. In the word structure of ×16 bits, the data pads of 16 bits arranged along one side as shown in FIG. 28 are connected to the lead terminals, respectively. In a word structure of ×8 bits, the data pads of 8 bits among the 16-bit pads are coupled to the lead terminals, respectively.

As described above, according to the seventh embodiment of the present invention, the data pads arranged on one side of a semiconductor memory chip are configured to be connected to the internal data buses. It is, therefore, possible to house one semiconductor memory chip in any of BGP and TSOP by switching the connections of the internal data buses using the bonding wires. Accordingly, it is possible to assemble semiconductor memory chips the same in chip configuration in any of a single chip package and a multi chip package.

Eighth Embodiment

FIG. 51 is a schematic diagram showing the configuration of the data output section of a semiconductor circuit device in the eighth embodiment according to the present invention. In FIG. 51, the configuration of a data read section between global data lines GIO0 to GIO7 of 8 bits and corresponding data pads DPD0 to DPD7 is schematically shown. Preamplifiers/write drivers PW0 to PW7 are provided corresponding to global data lines GIO0 to GIO7, respectively.

Preamplifiers/write drivers PW0, PW3, PW4 and PW7 are kept inactive when complementary 8-bit structure instruction signal ZMX8 is at L level to indicate a ×8 bit word structure. In the ×8 bit word structure, preamplifiers/write drivers PW0, PW3, PW4 and PW7 fix internal data bus lines DB0, DB3, DB4 and DB7 to the ground voltage level, respectively.

Multiplexers (MUX) 200a to 200d which select global data lines in accordance with column address signal CA9 in ×8 bit word structure, are provided. Multiplexers 200a to 200d perform selecting operations in accordance with 8-bit structure instruction signal MX8 and column address signal CA9. Multiplexer 200a selects one of global data lines GIO0 and GIO1 and couples the selected global data line to preamplifier/write driver PW1. Multiplexer 200b selects one of global data lines GIO2 and GIO3 and couples the selected global data line to preamplifier/write driver PW2.

Multiplexer 200c selects one of global data lines GIO4 and GIO5 and couples the selected global data line to preamplifier/write driver PW5. Multiplexer 200d selects one of global data lines GIO6 and GIO7 and couples the selected global data line to preamplifier/write driver PW6. When 8-bit structure instruction signal MX8 is at L level, multiplexers 200a to 200d couple global data lines GIO1, GIO2, GIO5 and GIO6 to preamplifiers/write drivers PW1, PW2, PW5 and PW6, respectively. When 8-bit structure instruction signal MX8 is at H level, multiplexers 200a to 200d perform selecting operations in accordance with column address signal CA9.

Column address signal CA9 (and ZCA9) may be configured to select one of the upper and lower blocks of the corresponding memory array or to further select sub-column blocks from the column block. In order to select the four global data lines among the eight global data lines, column address signal CA9 is employed.

Preamplifiers/write drivers PW0 to PW7 are coupled to internal data bus lines DB0 to DB7, respectively. Read drivers RDR0 to RDR7 which amplify and output received data in accordance with a read trigger signal RTEG are provided corresponding to internal data bus lines DB0 to DB7, respectively.

Output buffers OBF0 to OBF7 which are arranged corresponding to data pads DPD0 to DPD7 are provided corresponding to read drivers RDR0 to RDR7, respectively. Although each data pad corresponds to DQ pad DQP, it is denoted by reference symbols DPD since the data path shown in FIG. 51 is arranged in each of data pad regions 95a to 95d.

In the word structure of ×32 bits, read drivers RDR0 and RDR3 are activated to amplify and transfer the received data in accordance with read trigger signal RTEG. Read drivers RDR1 and RDR2 are kept inactive when 16-bit structure instruction signal MX16 is active. Read drivers RDR4 to RDR7 are kept inactive when 8-bit structure instruction signal MX8 is active. Read drivers RDR0 to RDR7 drive their output nodes to the ground voltage level when inactive in data read. During data write, read drivers RDR0 to RDR7 are set in an output high impedance state.

Output buffers OBF0 to OBF7 are selectively enabled in accordance with the word structure as corresponding read drivers RDR0 to RDR7. That is, output buffers OBF0 and OBF3 drive data pads DPD0 and DPD3 in accordance with the received data when enabled if 32-bit structure instruction signal MX32 is activated, respectively. Output buffers OBF1 and OBF2 are disabled and set in an output high impedance state when 16 bit structure instruction signal MX16 is activated. Output buffers OBF4 to OBF7 are set in an output high impedance when 8-bit structure instruction signal MX8 is activated.

If the corresponding data pads are not used, output buffers OBF0 to OBF7 may be set open and no output power supply voltage and output ground voltage are supplied upon assembly into a package in some cases. In this case, the output nodes of the output buffers arranged corresponding to the unused data buses may be simply kept in an output high impedance state or may be fixed to the ground voltage level.

In order to set a data transfer route in ×8 bit word structure, multiplexers 202a and 202b which perform selecting operations in accordance with 8-bit structure instruction signal MX8 and column address signal CA8 are provided corresponding to read drivers RDR1 and RDR27, respectively. Multiplexer 202a selects and couple one of internal data bus line DB1 and DB5 to read driver RDR1. In addition, multiplexer 202a couples the selected data bus line to read driver RDR2. Therefore, in the word structure of ×8 bits, multiplexer 202b selects one of internal data bus line DB2 and DB6. In the data output section, data is outputted to data pads DPD1 and DPD2 through output buffers OBF1 and OBF from read drivers RDR1 and RDR2, respectively.

In order to establish a data transfer route in the word structure of ×16 bits, multiplexers 204a to 204d which perform select operations in accordance with 16-bit structure instruction signal MX16 and column address signal CA8 are provided corresponding to read drivers RDR3 to RDR7, respectively. When executing the select operation, multiplexer 204a selects and couple one of internal data bus lines DB0 and DB4 to read driver RDR4. Multiplexer 204b selects and couple one of internal data bus lines DB1 and DB5 to read driver RDR5. Multiplexer 204c selects and couple one of internal data bus lines DB2 and DB6 to read driver RDR6. Multiplexer 204d selects and couple one of internal data bus lines DB3 and DB7 to read driver RDR7.

When 8-bit structure instruction signal MX8 is at L level, multiplexers 202a and 202b do not perform selecting operations and couple internal data bus lines DB1 and DB2 to read drivers RDR1 and RDR2, respectively. When 8-bit structure instruction signal MX8 attains the H level to indicate the word structure of ×8 bits, multiplexers 202a and 202b perform selecting operations in accordance with column address signal CA8.

If 16-bit structure instruction signal MX16 is at L level, multiplexers 204a to 204d couple internal data bus lines DB4 to DB7 to read drivers RDR4 to RDR7, respectively. When 16-bit structure instruction signal MX16 attains H level, multiplexers 204a to 204d perform selecting operations in accordance with column address signal CA8. In the word structure of ×16 bits, data are outputted to data pads DPD4 to DPD7 in accordance with read drivers RDR4 to RDR7, respectively.

Figure 52:
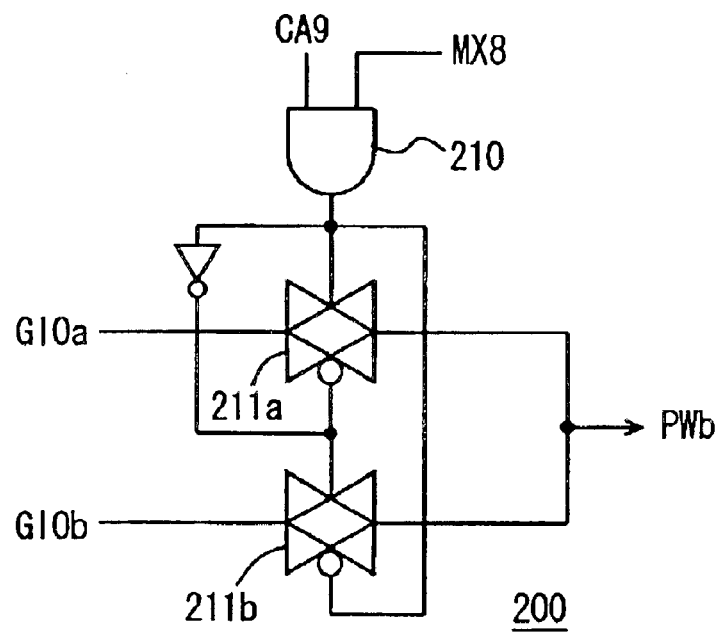
FIG. 52 shows an example of the configuration of a global data line selecting multiplexer shown in FIG. 51.

FIG. 52 shows an example of the configuration of multiplexers 200a and 200b. Since multiplexers 200a and 200b are the same in configuration, FIG. 52 representatively shows one multiplexer 200. Multiplexer 200 is provided corresponding to global data lines GIOa and GIOb and couples a selected global data line to a preamplifier/write driver PWb.

The output signal of an AND gate 210c, receiving column address signal CA9 and 8-bit structure instruction signal MX8, and an inversion signal of the output signal are applied in common to multiplexers 200a and 200b. Multiplexer 200 includes a CMOS transmission gate 211a that is rendered conductive when the output signal of AND gate 210 is at H level, to couple global data line GIOa to preamplifier/write driver PWb, and a CMOS transmission gate 211b that is rendered conductive when the output signal of AND gate 210 is at L level, to couple global data line GIOb to preamplifier/write driver PWb.

With the configuration of multiplexer 200 shown in FIG. 52, in the word structure of ×16 bits or ×32 bits, the output signal of AND gate 210 is at L level and global data line GIOb is coupled to preamplifier/write driver PWb. When 8-bit structure instruction signal MX8 is at H level, AND gate 210 is enabled and one of CMOS transmission gates 211a and 211b turns conductive in accordance with column address signal CA9. Therefore, in the word structure of ×8 bits, it is possible to selectively couple one global data line to the preamplifier/write driver in accordance with column address signal CA9.

Figure 53:
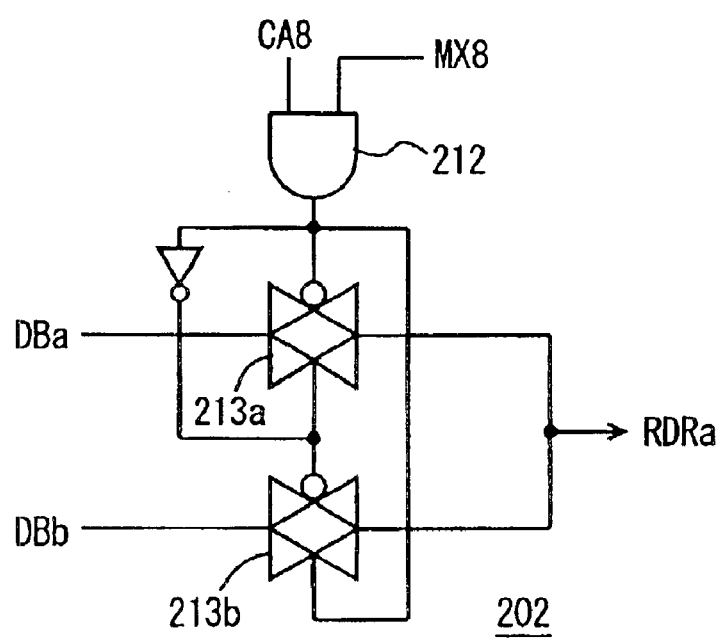
FIG. 53 shows an example of the configuration of a multiplexer for a ×8 bit structure shown in FIG. 51.

FIG. 53 shows an example of the configuration of multiplexers 202a and 202b shown in FIG. 51. Since multiplexers 202a and 202b are the same in configuration, FIG. 53 representatively shows multiplexer 202. Multiplexer 202 is provided between internal data bus lines DBa and DBb and read driver RDRa.

The output signal of an AND gate 212, receiving column address signal CA8 and 8-bit structure instruction signal MX8, and an inversion signal of the output signal are applied in common to multiplexers 202a and 202b. Multiplexer 200 includes a CMOS transmission gate 213a that is rendered conductive when the output signal of AND gate 212 is at L level, to couple internal data bus line DBa to read driver RDRa, and a CMOS transmission gate 213b that is rendered conductive when the output signal of AND gate 212 is at H level, to couple internal data bus line DBb to read driver RDRa.

When 8-bit structure instruction signal MX8 is at L level, CMOS transmission gate 203a is conductive, CMOS transmission gate 203b is nonconductive and internal data bus line DBa is connected to read driver RDRa. If 8-bit structure instruction signal MX8 attains H level to designate the word structure of ×8 bits, AND gate 212 is enabled, the output signal of AND gate 212 attains H or L level in accordance with column address signal CA8, and multiplexer 202 selects one of internal data bus lines DBa and DBb.

Figure 54:
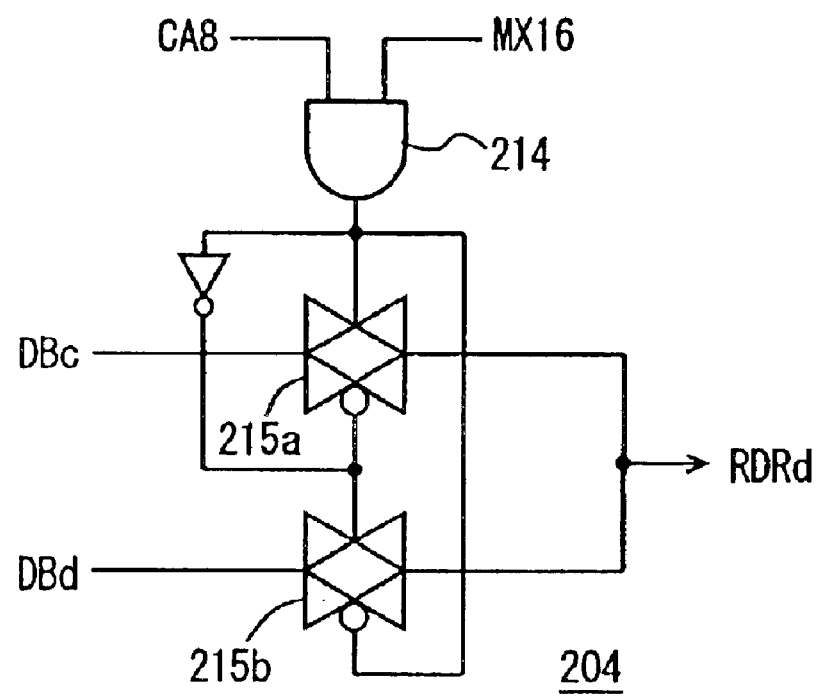
FIG. 54 shows an example of the configuration of a multiplexer for a ×16 bit structure shown in FIG. 51.

FIG. 54 shows an example of the configuration of multiplexers 204a to 204d shown in FIG. 51. Since multiplexers 204a to 204d are the same in configuration, FIG. 54 representatively shows multiplexer 204. Multiplexer 204 selects and couple one of internal data bus lines DBc and DBd to read driver RDRd.

The output signal of an AND gate 214, receiving column address signal CA8 and 16-bit structure instruction signal MX16, and an inversion signal of the output signal are applied in common to multiplexers 204a to 204d. Multiplexer 204 includes a CMOS transmission gate 215a that is rendered conductive when the output signal of AND gate 214 is at H level, to couple internal data bus line DBc to read driver RDRb, and a CMOS transmission gate 215b that is rendered conductive when the output signal of AND gate 214 is at L level, to couple internal data bus line DBd to read driver RDRb.

In the word structure of ×16 bits, 16-bit structure instruction signal MX16 is at H level and AND gate 214 is enabled. In this case, therefore, one of CMOS transmission gates 215a and 215b is selected in accordance with column address signal CA8. In the word structures of ×32 bits and ×8 bits, 16-bit structure instruction signal MX16 is at L level, the output signal of AND gate 214 is at L level, CMOS transmission gate 215b becomes conductive and internal data bus line DBd is coupled to read driver RDRd.

With the configurations of the multiplexers shown in FIGS. 52 to 54, global data lines GIO0 to GIO3 are designated when column address signal CA8 is "0" and global data lines GIO4 to GIO7 are designated when column address signal CA8 is "1". Further, global data lines GI00, G103, G104 and G107 are designated when column address signal CA9 is "0". However, the allocation of the column addresses has only to be appropriately set in accordance with the array configuration. The logical levels of column address signals CA9 and CA8 applied to the multiplexers shown in FIGS. 52 to 54 are merely required to be appropriately changed in accordance with column address bits allocated to respective global data lines GIO0 to GIO7.

Figure 55:
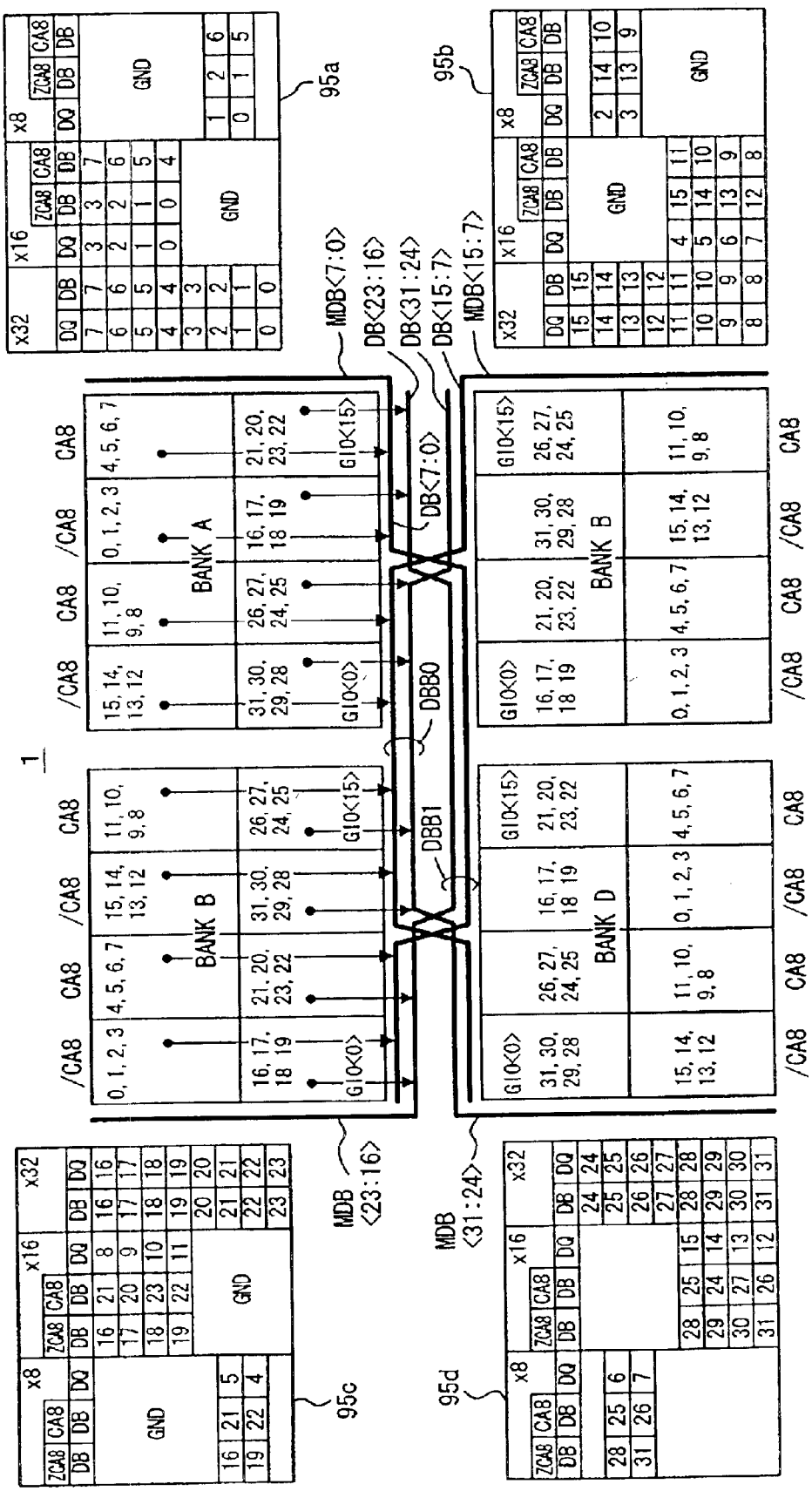
FIG. 55 is a schematic diagram representing the correspondence between data pads and a selected memory cell of a semiconductor circuit device in the eighth embodiment according to the present invention.

FIG. 55 is a schematic diagram showing the connection between internal data bus lines and data pads. FIG. 55 shows the allocation of data bits and column address signal CA8 in each of memory blocks of banks A to D.

Each of banks A to D is divided into four column blocks in accordance with column address signals CA8 and /CA8 (=ZCA8). The global data lines in the upper sub-memory blocks are coupled to internal data buses DB<7:0> and DB<15:8> and those in the upper sub-memory blocks are coupled to internal data buses DB<23:16> and DB<31:24>.

In the arrangement shown in FIG. 55, internal data bus DB<7:0> is selectively coupled to data bus MDB<7:0> and internal data bus DB<15:7> is selectively coupled to data bus MDB<15:7>. Further, internal data bus DB<23:16> is selectively coupled to data bus MDB<23:16> and internal data bus DB<31:24> is selectively coupled to data bus MDB<31:24>.

In four regions outside banks A to D, data pad regions 95a to 95d are arranged, respectively. In the word structure of ×32 bits, multiplexers 200a, 200d, 202a, 202d and 204a to 204d do not perform selection operations as shown in FIG. 51. Therefore, internal data bus DB<31:0> are coupled to data bus MDB<31:0> in a one-to-one correspondence.

In the word structure of ×16 bits, the connection path is switched in accordance with column address signal CA8. Namely, in the word structure of ×16 bits, two column blocks are selected in accordance with column address signals CA8 and /CA8 (=ZCA8). In FIG. 51, in the word structure of ×16 bits, multiplexers 204a to 204d perform select operations in accordance with column address signal CA8. Therefore, internal data bus lines DB0 to DB7 are coupled to output buffers OBF4 to OBF7 by read drivers RDR4 to RDR7 provided corresponding to internal data bus lines DB4 to DB7. As a result, 4 bits are outputted to data pads DBD4 to DBD7, respectively.

In this case, by the select operations of multiplexers 202a to 204d, data on internal data bus lines DB0 to DB3 is outputted as data bits DQ0 to DQ3, respectively or data bits on internal data bus lines DB4 to DB7 are outputted as data bits DQ0 to DQ3, respectively. The output signals of unused read drivers RDR0 to RDE3 are fixed to the ground voltage level. Even in a data write operation, the data lines connected to these unused data output circuits do not transfer write data. As a result, even if the output signal of the unused read drivers are fixed to the ground voltage level, no problem occurs to the data write operation.

In the word structure of ×16 bits, preamplifiers/write drivers PW0 to PW7 shown in FIG. 51 are active and internal data bus lines DB0 to DB7 are driven in accordance with read data.

In the word structure of ×8 bits, multiplexers 200a to 200b or multiplexers 202a and 202b perform selecting operations. Multiplexers 204a to 204d do not perform selecting operations, and the outputs of read drivers RDR0 and RDR7 unused in the word structure of ×8 bits are fixed to ground voltage GND.

In the word structure of ×8 bits, multiplexers 200a to 200d perform a 2:1 selection of global data lines in accordance with column address signal CA9 and transmits the data of the selected global data line onto internal data bus lines DB1, DB2, DB5 and DB6. Then, multiplexers 202a and 202b perform selecting operations in accordance with column address signal CA8 and read drivers RDR1 and RDR2 drive data pads DPD1 and DPD2 through output buffers OBF1 and OBF2, respectively. Therefore, in data pad region 95a, for example, the data on internal data bus lines DB1 and DB2 are outputted to data pads DPD1 and DPD2 or the data on internal data bus lines DB5 and DB6 are outputted to data pads DPD1 and DPD2, respectively.

In remaining data pad regions 95b to 95d, the same configuration is provided as that shown in FIG. 51, and the same selecting operations are preformed. In the word structures of ×16 bits and ×8 bits, selecting operations are preformed in accordance with column address signals CA8 and CA9.

In the configuration shown in FIG. 51, common preamplifier/write drivers can be employed in the word structures of ×32 bits, ×16 bits and ×8 bits. As for the read drivers, common read drivers are employed in the word structures of ×32 bits and ×8 bits, and common read drivers are employed in ×32 bit configuration and ×16 configuration are employed. Therefore, there is no need to arrange the read drivers and the preamplifiers dedicated to ×16 bits or ×8 bits, thereby making it possible to simplify circuit arrangement and the layout of the preamplifier band.

In addition, in data pad regions 95a to 95d, the connection between the internal data buses and the data buses connected to the input/output buffers is switched simply according to the word structure. It is, therefore, possible to arrange output buffers OBF0 to OBF7 in common, irrespectively of the word structure and to use the common layout of the data output section to every word structure.

Modification

Figure 56:
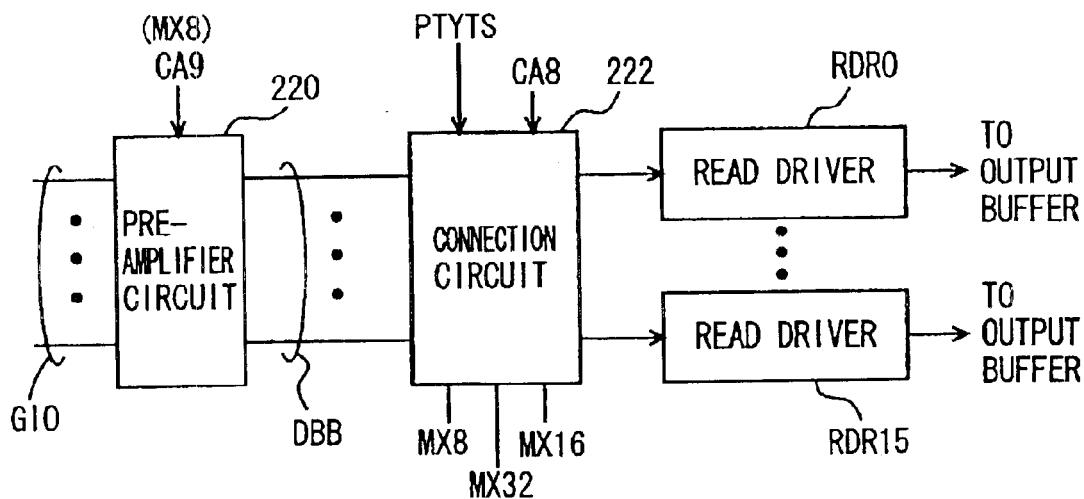
FIG. 56 is a schematic diagram showing the configuration of a modification of the eighth embodiment according to the present invention.

FIG. 56 is a schematic diagram showing a modification of the eighth embodiment according to the present invention. In FIG. 56, global data bus GIO is connected to internal data bus DBB through a preamplifier circuit 220. Preamplifier circuit 220 includes preamplifiers arranged corresponding to the respective global data lines of global data bus GIO. The connection paths of the preamplifiers included in preamplifier circuit 220 are determined according to column address signal CA9. Internal data bus DBB is connected to read drivers RDR0 to RDR15 through connection circuit 222. Connection circuit 222 sets its connection routes in accordance with column address signal CA8 and word structure instruction signals MX8, MX16 and MX32.

With the configuration shown in FIG. 56, therefore, it is possible to set the connection of 16-bit data bus DBB in accordance with the word structure instruction signals and column address signal CA8, to implement an intended connection between the global data lines and the internal data bus lines (read drivers). Accordingly, the arrangement positions of the data pads with any word structure can be adapted to any of BGP and TSOP.

Alternatively, in the arrangement shown in FIG. 56, column address signal CA9 may be applied to connection circuit 222. With such a configuration, in the case of ×8 bit word structure, preamplifier circuit 220 is selectively set in an active state in accordance with column address signal CA9 and the transfer path of the output signals of preamplifier circuit 220 in an active state is established by connection circuit 222 according to column address signal CA9.

In the configuration shown in FIG. 56, the configuration for data reading is shown. However, by constituting connection circuit 222 by bidirectional transfer gates, a data write path can be also established in accordance with the positions of the data pads to be used.

As described above, according to the eighth embodiment of the present invention, the connection route of the internal data buses to the read drivers for driving the output buffers arranged between the internal data buses and the output data buses is set in accordance with the column address signal. It is, therefore, possible to share the configuration of the internal data input/output section among the respective word structures, to thereby simplify the layout of preamplifier band.

Further, by changing the connection path with the configuration shown in FIG. 39 being used in combination, it is possible to easily implement the arrangement of the data pads according to any word structure. It is also possible to easily achieve the arrangement of the data pads according to any package.

In the case of assembly in TSOP, in the ×8 bit and ×16 bit word structures, the data pad regions arranged on one side of the semiconductor memory chip are used. In this case, package instruction signal PTYPS is applied to connection circuit 222, the read drivers arranged for non-used pad regions are disconnected from the internal data buses, and a connection path for the corresponding read drivers in the used data pad regions is set. In this case, therefore, connection circuit 222 changes the transfer path of the output signals of the multiplexers shown in FIG. 51 in accordance with the positions of the pads by the use of CMOS transmission gates.

Ninth Embodiment

Figure 57:
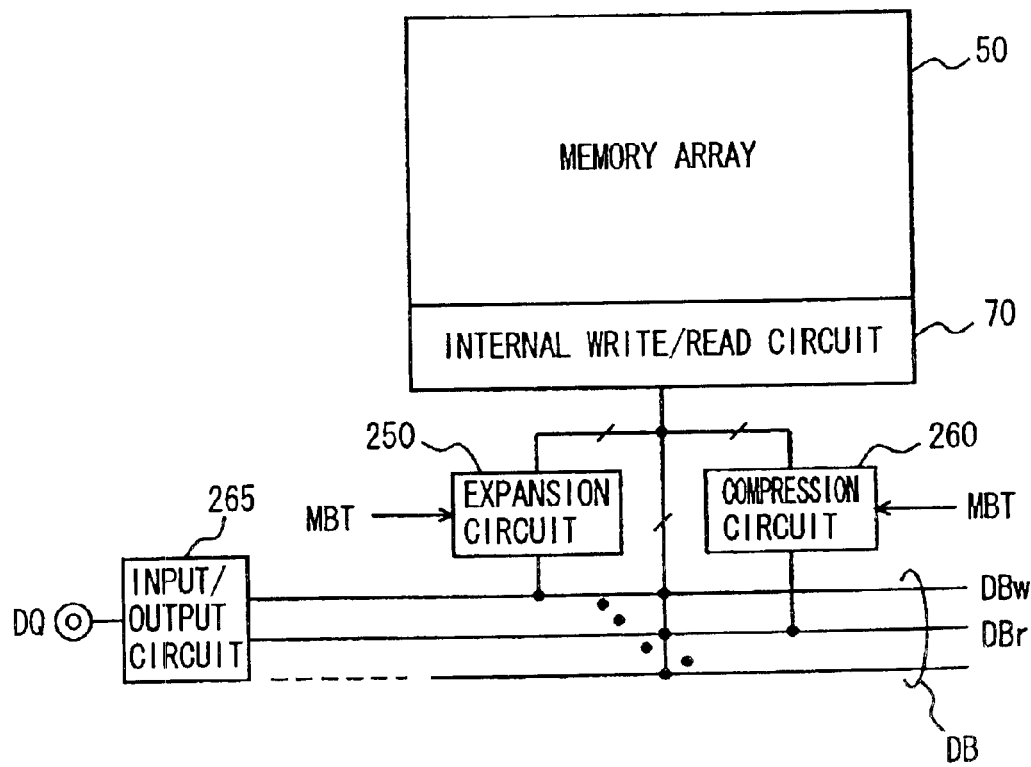
FIG. 57 is a schematic diagram showing the configuration of a main portion of a semiconductor circuit device in the ninth embodiment according to the present invention.

FIG. 57 is a schematic diagram showing a main portion of a semiconductor circuit device in the ninth embodiment according to the present invention. In FIG. 57, an expansion circuit 250 and a compression circuit 260 are provided for internal write/read circuit 70 which transmits and receives internal write/read data to and from selected memory cells of memory array 50. Expansion circuit 250 expands a signal on an internal data bus line DBw for transmission to internal write/read circuit 70 in data writing mode when multi-bit test mode instruction signal MBT is active.

Compression circuit 260 compresses the data read from internal write/read circuit 70 and transmits a compression result to an internal data line DBr in data reading mode when multi-bit test mode instruction signal MBT is active. Internal data bus lines DBw and DBr are separate data bus lines and coupled to an input/output circuit 265 in common.

Internal write/read circuit 70 transfer data with data bus lines of 32 bits of internal data bus DB. Input/output buffer circuits are provided in input/output circuit 265 corresponding to the respective data bus lines of internal data bus DB.

In a multi-bit test mode, common data is written to a plurality of memory cells of memory array 50 through expansion circuit 250, and data is simultaneously read from the plurality of memory cells of memory array 50. Compression circuit 260 generates data indicating the coincidence/non-coincidence of the logical levels of these read out, and determination is made on whether a defective memory cell is present in the plurality of memory cells in accordance with the compression result data. Expansion circuit 250 has a function of expanding the bit with of data and generates data of a plurality of bits from an applied test data through a copying operation.

In such a multi-bit test mode, internal data bus line DBw for transmitting multi-bit test write data and data bus line DBr for transmitting data indicating the compression (degeneration) result are provided separately. With such configuration, the following advantages can be obtained. If expansion circuit 250 and compression circuit 260 are coupled to the common data bus line, the load of this data bus line is heavier than those of the other data bus lines. In a normal operation mode, data transfer speed is controlled by the data transfer speed of the data bus line having the heavy load, and therefore, data cannot be transferred at high speed. By separately providing the bus lines for transmitting the multi-bit test write data and for transferring data indicating the compression result, it is possible to distribute bus line load and data can be transferred at high speed in a normal operation mode.

Figure 58:
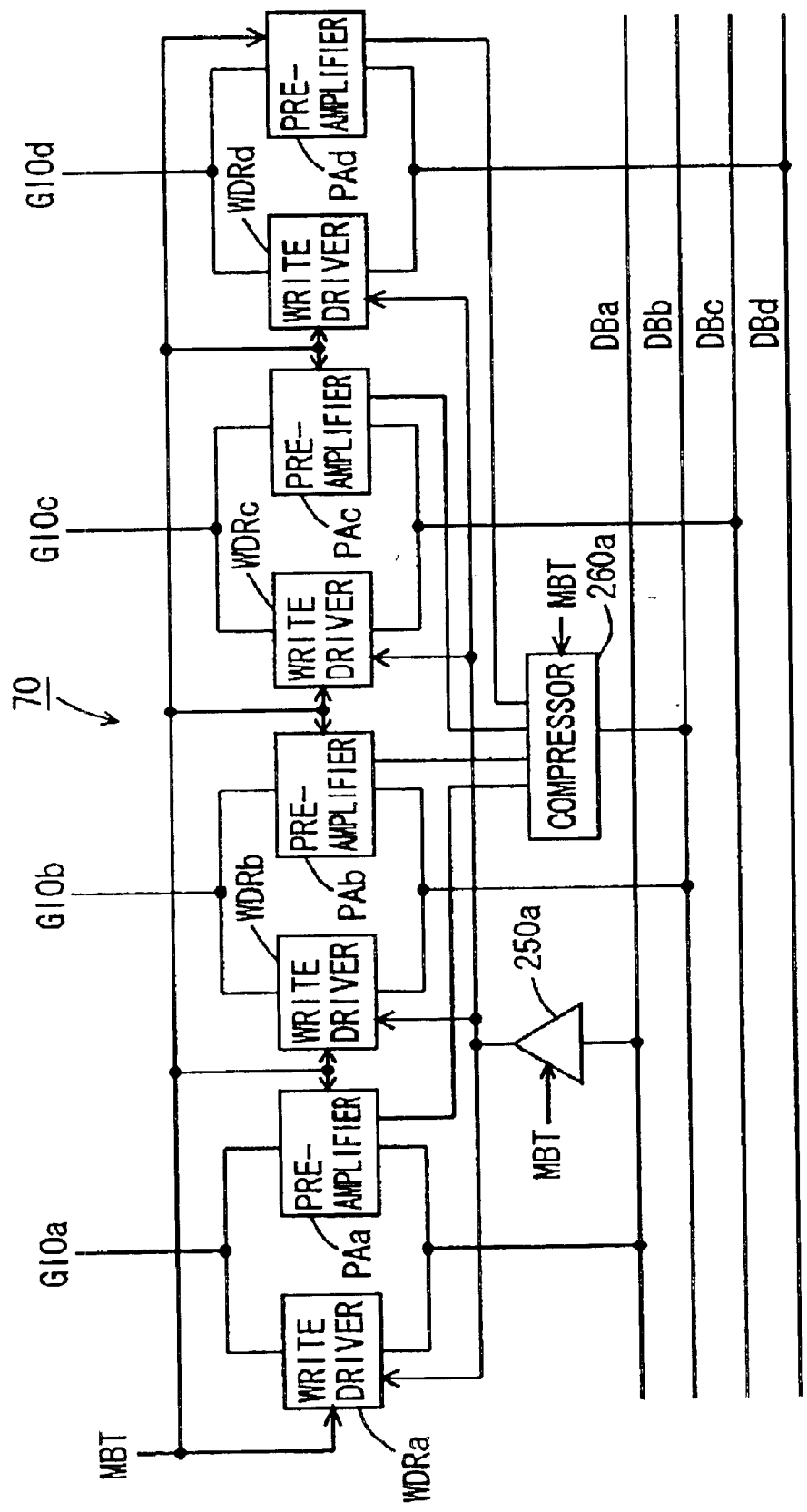
FIG. 58 shows the configuration of an internal write/read circuit shown in FIG. 57 more specifically.

FIG. 58 shows the configuration of internal write/read circuit 70, expansion circuit 250 and compression circuit 260 shown in FIG. 57 more specifically. FIG. 58 shows a section related to global data lines GIOa to GIOd for transmitting 4-bit data. To simplify the description, the configuration of a multi-bit test for a word structure of ×32 bits will be described. However, the configuration for multi-bit tests in a word structure of ×16 bits and that of ×8 bits can be similarly implemented by arranging expansion/compression circuits to the multiplexers selecting data bits in accordance with the word structure.

Internal write/read circuit 70 includes write drivers WDRa to WDRd and preamplifiers PAa to PAd provided corresponding to global data lines GIOa to GIOd, respectively. In a normal operation mode, write driver WDRa and preamplifier PAa transfer data to internal data bus line DBa. In a normal operation mode, write driver WDRb and preamplifier PAb transfer data to internal data bus line DBb. In a normal operation mode, write driver WDRc and preamplifier PAc transfer data to internal data bus line DBc. In a normal operation mode, write driver WDRd and preamplifier PAd transfer data to internal data bus line DBd.

Expansion circuit 250 includes a test write driver 250a which buffers data on internal data bus line DBa and transfer the buffered data to write drivers WDRa to WDRd in common when multi-bit test mode instruction signal MBT is active. Compression circuit 260 includes a compressor 260a which compresses (degenerates) data from preamplifiers PAa to PAd to 1-bit data for transmission to internal data bus line DBb when multi-bit test mode instruction signal MBT is active.

In a multi-bit test mode, therefore, through test write driver 250a, data of the same logical level are transferred to write drivers WDRa to WDRd, which in turn transfer data of the same logical level to global data lines GIOa to GIOd. In data reading mode, data from selected memory cells transferred to global data lines GIOa to GIOd are amplified by preamplifiers PAa to PAd and transferred to compressor 260a. Compressor 260a generates a signal indicating the coincidence/non-coincidence of the logical levels of these received data, onto internal data bus line DBb. Only test write driver 250a and compressor 260a are connected to internal data bus lines DBa and DBb, respectively. It is, therefore, possible to decrease the loads of internal data bus lines DBa and DBb and to transfer data at high speed.

Figure 59:
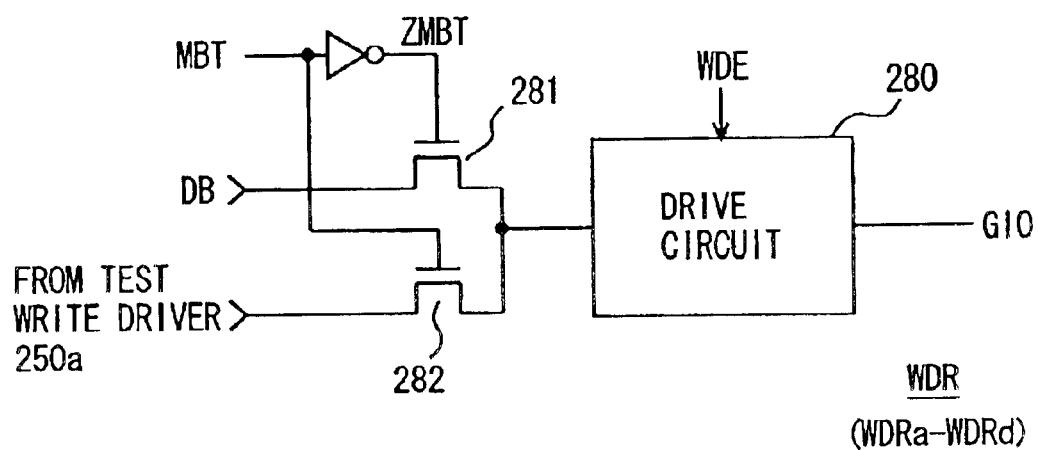
FIG. 59 shows an example of the configuration of a write driver shown in FIG. 58.

FIG. 59 shows an example of the configuration of write drivers WDRa to WDRd shown in FIG. 58. Since write drivers WDRa to WDRd are the same in configuration, FIG. 59 representatively shows the configuration of write driver WDR provided to global data line GIO.

In FIG. 59, write driver WDR includes a drive circuit 280 which drives global data line GIO in accordance with applied data when a write driver enable signal WDE is active, a transfer gate 281 which is rendered conductive when an inversion signal ZMBT of multi-bit test mode instruction signal MBT is at H level and couples corresponding internal data bus line DB to drive circuit 208 when made conductive, and a transfer gate 282 which is rendered conductive when multi-bit test mode instruction signal MBT is active and transmits the output signal of test write driver 250a to drive circuit 280 when made conductive.

In a normal operation mode, multi-bit test mode instruction signal MBT is at L level, transfer gate 281 is conductive and transfer gate 282 is nonconductive. Therefore, drive circuit 280 drives corresponding global data line GIO in accordance with the data on corresponding internal data bus line DB in accordance with write driver enable signal WDE.

In the multi-bit test mode, multi-bit test mode instruction signal MBT is at H level, transfer gate 281 is nonconductive, transfer gate 282 is nonconductive, and drive circuit 280 drives global data line GIO in accordance with test write data from test write driver 250a.

Test write driver 250a may be a bus drive circuit that drives an internal data bus line. In this case, test write driver 250a drives internal data lines DBa to DBd of 4 bits in accordance with test data from a corresponding input circuit. This bus drive circuit may also be a bus driver arranged corresponding to each of internal data bus lines DBa to DBd. In the multi-bit test mode, common test data from one input buffer circuit is transferred to these bus drivers and the bus drivers drive corresponding internal data bus lines DBa to DBd in accordance with the transferred test data.

Figure 60:
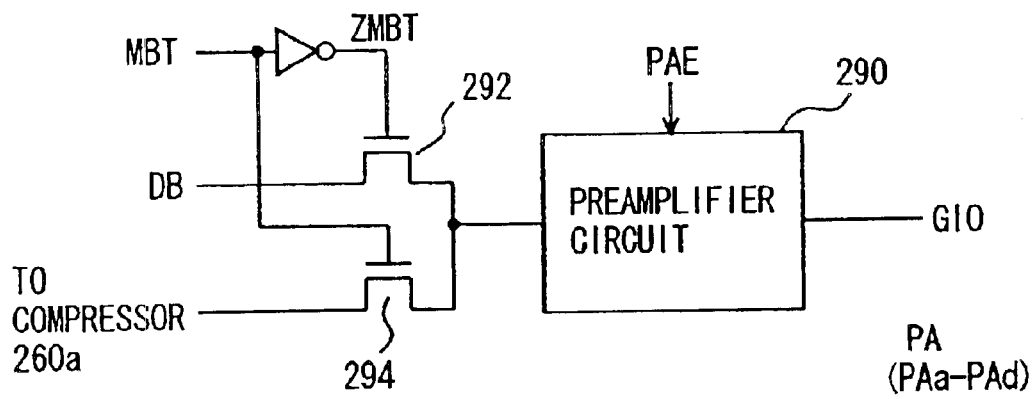
FIG. 60 shows an example of the configuration of a preamplifier shown in FIG. 58.

FIG. 60 is a schematic diagram showing an example of the configuration of preamplifiers PAa to PAd shown in FIG. 58. Since preamplifiers PAa to PAd are the same in configuration, FIG. 60 representatively shows preamplifier PA provided for global data line GIO.

In FIG. 60, preamplifier PA includes a preamplifier circuit 290 which amplifies data on corresponding global data line GIO in response to activation of preamplifier activation signal PAE, a transfer gate 292 which is rendered conductive, when multi-bit test mode instruction signal MBT attains L level and a complementary multi-bit test mode instruction signal ZMBT is activated, to couple preamplifier circuit 290 to corresponding internal data bus line DB, and a transfer gate 294 which is rendered conductive, when multi-bit test mode instruction signal MBT is at H level to connect the output of preamplifier circuit 290 to compressor 260a.

In the configuration of preamplifier PA shown in FIG. 60, in a normal operation mode, preamplifier circuit 290 is coupled to corresponding internal data bus line DB. In the multi-bit test mode, the output signal of preamplifier circuit 290 is transmitted to compressor 260a and preamplifier circuit 290 is disconnected from corresponding internal data bus line DB. By disconnecting preamplifier circuit 290 from corresponding internal data bus line DB in the multi-bit test mode, it is possible to fix the internal data bus lines, adjacent to the internal data bus line transferring data indicating a compression result, to the ground voltage level and to utilize these adjacent internal data bus lines as shield lines the configuration of which will be described later).

Figure 61:
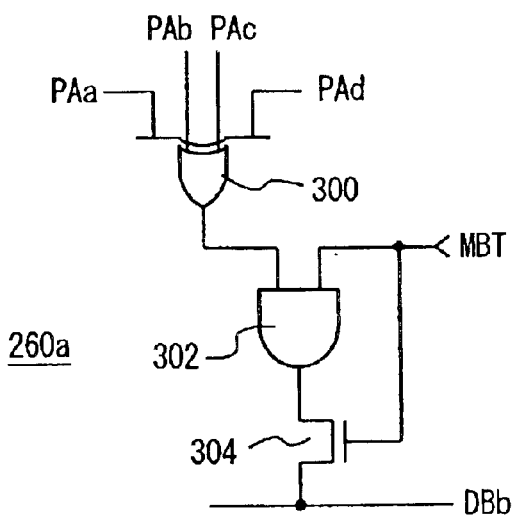
FIG. 61 shows an example of the configuration of a compressor shown in FIG. 58.

FIG. 61 shows an example of the configuration of compressor 260a shown in FIG. 58. In FIG. 61, compressor 260a includes a non-coincidence detection circuit (EXOR circuit) 300 that receives the output signals of preamplifiers PAa to PAd in the multi-bit test mode, an AND circuit 302 that receives multi-bit test mode instruction signal MBT and the output signal of non-coincidence detection circuit 300, and a transfer gate 304 that is rendered conductive when multi-bit test mode instruction signal MBT is active (at H level), to transmit an output signal of AND circuit 302 to internal data bus line DBb.

In a normal operation mode, multi-bit test mode instruction signal MBT is at L level, transfer gate 304 is nonconductive and the output signal of compressor 260a is not transmitted to internal data bus line DBb.

When multi-bit test mode instruction signal MBT attains H level, transfer gate 304 turns conductive and the output signal of AND circuit 302 is transmitted to internal data bus line DBb. Further, as shown in FIG. 60, the output of preamplifier PA is connected to compressor 260a while being disconnected from the corresponding data bus line.

In data write, the output signals of preamplifiers PAa to PAd are all set in a standby state of, for example, H level, the output signal of non-coincidence detection circuit 300 is at L level, and the output signal of AND circuit 302 attains L level, accordingly. Therefore, internal data bus line DBb is fixed to L level when writing test data in the multi-bit test mode.

In the multi-bit test mode, when compression result data is read, the output signals of preamplifiers PAa to PAd are transmitted to non-coincidence detection circuit 300. If the logical levels of the output signals of preamplifiers PAa to PAd are the same, the output signal of non-coincidence detection circuit 300 is at L level and the output signal of AND circuit 302 is kept at L level, accordingly. On the other hand, if the output signals of preamplifiers PAa to PAd include both an H-level signal and an L-level signal, the output signal of non-coincidence detection circuit 300 attains H level and the output signal of AND circuit 302 turns H level, accordingly. It is thereby possible to transmit the data indicating 4-bit data compression result to internal data bus line DBb.

When multi-bit test mode instruction signal MBT is at L level, preamplifier PA is coupled to the corresponding data bus line as shown in FIG. 60 and an input signal to compressor 260a becomes uncertain. However, the output signal of AND gate 302 is fixed to L level and transfer gate 304 is set nonconductive. Thus, no problem occurs in the normal operation mode. In write driver WDR, drive circuit 280 is coupled to a corresponding data bus line as shown in FIG. 59. Therefore, write driver WDR can accurately drive the corresponding global data line in accordance with write data.

Figure 62:
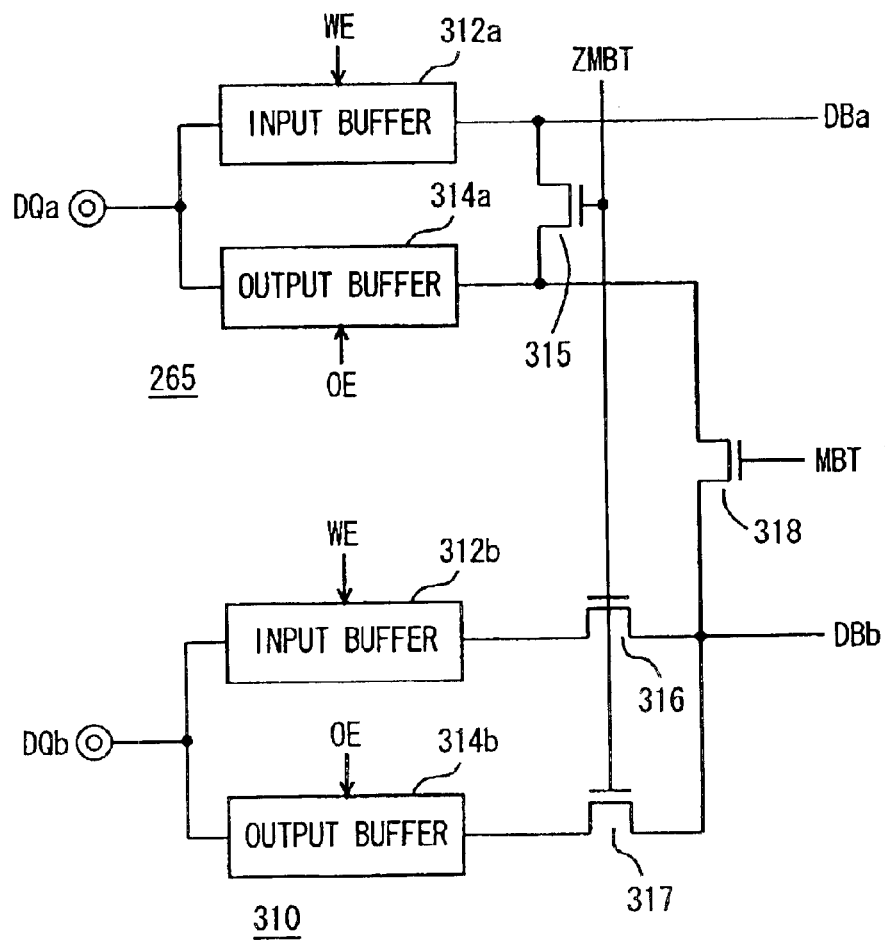
FIG. 62 shows an example of the configuration of a data input/output section of the semiconductor circuit device in the ninth embodiment according to the present invention.

FIG. 62 is a schematic diagram showing the configuration of input/output circuit 265 and an input/output circuit 310 corresponding to internal data bus line DBb, shown in FIG. 57.

In FIG. 62, input/output circuit 265 includes an input buffer 312a which is activated, when a write operation instruction signal WE is active, to generate internal write data in accordance with data DQa applied to a data input node, an output buffer 314a which is activated, when a read operation activation signal OE is active, to buffer an applied data to generate read data DQa, and a transfer gate 315 which connects the input of output buffer 314a to the output of input buffer 312a in accordance with complementary multi-bit test mode instruction signal ZMBT.

Input buffer 312a generates internal write data in accordance with data DQa and drives internal data bus line DBa in the normal operation mode and the multi-bit test mode. In the normal operation mode, multi-bit test mode instruction signal ZMBT is at H level, transfer gate 315 is conductive, the input of output buffer 314a is connected to internal data bus line DBa, and external read data DQa is generated in accordance with the data transferred onto internal data bus line DBa.

Input/output circuit 310 includes an input buffer 312b which generates internal write data in accordance with external data bit DQb in response to activation of write operation instruction signal WE, an output buffer 314b which is activated, in response to the activation of read operation instruction signal OE, to buffer data applied thereto for generating external read data DQb, and transfer gates 316 and 317 which are rendered conductive, when multi-bit test mode instruction signal ZMBT is inactive (at H level), to couple the output of input buffer 312a and the input of output buffer 314b to internal data bus line DBb.

In the multi-bit test mode, complementary multi-bit test mode instruction signal ZMBT is at L level, transfer gates 316 and 317 are nonconductive, and input buffer 312b and output buffer 314b are disconnected from internal data bus line DBb.

A transfer gate 318 which is rendered conductive when multi-bit test mode instruction signal MBT is active, to connect output buffer 314a to internal data bus line DBb, is provided to output a multi-bit test result.

In the normal operation mode, multi-bit test mode instruction signal MBT is at L level and output buffer 314a is disconnected from internal data bus line DBb. In the multi-bit test mode, multi-bit test mode instruction signal MBT is at H level, transfer gate 318 is conductive, and the compression result data transferred onto internal data bus line DBb is transmitted to output buffer 314a and outputted as read data DQa.

Therefore, even if the write data and the compression result data during the multi-bit test mode are transferred using the same pad, it is possible to transfer the multi-bit test write data and the compression result data through different data bus lines.

As described above, according to the ninth embodiment of the present invention, the test write data and the compression result data are transferred through different internal data bus lines in the multi-bit test mode. It is, therefore, possible to distribute the loads of the internal data bus lines and to transfer data at high speed in the normal operation mode.

Tenth Embodiment

Figure 63:
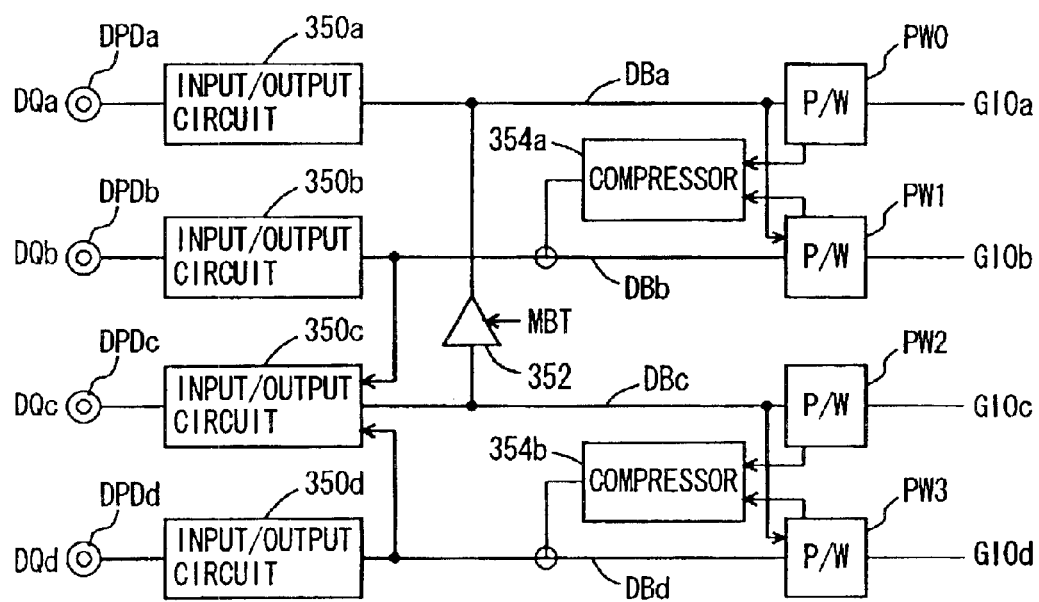
FIG. 63 is a schematic diagram showing the configuration of a main portion of a semiconductor circuit device in the tenth embodiment according to the present invention.

FIG. 63 is a schematic diagram showing the configuration of a main portion of a semiconductor memory device in the tenth embodiment according to the present invention. FIG. 63 shows the configuration of a portion related to data terminals DPDa to DPDd. Input/output circuits 350a to 350d are provided corresponding to data terminals DPDa to DPDd, respectively. Input/output circuits 350a to 350d are connected to internal data bus lines DBa to DBd, respectively. Internal data bus lines DBa to DBd are coupled to global data lines GIOa to GIOd through preamplifiers/write drivers PW0 to PW3, respectively.

A test write driver 352 that drives internal data bus line DBa in accordance with data on internal data bus line DBc when multi-bit test mode instruction signal MBT is active, a compressor 354a that compresses the output signals of the preamplifier circuits of preamplifiers/write drivers PW0 and PW1 and outputs a compression result onto internal data bus line DBb, and a compressor 354b that compresses the output signals of the preamplifier circuits of preamplifiers/write drivers PW2 and PW3 and outputs a compression result onto internal data bus line DBd, are provided so as to perform a multi-bit test. In addition, internal data bus line DBa is connected to the write driver of preamplifier/write driver PW1 and internal data bus line DBc is coupled to the write driver of preamplifier/write driver PW3.

Preamplifiers/write drivers PW1 and PW3 are the same in configuration as the write driver shown in FIG. 59. Internal data bus lines DBa and DBc are directly connected to the write drivers of preamplifiers/write drivers PW0 and PW2, respectively. Alternatively, the write drivers of preamplifiers/write drivers PW0 and PW2 may be made the same in configuration as the write driver shown in FIG. 49.

The preamplifiers of preamplifiers/write drivers PW0 to PW3 are the same in configuration as the preamplifier circuit shown in FIG. 60.

Compressors 354a and 354b are the same in configuration as compressor 260a shown in FIG. 61 except that a 2-input non-coincidence detection circuit is used in place of the 4-input non-coincidence detection circuit in each of compressors 354a and 354b.

Figure 64:
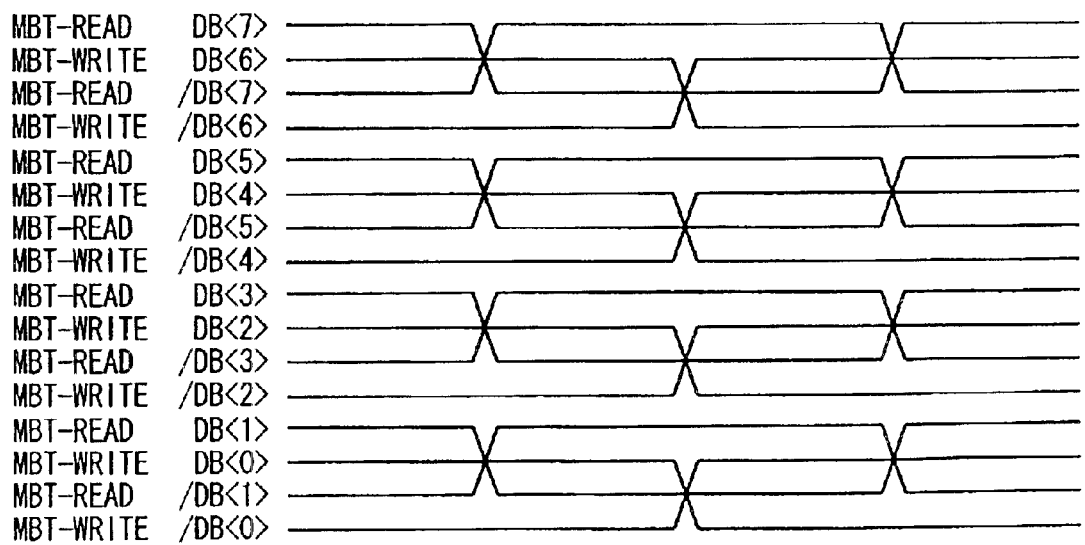
FIG. 64 concretely represents the relationship between an internal data bus and transfer data with the configuration shown in FIG. 63.

In the configuration shown in FIG. 63, internal data bus lines for transmitting test write data and those for transmitting data indicating a compression result are alternately arranged as shown in FIG. 64. In FIG. 64, complementary data line pair DB<i> and /DB<i> of internal data bus lines DB0 to DB7 are shown, where i is any of 0 t 7.

Internal data bus lines DB<0>, /DB<0> to DB<7>, /DB<7> are formed into a twisted structure. The adjacent internal data bus line pairs have crossing portions at different positions. In 2-bit internal data bus lines, data bus lines of 1-bit data is arranged between data bus lines of other 1-bit data. Namely, in FIG. 64, internal data bus line DB<6> or /DB<6> is arranged between internal data bus lines DB<7> and /DB<7> and internal data bus line DB<7> or /DB<7> is arranged between internal data bus lines DB<6> and /DB<6>.

Compression result data is transferred to the odd-numbered internal data bus lines and test write data is transferred to the even-numbered internal data bus lines. That is, in FIG. 64, test write data is transferred to internal data bus lines DB<2k> and /DB<2k> and compression result data is transferred to internal data bus lines DB<2k+1> and /DB<2k+1>, where k is any of 0 to 3.

During the transfer of the test write data, therefore, the data bus lines for transmitting the compression result function as shield lines. During the read of the compression result data, the data bus lines for transmitting the test write data function as shield lines.

For a configuration in which even-numbered internal data lines are driven to the ground level in transference of a compression result data in the multi-bit test, the following configuration may be sufficient. In the arrangement as shown in FIG. 63, test write driver 352 is activated, irrespectively of data read and data write mode, in activation of multi-bit test mode instruction signal MBT. In input/output circuit 350c, the input buffer is configured to transmit the ground voltage to a complementary data line of corresponding internal data lines in data read mode in the multi-bit test mode.

Figures 65, 66:
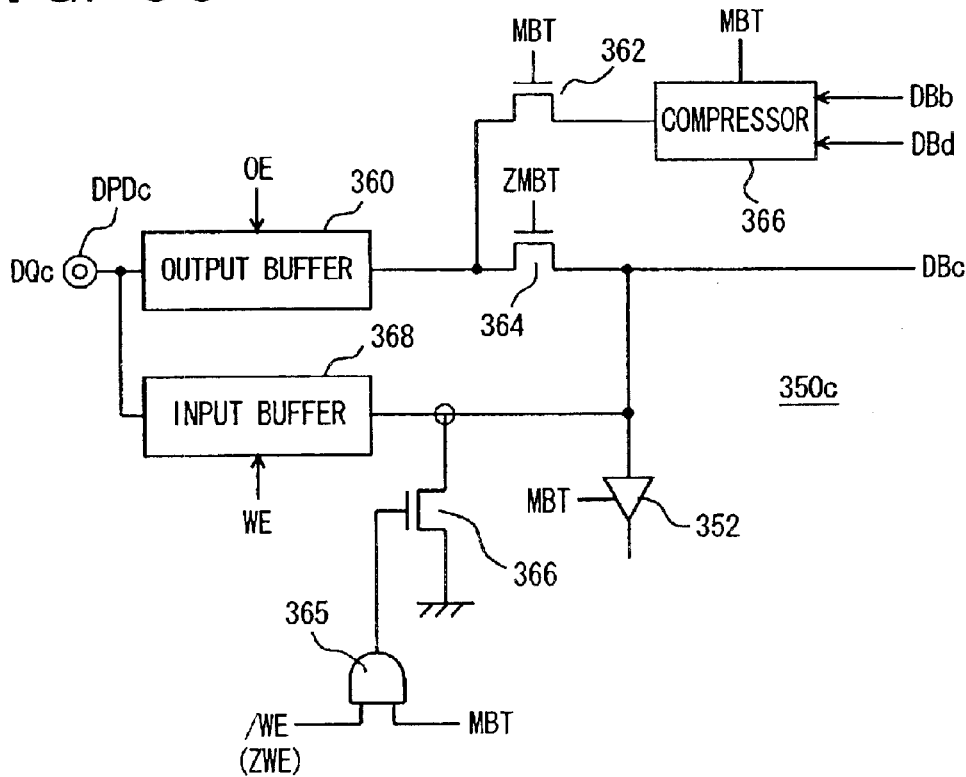
FIG. 65 is a schematic diagram showing the configuration of the important parts of a semiconductor circuit device in a modification of the tenth embodiment according to the present invention.
FIG. 66 concretely shows the relationship between an internal data bus line and multi-bit test transfer data with the configuration shown in FIG. 65.

FIG. 65 is a schematic diagram showing the configuration of the output circuit of input/output circuit 350c shown in FIG. 63. In FIG. 65, input/output circuit 350c includes an output buffer 360 that buffers data applied thereto and outputs the buffered data to a data pad DPDc when read operation instruction signal OE is activated, an input buffer 368 that generates internal write data in accordance with the data applied to data pad DPDc when write operation instruction signal WE is activated, a compressor 366 that compresses data on internal data bus lines DBb and DBd when multi-bit test mode instruction signal MBT is activated, a transfer gate 362 that is rendered conductive when multi-bit test mode instruction signal MBT is activated to transmit the output signal of compressor 366 to output buffer 360, a transfer gate 364 that is rendered conductive when complementary multi-bit test mode instruction signal ZMBT is activated, to connect output buffer 360 to internal data bus line DBc, an AND circuit 365 that receives multi-bit test mode instruction signal MBT and complementary write operation instruction signal /WE (=ZWE), and a transfer gate 366 that is rendered conductive when the output signal of AND gate 365 is at H level, to maintain internal data bus line DBc at the ground voltage level. Test write driver 352 is coupled to internal data bus line DBc.

Compressor 366 differs in configuration from compressor 260a shown in FIG. 61 in the following points. A 2-input non-coincidence detection circuit is used in place of the 4-input non-coincidence detection circuit and no transfer gate is used. Transfer gate 304 shown in FIG. 61 corresponds to transfer gate 362 in the arrangement shown in FIG. 65.

In a normal operation mode, multi-bit test mode instruction signal MBT is at L level and output buffer 360 is coupled to internal data bus line DBc through transfer gate 364. Input buffer 368 is also coupled to internal data bus line DBc. In the normal operation mode, the output signal of AND gate 365 is at L level and transfer gate 366 is nonconductive. Therefore, internal data bus line DBc is driven in accordance with data bit DQc applied to data pad DPDc, and data pad DPDc is driven by output buffer 360 in accordance with the data transferred onto internal data line DBc.

In a multi-bit test mode, transfer gate 364 is nonconductive and transfer gate 362 is conductive. During data write in the multi-bit test mode, write operation instruction signal /WE is at L level, the output signal of AND gate 365 is at L level, accordingly, and transfer gate 366 is nonconductive.

In this state, input buffer 368 drives internal data bus line DBc in accordance with test write data DQc applied to data pad DPDc. In addition, test write driver 352 drives internal data bus line DBa shown in FIG. 63 in accordance with the data on internal data bus line DBc.

During data write in the multi-bit test mode, the output signal of AND gate 365 is at H level and internal data bus line DBc is fixed to the ground voltage level. Further, data bus line DBa is kept at the ground voltage level by test write driver 352.

In this state, compressor 366 performs a compressing operation in accordance with the data on internal data bus lines DBb and DBd, and transmits a compression result to output buffer 360 through transfer gate 362. Output buffer 360 drives data pad DPDc in accordance with the compression result data applied thereto.

With the configuration shown in FIG. 63, expansion/compression operations are performed for each 2 bits. In the compression operation, in particular, a compressing operation is repeated in 2-bit basis, whereby the output load of the compressor can be distributed to data bus lines DBb and DBd and the load of the data bus lines can be decreased. Specifically, even if the configuration of compressor 260a shown in FIG. 61 is used, the 4-input, 1-output non-coincidence detection circuit is heavier in output load than the 2-input, 1-output non-coincidence detection circuit, and therefore, it is required to make the size of AND circuit 302 large accordingly (for high-rate driving in accordance with input capacitance). Accordingly, the size of transfer gate 304 becomes large. However, by using the 2-input, 1-output non-coincidence detection circuit, it is possible to decrease the size of each component, to decrease the size of each transfer gate, accordingly, to thereby decrease the loads of the data bus.

Further, by transmitting the data on data bus line DBc to other internal data bus line DBa through test write driver 352, it is possible to write test data and normal data using the same write drivers (including a bus driver to be described later) in the normal operation mode and the multi-bit test operation mode. Therefore, it is unnecessary to arrange test-dedicated drivers to decrease the layout area of the circuits.

FIG. 66 shows, in a list form, data bits transferred through internal data buses DB<15:0> in the multi-bit test mode. In FIG. 66, in the normal operation mode, data bits DQ<15:0> applied to data pads DPD<15:0> are transmitted to internal data bus lines DB<15:0> in a one-to-one correspondence. In the multi-bit test mode, test data is inputted and outputted through terminals corresponding to data bits DQ<2>, DQ<6>, DQ<9> and DQ<13>.

In data read (TMBT read) in the multi-bit test mode, compressed data appearing on data bus lines DB<1> and DB<3> are further compressed to be outputted as data bit DQ<2>. Compressed data appearing on data bus lines DB<5> and DB<7> are further compressed to be outputted as data bit DQ<6>. Compressed data appearing on data bus lines DB<8> and DB<10> are further compressed to be outputted as data bit DQ<9>. Compressed data appearing on data bus lines DB<12> and DB<14> are further compressed to be outputted as data bit DQ<13>

In data write in the multi-bit test mode, internal data bus lines DB<0> and DB<2> are driven in accordance with data bit DQ<2>. Internal data bus lines DB<4> and DB<6> are driven in accordance with data bit DQ<6>. Internal data bus lines DB<9> and DB<11> are driven in accordance with data bit DQ<9>. Internal data bus lines DB<13> and DB<15> are driven in accordance with data bit DQ<13>.

On data bus DB<7:0>, compressed data are outputted to the odd-numbered internal data bus lines and test write data are transmitted to the even-numbered internal data bus lines. In contrast, on data bus DB<15:8>, compressed data are outputted to the even-numbered internal data bus lines and test write data are transmitted to the odd-numbered internal data bus lines. This reason why bus lines for transmitting compressed data and bus lines for transmitting test write data are exchanged in odd and even between the data buses is that the data bus lines are arranged symmetrically between data bus DB<7:0> and data bus Db<15:8> (see FIG. 55). In this case as well, internal data buses DB<7:0> and DB<15:8> are arranged being away from each other upon assembly in BGP as shown in FIG. 55. On the 8-bit data bus, one of the adjacent internal data bus lines transfers test write data and the other transfers compression result data. Upon assembly in TSOP with a word structure of ×16 bits or ×8 bits, internal data buses DB<23:16> and DB<31:24> are used. Among internal data buses DB<23:16> and DB<31:24>, the relationship of the data transferred by the internal data bus lines is maintained.

With any configuration, one of the write data and the compression result data (read data) is transferred to an internal data bus line in the multi-bit test mode of operation. One of the adjacent internal data lines transfers the compression result data and the other transfers the test write data.

Furthermore, with the bus arrangement shown in FIG. 67, the compression result data is transferred to internal data lines DB<7> and DB<8> in the multi-bit test mode. However, as shown in FIGS. 33 and 55, for example, internal data buses DB<7:0> and DB<15:8> are arranged away from each other. The internal data bus arranged adjacently to internal data bus DB<7:0> is data bus DB<23:16> and the bus for transferring the compression result data and the bus for transferring test result and test write data are arranged adjacent to each other.

However, in a general semiconductor memory device, if 16-bit internal data bus DB<15:0> is arranged extending linearly and the internal data bus lines of internal data bus DB<15:0> are arranged adjacently, the arrangement order of the internal data bus lines DB<15:8> are changed and data bus line DB<15> is arranged adjacently to internal data bus line DB<7>. According to such bus arrangement, it is possible to alternately arrange the bus lines for transferring the write data and the compression result data in the multi-bit test mode.

As described above, according to the tenth embodiment of the present invention, the bus line for transferring the test write data and the bus line for transferring the compression result data are separately arranged and are alternately arranged in the multi-bit test mode. It is, therefore, possible to suppress noise caused the capacitance coupling between data bus lines, to accurately transfer test data.

Further, the test write data is transferred from a bus line corresponding to an input buffer receiving an external multi-bit write data to a different bus line. It is, therefore, possible to commonly use the circuit structure for generating the test write data through the expansion operation in both the normal operation mode and the multi-bit test mode (if the bus drive circuit is provided, this bus drive circuit can be commonly used in both the normal operation mode and the multi-bit test mode). It is thereby possible to decrease the layout area of the circuits.

Furthermore, by alternately arranging the test write data transfer bus line and the compression result data transfer bus line, it is possible to execute the compression operation over a plurality of stages, to decrease the output capacitance of each compression circuit, to decrease the loads of bus lines, accordingly.

Moreover, since the expansion circuit and the compression circuit can be arranged being distributed over bus lines, it is possible to make the loads of the bus lines equable.

Eleventh Embodiment

Figure 68:
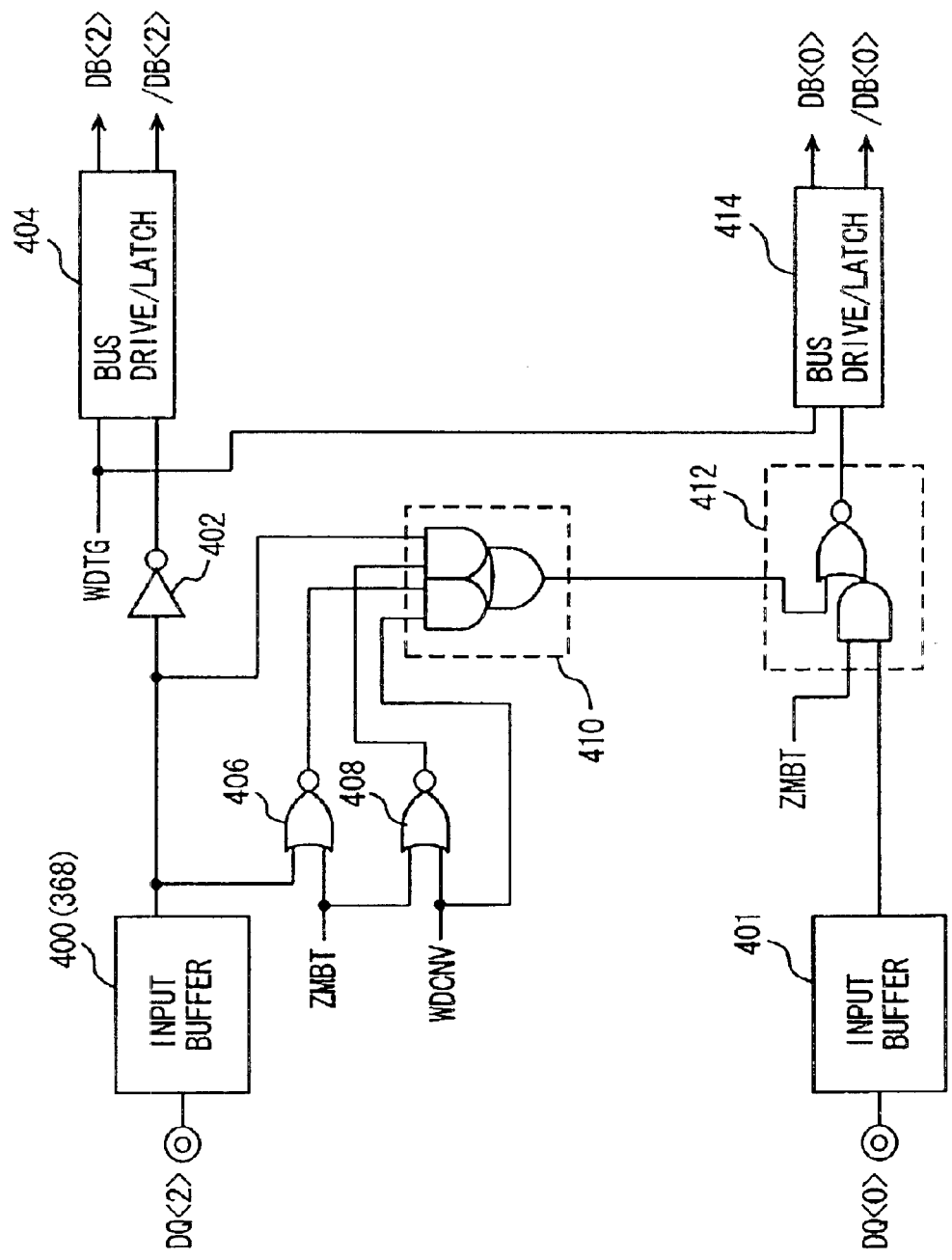
FIG. 68 is a schematic diagram showing the configuration of a main portion of a semiconductor circuit device in the eleventh embodiment according to the present invention.

FIG. 68 is a schematic diagram showing the configuration of the data input section of a semiconductor memory device in the eleventh embodiment according to the present invention. FIG. 68 representatively shows a part of the circuitry which inputs/outputs data bits DQ<0> and DQ<2>.

In FIG. 68, input buffers 400 and 401 are provided corresponding to data bits DQ<0> and DQ<2>, respectively. The output signal of input buffer 400 is applied to a bus drive/latch 409 through an inverter buffer 402. Bus drive/latch 404 generates a complementary write signal from the signal applied from inverter buffer 402 and drives internal data bus lines DB<2> and /DB<2> when a write data trigger signal WDTG is activated. Buffer 400 corresponds to input buffer 368 shown in FIG. 65. In addition, a pair of internal data bus lines DB<2> and /DB<2> corresponds to internal data bus line DB2.

As a configuration corresponding to test write driver 352 shown in FIG. 65, there provided a NOR circuit 406 which receives the output signal of input buffer 400 and complementary multi-bit test mode instruction signal ZMBT, a NOR circuit 408 which receives complementary multi-bit test mode instruction signal ZMBT and a test write data inversion instruction signal WDCNV, and a composite gate 410 which receives the output signals of NOR circuits 406 and 408 and the output signal of input buffer 400.

Composite gate 410 equivalently includes an AND gate which receives test write data inversion instruction signal WDCNV and the output signal of NOR circuit 406, an AND gate which receives the output signal of NOR circuit 408 and that of input buffer 400, and an OR gate which receives the output signals of these AND gates. Composite gate 410 outputs an L-level signal in a normal operation mode during which complementary multi-bit test mode instruction signal ZMBT is at H level since the output signals of both NOR circuits 406 and 408 are at L level.

In a multi-bit test mode during which complementary multi-bit test mode instruction signal ZMBT is at L level, NOR circuits 406 and 408 each operate as an inverter. If test write data inversion instruction signal WDCNV is at H level to indicate the inversion of test write data, the output signal of NOR circuit 408 is at L level and the data corresponding to the data transmitted from input buffer 400 through NOR circuit 406 is outputted from composite gate 410. That is, in the multi-bit test mode, if test write data inversion instruction signal WDCNV is at H level, the inversion signal of the output data of input buffer 400 is transmitted from composite gate 410.

In the multi-bit test mode, if test write data inversion instruction signal WDCNV is at L level, the output signal of NOR circuit 408 is at H level and the signal corresponding to the output data of input buffer 400 is outputted from composite gate 410.

The output signal of input buffer 401 is transmitted to bus drive/latch 414 through a composite gate 412. Composite gate 412 equivalently includes an AND gate which receives complementary multi-bit test mode instruction signal ZMBT and the output signal of input buffer 401, and a NOR gate which receives the output signals of the AND gate and composite gate 410.

Bus drive/latch 414 takes in and latches the data applied thereto in response to activation of write data trigger signal WDTG and drives internal data bus lines DB<0> and /DB<0>. Internal data bus lines DB<0> and /DB<0>correspond to internal data bus line DB0.

In the normal operation mode, since complementary multi-bit test mode instruction signal ZMBT is at H level and the output signal of composite gate 410 is at L level, composite gate 412 inverts the output signal of input buffer 401 and transmits the inverted signal to bus drive/latch 414.

On the other hand, if the complementary multi-bit test mode instruction signal ZMBT is at L level to indicate a multi-bit test mode, composite gate 412 inverts the output signal of composite gate 410 and transmits the inverted signal to bus drive/latch 414.

Specifically, in the multi-bit test mode, if test write data inversion instruction signal WDCNV is at H level, the output signals of inverter buffer 402 and composite gate 412 are complementary to each other in logic level. If test write data inversion instruction signal WDCNV is at L level, the logical levels of the output signals of inverter buffer 402 and composite gate 412 are equal to each other.

Figure 69:
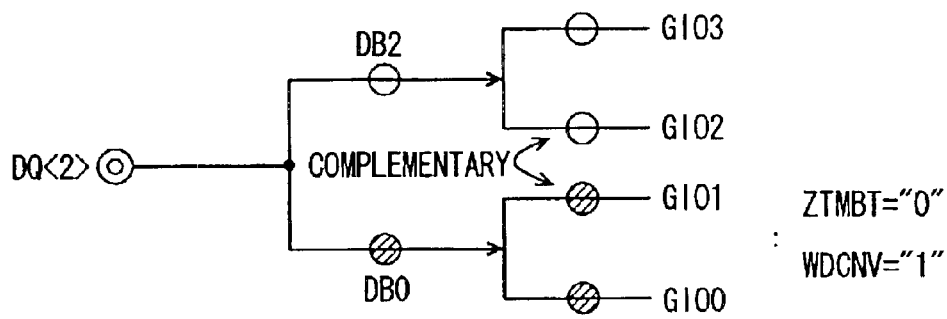
FIG. 69 is a schematic diagram representing the correspondence between test data and data written to a memory cell in the eleventh embodiment according to the present invention.

Therefore, as shown in FIG. 69, in the multi-bit test mode, if test write data inversion instruction signal WDCNV is "1 (at H level)", complementary data are transmitted to internal data bus lines DB2 and DB0 in accordance with data bit DQ<2>, respectively. When bus drive/latches 404 and 414 invert the data applied thereto and drive corresponding internal data bus lines DB0 and DB2, respectively, data of the same logical level as that of test write data DQ<2> is transferred to internal data bus line DB0 and the inverted data of test write data DQ<2> is transferred to internal data bus line DB2.

In the multi-bit test mode, global data lines GIO2 and GIO3 are driven in accordance with the data on internal data bus line DB2 and global lines GIO0 and GIO1 are driven in accordance with the data on internal data bus line DB0. Therefore, the test write data transmitted to global data lines GIO0 and GIO1 is complementary in logic level to the test write data transmitted to global data lines GIO2 and GIO3.

Accordingly, if global data lines GIO0 to GIO3 are arranged corresponding to adjacent memory cells, it is possible to write a checker pattern with the logical level of the storage data inverted in 2-bit units in the multi-bit test mode. In addition, if global data lines GIO0 and GIO2 are coupled to memory cells in the upper block and global data lines GIO1 and GIO3 are connected to memory cells in the lower block, it is possible to write data of different logical levels to the adjacent memory cells in the each memory block. Thus, test on bit line interference can be performed. The correspondence between the global data lines and the internal data bus lines may be sufficient to be appropriately set.

In the multi-bit test mode, if test write data inversion instruction signal WDCNV is "0 (at L level)", composite gate 410 generates and applies a signal, the same in logical level as the output signal of input buffer 400, to composite gate 412. Therefore, the signals of the same logical level are outputted from inverter buffer 402 and composite gate 412.

Figure 70:
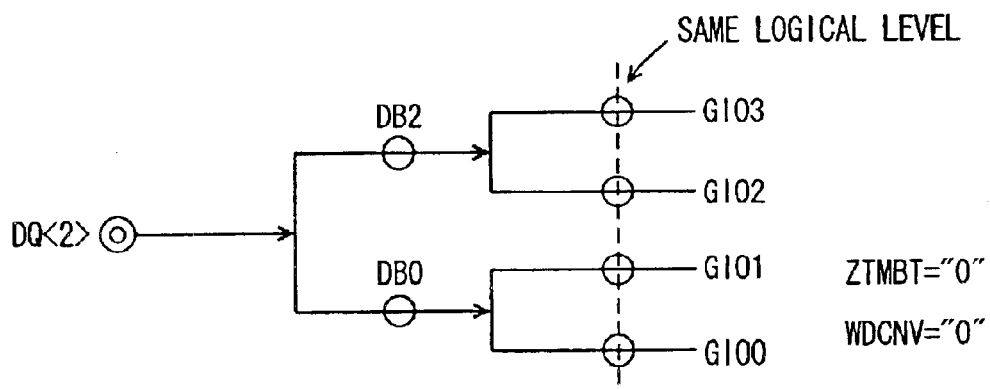
FIG. 70 is a schematic diagram representing the correspondence between test data and data written to a memory cell in the eleventh embodiment according to the present invention.

In this case, the data of the same logical level is transmitted to internal data bus lines DB2 and DB0 and data of the same logical level is transferred to global data lines DIO0 to GIO3, accordingly, as shown in FIG. 70.

In the normal operation mode, complementary multi-bit test mode instruction signal ZMBT is at H level, the output signal of composite gate 410 is at L level and composite gate 412 operates as an inverter. Therefore, input buffers 400 and 401 generate internal write data in accordance with data bits DQ<2> and DQ<0> externally applied and apply the generated internal write data to bus drives/latches 404 and 414, respectively.

Figure 71:
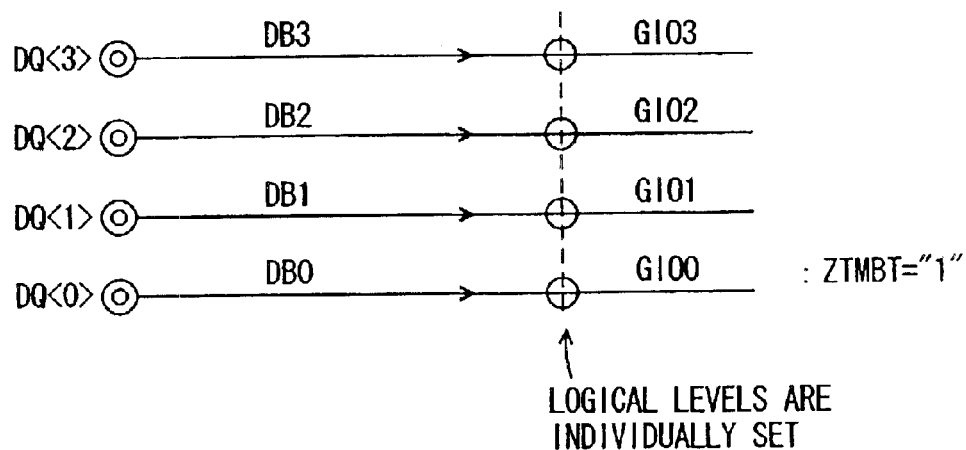
FIG. 71 is a schematic diagram showing the correspondence between write data and external data in a normal operation mode in the eleventh embodiment according to the present invention.
Figure 72:
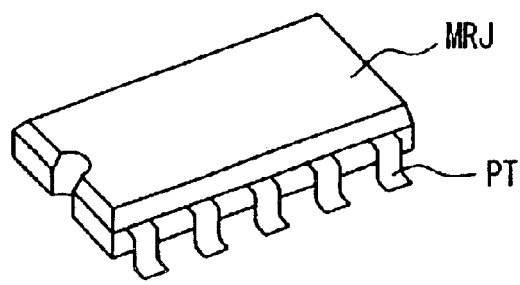
FIG. 72 is a schematic diagram showing the configuration of a conventional single chip package.
Figure 73:
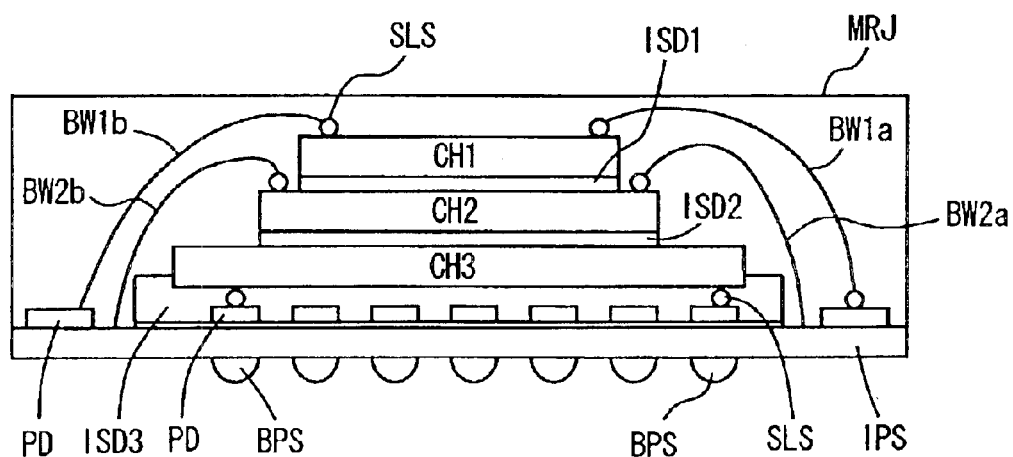
FIG. 73 is a schematic diagram showing the arrangement of chips assembled in a conventional multi chip package.
Figure 74:
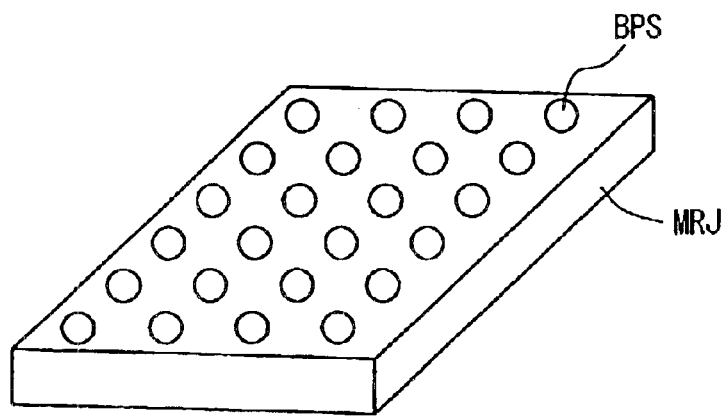
FIG. 74 is a schematic diagram showing the arrangement of data terminals of the multi chip package shown in FIG. 73.

In this normal operation mode, therefore, internal data bus lines DB0 to DB3 are driven in accordance with external write data bits DQ<0> to DQ<3>, respectively and data having the logical levels set by external write data bits DQ<0> to DQ<3> are transferred to global data lines GIO0 to GIO3, accordingly, as shown in FIG. 71.

With the configuration shown in FIG. 68, it is possible to commonly use the bus drives/latches both in the multi-bit test mode and in the normal operation mode and it is unnecessary to provide bus drives/latches dedicated to the multi-bit test mode. It is, therefore, possible to simplify the internal circuit configuration and also to decrease the area occupied by the circuits.

Further, by providing a test write driver transferring test write data to a different internal data bus line with a write data inversion function, it is possible to write checker pattern data of different logical levels to memory cells of a plurality of bits.

Test write data inversion instruction signal WDCNV is applied externally in the test mode. Alternatively, test write data inversion instruction signal WCNV may be applied in a command form to be set in a mode register in the test mode. Write data trigger signal WDTG is activated at a predetermined timing in accordance with write operation instruction signal WE in the data write operation mode.

If the multi-bit test mode is executed in the word structures of ×32 bits, ×16 bits and ×8 bits, it would suffice that the following configuration is used in the data paths shown in FIG. 51.

Specifically, the bus drives/latches shown in FIG. 68 are arranged corresponding to the read drivers shown in FIG. 51. The input buffer shown in FIG. 68 is arranged corresponding to each of output buffers OBF0 to OBF7 shown in FIG. 51.

In other words, in the configuration shown in FIG. 51, there are provided a first compressor which compresses 4-bit data of internal data bus lines DB0 to DB4 to 2-bit data and transfers the compressed data to the odd-numbered read drivers, and a second compressor which receives the output signals (internal read data) of multiplexers 204a to 204d, and performs a compression operation, if the word structure is ×32-bit or ×16-bit, to compress 4-bit data to 2-bit data for transference to the odd-numbered read drivers. The output signals these compressors are finally compressed to 1-bit data by an output circuit arranged corresponding to an even-numbered data pad and outputted. Therefore, data from the memory cells of 4 bits is compressed to 1-bit data and the compressed 1-bit data is outputted through the corresponding data terminal.

In the word structure of ×8 bits, read drivers RDR1 and RDR2 transfer data, in the configuration shown in FIG. 51. Therefore, the output circuit corresponding to data bit DQ<0> compresses the 2-bit data to 1-bit data and outputs the compressed 1-bit data.

In test data writing, data bus drives/latches are arranged in place of read drivers RDR0 to RDR7 shown in FIG. 51, and the configuration shown in FIG. 68 is arranged corresponding to each internal data bus at the preceding stage of each bus drives/latches. Since multiplexers (MUX) shown in FIG. 51 are selectively made conductive in accordance with the word structure, it is possible to surely transfer test write data in accordance with the word structure.

Therefore, even if the configuration shown in the eleventh embodiment is employed, it is possible to accurately perform a multi-bit test in accordance with the word structure. When test write data is inverted, it is unnecessary to invert the logical level of a received corresponding internal read data in test data reading. This is because coincidence/non-coincidence for inverted data and coincidence/non-coincidence for non-inverted data are determined separately.

As described above, according to the eleventh embodiment of the present invention, the semiconductor memory device is constituted such that the logical level of the test write data transmitted from one input buffer to the internal data bus line can be inverted. In the multi-bit test mode, it is, therefore, possible to generate and write a checker board pattern having the logical level of the write data changed to selected memory cells.

In the eleventh embodiment, global data lines GIO0 to GIO3 arranged corresponding to the respective data terminals may be those arranged in one memory sub-block, or may include global data lines and the lower global data lines included in one sub-column block. It is possible to set a desired correspondence between the data terminals and the global data lines in accordance with the correspondence between the read drivers and the global data lines shown in FIG. 51.

Furthermore, in the second to eleventh embodiments, the semiconductor memory device may be any of a dynamic random access memory (DRAM), a static random access memory (SRAM) and a nonvolatile semiconductor memory device. As far as the semiconductor memory device covers a plurality of word structures with the same chip configuration, the present invention can be applied.

As described above, according to the present invention, the data pads are arranged being distributed into the four divided regions of a chip. It is, therefore, possible to be applied to a plurality of types of assembling packages with the same chip configuration.

In addition, the configuration of the internal data buses in the test operation mode is changed in accordance with the word structure. Therefore, even if the word structure is changed depending on the package type, it is possible to accurately perform a test without complicating the internal circuit configuration.

Moreover, a plurality of refresh cycles are prepared and one of the refresh cycles is selectively activated. The semiconductor memory chip with the same configuration can be applied to both a multi chip package and a single chip package.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device comprising:
    internal circuitry including memory cells storing data and formed on a semiconductor chip; and
    a plurality of pads arranged around the chip in an external region of said internal circuitry, said plurality of pads including a plurality of data pads arranged being distributed into outer peripheral portions of at least four divided regions of said chip and selectively used in each of the divided regions in accordance with a word structure of data inputted and outputted by said internal circuitry.

2. The semiconductor circuit device according to claim 1, wherein
    said chip has a rectangular shape, and
    said plurality of data pads are arranged being distributed along opposite two sides of said chip.

3. The semiconductor circuit device according to claim 1, wherein
    said plurality of pads include power source pads arranged corresponding to the data pads arranged being distributed into said four divided regions, and
    the data pads and power source pads are made different in number to be used in each divided region for a different word structure, and are so thinned out to be used, when the word structure is different from a maximum permitted number of bits, that an unused pad is arranged between used pads in each divided region.

4. The semiconductor circuit device according to claim 1, wherein
    said internal circuitry includes a plurality of memory circuits, arranged in the respective four divided regions, each for storing the data, and
    said semiconductor circuit device further comprises:
    a plurality of data buses for coupling the memory circuits and said plurality of data pads, load capacitance of each respective data bus being equal to load capacitance of other data bus.

5. The semiconductor circuit device according to claim 1, wherein said internal circuitry includes a memory selecting circuit for accessing said memory cells, said semiconductor circuit device further comprises:

a compression circuit for compressing and outputting memory cell data read out simultaneously from said memory selecting circuit in a test operation mode; and a connection control circuit for establishing connection between an output of said compression circuit and said plurality of data pads in accordance with a word structure instruction signal indicating the word structure.

6. The semiconductor circuit device according to claim 1, wherein said chip has a rectangular shape, and said plurality of data pads are arranged being distributed along opposite two sides of said chip, the data pads arranged being distributed into said four divided regions are used in accordance with the word structure upon assembly into a first package, and the data pads arranged being distributed along one of the two sides are selectively used in accordance with said word structure upon assembly into a second package.

7. The semiconductor circuit device according to claim 1, further comprising:

a plurality of data bus lines arranged corresponding to said plurality of data pads, wherein said plurality of data bus lines are arranged such that an unused data bus line is arranged between the data bus lines to be used in accordance with said word structure.

* * * * *